United States Patent
Koya et al.

(10) Patent No.: US 8,335,479 B2
(45) Date of Patent: Dec. 18, 2012

(54) SEMICONDUCTOR INTEGRATED CIRCUIT, RF MODULE USING THE SAME, AND RADIO COMMUNICATION TERMINAL DEVICE USING THE SAME

(75) Inventors: Shigeki Koya, Koganei (JP); Shinichiro Takatani, Mitaka (JP); Takashi Ogawa, Tokyo (JP); Akishige Nakajima, Higashiyamato (JP); Yasushi Shigeno, Maebashi (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/448,033

(22) Filed: Apr. 16, 2012

(65) Prior Publication Data

US 2012/0200335 A1 Aug. 9, 2012

Related U.S. Application Data

(62) Division of application No. 12/513,280, filed as application No. PCT/JP2007/071733 on Nov. 8, 2007, now Pat. No. 8,200,167.

(30) Foreign Application Priority Data

Nov. 9, 2006 (JP) .................................. 2006-303874
Jan. 30, 2007 (JP) .................................. 2007-019130

(51) Int. Cl.
*H04B 1/44* (2006.01)
(52) U.S. Cl. ......................................... 455/78; 333/103
(58) Field of Classification Search .................... 455/73, 455/75–80, 82, 83, 552.1; 327/427, 430; 333/104, 81 A; 257/E27.012, E27.016
See application file for complete search history.

(56) References Cited

U.S. PATENT DOCUMENTS

| | | | | |
|---|---|---|---|---|
| 5,774,792 | A | * | 6/1998 | Tanaka et al. .................... 455/78 |
| 5,777,530 | A | * | 7/1998 | Nakatuka ....................... 333/104 |
| 6,218,890 | B1 | | 4/2001 | Yamaguchi et al. |
| 7,269,392 | B2 | | 9/2007 | Nakajima et al. |
| 2004/0229577 | A1 | | 11/2004 | Struble |

(Continued)

FOREIGN PATENT DOCUMENTS

JP 8-70245 A 3/1996

(Continued)

OTHER PUBLICATIONS

H. Tosaka et al., An Antenna Switch MMIC Using E/D Mode p-HEMT for GSM/DCS/PCS/WCDMA Bands Application, 2003 IEEE Radio Frequency Integrated Circuits Symposium, pp. 519-522.

(Continued)

*Primary Examiner* — Lana N Le
*Assistant Examiner* — Golam Sorowar
(74) *Attorney, Agent, or Firm* — Mattingly & Malur, PC

(57) ABSTRACT

One high-frequency switch Qm supplied with transmit and receive signals to ON, and another high-frequency switch Qn supplied with a signal of another system to OFF are controlled. In the other high-frequency switch Qn, to set V-I characteristics of near-I/O gate resistances Rg1$n$-Rg3$n$ of a near-I/O FET Qn1 near to a common input/output terminal I/O connected with an antenna are set to be higher in linearity than V-I characteristics of middle-portion gate resistances Rg3$n$ and Rg4$n$ of middle-portion FETs Qn3 and Qn4. Thus, even in case that an uneven RF leak signal is supplied to near-I/O gate resistances Rg1$n$-Rg3$n$, and middle-portion gate resistances Rg3$n$ and Rg4$n$, the distortion of current flowing through the near-I/O gate resistances Rg1$n$-Rg3$n$ near to the input/output terminal I/O can be reduced.

5 Claims, 12 Drawing Sheets

U.S. PATENT DOCUMENTS

| | | |
|---|---|---|
| 2004/0251952 A1 | 12/2004 | Nakatsuka et al. |
| 2005/0032484 A1 | 2/2005 | Itakura et al. |
| 2006/0003797 A1 | 1/2006 | Ogawa |
| 2006/0103448 A1 | 5/2006 | Nakatsuka et al. |

FOREIGN PATENT DOCUMENTS

| | | |
|---|---|---|
| JP | 9-270659 A | 10/1997 |
| JP | 10-150395 A | 6/1998 |
| JP | 2000-101032 A | 4/2000 |
| JP | 2005-6072 A | 1/2005 |
| JP | 2005-57375 A | 3/2005 |
| JP | 2005-72671 A | 3/2005 |
| JP | 2006-50590 A | 2/2006 |
| JP | 2006-174425 A | 6/2006 |
| JP | 2006-303775 A | 11/2006 |

OTHER PUBLICATIONS

M. Shifrin et al., Monolithic FET Structures for High-Power Control Component Applications, IEEE Transactions on Microwave Theory and Techniques, vol. 37, No. 12, Dec. 1989, pp. 2134-2141.

K. Miyatsuji et al., A GaAs High-Power RF Single-Pole Double-Throw Switch IC for Digital Mobile Communication System, 1994 IEEE International Solid-State Circuit Conference Digest of Technical Papers, pp. 34-35.

* cited by examiner

SEMICONDUCTOR INTEGRATED CIRCUIT, RF MODULE USING THE SAME, AND RADIO COMMUNICATION TERMINAL DEVICE USING THE SAME

CROSS-REFERENCES

This application is a divisional of U.S. Ser. No. 12/513,280, filed Jul. 2, 2009 now U.S. Pat. No. 8,200,167, which is a 371 of International PCT/JP2007/071733, filed Nov. 8, 2007. This application claims priority to JP 2007-019130, filed Jan. 30, 2007 and JP 2006-303874, filed Nov. 9, 2006.

TECHNICAL FIELD

The present invention relates to a semiconductor IC incorporating a transmitter-receiver switching circuit (antenna switch) for a radio communication system, an RF (Radio Frequency) module incorporating the same, and a radio communication terminal device with the RF module. Particularly, it relates to a technique useful for reducing the intermodulation distortion, which is crucial for WCDMA system, and the harmonic distortion, which is crucial for GSM system.

Also, the invention relates to a semiconductor IC including a DC boost circuit and an RF module incorporating the same, and particularly to a technique useful for increasing the life and operation reliability of devices.

BACKGROUND ART

The ubiquitous coverage that wireless communication can be held anywhere in the world, which is an ability of communication terminal equipment, such as mobile phone terminals, has been not a reality today, but under development.

Mobile systems for actualizing the ubiquitous are cellular phones for e.g. GSM (Global System for Mobile Communication), PCS (Personal Communication System), DCS (Digital Cellular System), GPRS (General Packet Radio Service), EDGE (Enhanced Data for GSM Evolution; Enhanced Data for GPRS) and WCDMA (Wideband Code Division Multiple Access). These systems cover, in properties, signals with fixed and changing envelops, multiplexes of time division and code division and a wide range of combinations of transmit-output powers ranging HIGH (several watts) to LOW (microwatts). Consequently, the demands for multiband and multi-mode applications have been growing.

Meanwhile, Non Patent Citation 1, which is cited later, describes an antenna switch microwave monolithic IC (MMIC) for GSM, DCS, PCS and WCDMA quad-bands. MMIC can handle transmit and receive signals of GSM, DCS and PCS systems in series according to the means of time division, and it can treat transmit and receive signals of WCDMA system in parallel by code division. HEMT (High Electron Mobility Transistor) of a heterojunction structure having a low on-resistance is used for the switch, in which AlGaAs is used as a barrier layer, and InGaAs is used as a channel layer. Also, it is described in Non Patent Citation 1 that second and third harmonic distortions at DCS and PCS2 transmit terminals are about −70 dBc.

Further, Patent Citation 1, which is cited later, describes a switch circuit for a transmitter-receiver switching circuit for a radio communication system, in which a high voltage from a switch circuit in ON state is prevented from first turning on a high-voltage-side FET of serially connected FETs of a switch circuit in OFF state by making gate resistances of the serially connected FETs smaller from the high-voltage side toward the low-voltage side in turn. Thus, it becomes possible to provide an electronic part for communication smaller in insertion loss and harmonic distortion.

Further, Patent Citation 2, which is cited later, describes an RF switch circuit for mobile communication devices, in which of serially connected FETs of a high-frequency switch circuit in OFF state, only the FET near to the input/output terminal and accepting application of a high voltage from the high-frequency switch circuit in ON state has its gate resistance set to the maximum, and the gate resistances of the others are set below the maximum. Thus, even in case that the total of resistance values of the gate resistances is made smaller, the influence on a signal path can be reduced.

In addition, Patent Citation 3, which is cited later, describes a switch circuit for mobile communication devices. The switch circuit includes two or more FETs each having a plurality of gates, in which a drain's additional capacitance is connected between the drain of FET and the gate adjacent to the drain, and a source's additional capacitance is connected between the source of FET and the gate adjacent to the source. The drain's additional capacitance between the drain of FET of a switch in OFF state and the gate adjacent to the drain can suppress the phenomenon that the negative direction's voltage fluctuation from the switch circuit in ON state causes FET of a switch in OFF state to be turned on. In addition, the source's additional capacitance between the source of FET of a switch in OFF state and the gate adjacent to the source can suppress the phenomenon that the positive direction's voltage fluctuation from the switch circuit in ON state causes FET of a switch in OFF state to be turned on. Thus, a high-frequency switch with low voltage and low distortion characteristics can be materialized. Now, it is noted that Patent Citation 3 corresponds to U.S. Pat. No. 5,774,792.

Further, Patent Citation 4, which is cited later, describes an antenna switch circuit for wireless communication devices including portable terminals. FET of the antenna switch circuit includes a multi-gate transistor having a plurality of gates between its drain and gate. An inter-gate region located between adjacent gates of the plurality of gates is connected to the drain and source through a potential-stabilizing resistance, whereby the signal leakage between the drain and source of a multi-gate type FET can be suppressed.

The ubiquitous coverage that wireless communication can be held anywhere in the world, which is an ability of communication terminal equipment, such as mobile phone terminals, has been not a reality today, but under development.

There are a variety of systems as mobile systems for actualizing the ubiquitous, which include cellular phones for e.g. GSM (Global System for Mobile Communication), PCS (Personal Communication System), DCS (Digital Cellular System), GPRS (General Packet Radio Service), EDGE (Enhanced Data for GSM Evolution; Enhanced Data for GPRS) and WCDMA (Wideband Code Division Multiple Access), and systems for e.g. wireless LAN (Local Area Network) and WIMAX (Worldwide Interoperability for Microwave Access).

These systems cover, in properties, signals with fixed and changing envelops, multiplexes of time division, frequency division, code division and the like and a wide range of combinations of transmit-output powers ranging HIGH (several watts) to LOW (microwatts). Consequently, the demand to make terminals for such systems multimode-ready ones which are each capable of supporting multiple systems has been growing. The needs for multiband and multimode applications have been growing. As to mobile communication terminals supporting a system which adopts a time-division transmit-and-receive technique that transmission and reception are switched by means of time division, and mobile communication terminals which perform communication supporting multimodes, it is necessary to switch between transmit and receive modes. For such switching, an antenna switch is used.

Mobile terminals are driven by batteries, and therefore they are required to lower power consumption. In a mobile communication terminal, what consumes electric power most is a power amplifier operable to amplify the power of a transmit signal to a power as large as several watts. For reduction in power consumption, it is effective to raise the power conversion efficiency of such power amplifier. However, it is also effective to supply an amplified signal to an antenna through an antenna switch with a smaller loss and then throw out it into space in terms of the improvements of the power conversion efficiency and greater power savings. Hence, an antenna switch connected between a power amplifier and an antenna is required to have a smaller loss.

Radio wave resources are managed and operated by each country or area. As to mobile communication terminals which emit radio waves into space, the frequency of radio waves and the strength of power which they can use for respective systems are specified by each country or district. Therefore, the strength of power emitted into space at frequencies except a frequency used for a system of e.g. harmonic power needs to be controlled to or below a value stipulated by a law or the like. The power emitted by such terminal is amplified by a power amplifier, passed through an antenna switch, and radiated from an antenna. Usually, harmonics generated in a power amplifier can be reduced by LPF (Low Pass Filter) in an output part of the power amplifier sufficiently. However, the harmonic distortion caused by an antenna switch connected with an output of LPF is emitted into space through the antenna as it is. Hence, an antenna switch needs to suppress the occurrence of harmonic distortion, i.e. to have the performance of high linearity.

While antenna switches using PIN diodes have been common conventionally, GaAs switch FETs (Field Effect Transistors), which are higher in processing speed than PIN diodes, have been used for microwave signal switches as described in Non Patent Citation 2, which is cited later.

However, GaAs switch FETs have the problem that the breakdown voltage is much lower than that of PIN diodes. Hence, Non Patent Citation 2 describes a technique to resolve the problem by connecting, in series, lots of FET cells and making smaller a voltage applied to each row of FETs in a GaAs microwave monolithic IC (MMIC).

Further, in a GaAs monolithic switch IC, a waveform distortion occurs as transmit power increases. Hence, Non Patent Citation 3, which is cited later, describes a switch including a feedforward circuit to solve the problem of waveform distortion. In the switch, a drain-source path of a first FET is connected between an RF signal input terminal and a ground voltage, and a source-drain path of a second FET is connected between the RF signal input terminal and an RF signal output terminal. The feedforward circuit includes a feedforward capacitance and a diode, which are connected in series, between the RF signal input terminal and the gate of the first FET. In case that an RF signal is not transmitted from the RF signal input terminal to the RF signal output terminal, the first FET is controlled to be in ON, and the second FET is controlled to be in OFF. In contrast, in case that an RF signal is transmitted from the RF signal input terminal to the RF signal output terminal, the first FET is controlled to be in OFF, and the second FET is controlled to be in ON. During the RF signal transmission, the low level of an RF signal at the RF signal input terminal is sent to the gate of the first FET through the feedforward circuit as a negative voltage. Thus, the problems of waveform distortion and RF transmit power loss can be avoided.

It is described in Patent Citation 5, which is cited later, to connect DC boost circuits to an RF switch including switch elements connected with RF signal sources. The switch elements are composed of FETs, and a DC control voltage is applied to the gate of each FET for ON-OFF control. In general, the DC control voltage is produced from a voltage of a system power source. In case that the DC control voltage lowers to or below 2.5 volts, harmonic signal components, which cause distortion in an RF output signal, increase remarkably. In Patent Citation 5, the DC boost circuit including diodes, capacitances and resistances is supplied with a DC control voltage and an RF signal. A DC output voltage larger than the DC control voltage is extracted from the DC boost circuit according to charge and discharge operations by the diodes and capacitances in response to positive and negative voltages of an RF signal. The resistances make the input impedance of the DC boost circuit high to prevent a large current from flowing from the RF signal source into the DC boost circuit.

[Non Patent Citation 1] Hiroyuki Tosaka et al., "An Antenna Switch MMIC Using E/D Mode p-HEMT for GSM/DCS/PCS/WCDMA Bands Application", 2003 IEEE Radio Frequency Integrated Circuits Symposium, PP. 519-522.

[Non Patent Citation 2] M. B. Shifrin at al., "Monolithic FET Structures for High-Power Control Component Applications", IEEE TRANSACTIONS ON MICROWAVE THEORY AND TECHNIQUES, VOL. 37, NO 12, DECEMBER 1989, PP. 2134-2141.

[Non Patent Citation 3] K. Miyatsuji at al., "A GaAs High-Power RF Single-Pole Double-Throw Switch IC for Digital Mobile Communication System", 1994 IEEE International Solid-State Circuit Conference DIGEST OF TECHNICAL PAPERS, PP. 34-35.

[Patent Citation 1] JP-A-2005-072671
[Patent Citation 2] JP-A-2006-174425
[Patent Citation 3] JP-A-8-70245
[Patent Citation 4] JP-A-2000-101032
[Patent Citation 5] US Patent Application No. US2004/0229577A1

DISCLOSURE OF THE INVENTION

Technical Problem

Prior to the invention, the inventors have been engaged in the development of an antenna switch microwave monolithic IC (MMIC) mounted on a mobile phone, which enables transmission and reception with GSM800, GSM900, DCS1800, PCS1900 and WCDMA multibands and an RF module incorporating the same.

FIG. 1 is a block diagram showing a configuration of a mobile phone with an RF module incorporating an antenna switch MMIC developed prior to the invention, and a baseband signal processing LSI.

As in the drawing, the mobile phone antenna ANT for transmission and reception is connected with a common input/output terminal I/O of the antenna switch MMIC (ANT_SW) of the RF module RF_ML. A control signal B.B_Cnt from the baseband signal processing LSI (BB_LSI) is passed through the RF analog signal processing semiconductor IC (RF_IC), and supplied to the controller integrated circuit (CNT_IC) of the high-output-power-amplifier module (HPA_ML). A flow of an RF signal from the antenna ANT for transmission and reception to the common input/output terminal I/O is involved in a receive operation RX of the mobile phone, and a flow of an RF signal from the common input/output terminal I/O to the antenna ANT for transmission and reception is involved in a transmit operation TX of the mobile phone.

RF IC (RF_IC) converts up a transmit baseband signal Tx_BBS from the baseband signal processing LSI (BB_LSI) to an RF transmit signal in frequency, and in reverse, converts down an RF receive signal, which it has received through the antenna ANT for transmission and reception, to a receive baseband signal Rx_BBS in frequency, and supplies the resultant signals to the baseband signal processing LSI (BB_LSI).

The antenna switch MMIC (ANT_SW) of the RF module RF_ML establishes a signal path between the common input/output terminal I/O and one of the transmit terminals Tx1 and Tx2, receive terminals Rx2, Rx3 and Rx4 and transmit/receive terminals TRx1 and TRx5, and performs either the receive operation RX or transmit operation TX. The antenna switch MMIC (ANT_SW) is arranged so that the required isolation can be achieved by setting the impedance of a signal path, except the one established for the receive operation RX or transmit operation TX, to an extremely high value.

FIG. 2 is a block diagram showing a configuration of high-frequency switches of the antenna switch MMIC developed prior to the invention. The antenna switch MMIC of FIG. 2 is incorporated in the RF module RF_ML mounted on the mobile phone shown in FIG. 1.

As shown in FIG. 2, the antenna switch MMIC includes a plurality of high-frequency switches Qa, Qb and Qc. The high-frequency switch Qa is a switch for establishing a signal path between the common input/output terminal I/O and the transmit terminal Tx2 (which is a transmit terminal for outputting GSM850 or GSM900 RF transmit signals). The high-frequency switch Qb is a switch for establishing a signal path between the common input/output terminal I/O and the transmit terminal Tx1 (which is a transmit terminal for outputting DCS1800 or PCS1900 RF transmit signals). The high-frequency switch Qc is a switch for establishing a signal path between the common input/output terminal I/O and the transmit/receive terminal TRx1 (which is a transmit/receive terminal for outputting WCDMA1900 RF transmit signals and accepting WCDMA2100 RF receive signals).

FIG. 2 shows the case where the high-frequency switch Qa is turned ON, and the other high-frequency switches Qb and Qc are made OFF. The high-frequency switches Qa, Qb and Qc each include six N-channel field effect transistors (hereinafter referred to as "FETs") connected in series, whereby a voltage that the switches can handle is increased, and their low on-resistance is ensured so that the insertion loss is minimized in both transmission and reception. Incidentally, each FET is a HEMT transistor. Gates of the six serially-connected HEMT transistors of each switch are connected with six gate resistances, and the six gate resistances are connected to a control input terminal for control of ON and OFF of the high-frequency switch through an additional resistance. As to the six serially-connected HEMT transistors of each switch, a resistance with a relatively high resistance value is connected between the drain and source for making drain and source voltages equal to each other at the time when the six HEMT transistors of the switch stay OFF. By setting resistance values of the six gate resistances and additional resistance to relatively high values, an RF signal loss leaking from the RF signal input terminal into the ON-OFF control input terminal through the drain-gate parasitic capacitances, source-gate parasitic capacitances and drain-source resistances of the six serially-connected HEMT transistors when the switch stays OFF can be reduced.

In regard to the high-frequency switches shown in FIG. 2, each switch includes two or more FETs each having a plurality of gates, in which a drain's additional capacitance is connected between the drain of FET and the gate adjacent to the drain, and a source's additional capacitance is connected between the source of FET and the gate adjacent to the source, as described in Patent Citation 3. As described above, FIG. 2 shows the case where the high-frequency switch Qa is turned ON, and the other high-frequency switches Qb and Qc are made OFF. When the high-frequency switch Qa is turned ON by a gate control voltage Vctrl_a of High level, an RF transmit signal of GSM850 or GSM900 is supplied from the transmit terminal Tx2 to the common input/output terminal I/O. The other high-frequency switches Qb and Qc are made OFF by gate control voltages Vctrl_b and Vctrl_c of 0 volt. However, the RF transmit signal which has been supplied to the common input/output terminal I/O through the high-frequency switch Qa activates, between the sources and drains, the six serially-connected HEMT transistors of the other high-frequency switches Qb and Qc. As is well known, the drain and source of a field effect transistor are not determined by the device structure. Exactly, a part thereof which emits carriers serves as a source, and a part which collects carriers serves as a drain. Therefore, as is well known, in case that in a symmetric field effect transistor, the direction of current flowing is reversed, the drain and source before the reverse of the current become the source and drain after the reverse of the current respectively.

However, for the sake of simplicity, as to the other high-frequency switches Qb and Qc in OFF state in FIG. 2, regions connected to the common input/output terminal I/O shall be termed "drain", and regions connected to the transmit terminal Tx1 and transmit/receive terminal TRx1 shall be termed "source". In FIG. 2, it is possible to suppress the phenomenon that the negative direction's voltage fluctuation of an RF transmit signal from the switch Qa in ON state caused by drain's additional capacitances C11Tx1 and C11TRx1 between the drains of FETs Q1$b$ and Q1$c$ of the switches Qb and Qc in OFF state, which are the near to the common input/output terminal I/O, and the gates adjacent to the drains turns on the nearest FETs Q1$b$ and Q1$c$ of the switches Qb and Qc in OFF state. Also, it is possible to suppress the phenomenon that the positive direction's voltage fluctuation of an RF transmit signal from the switch Qa in ON state caused by source's additional capacitances C12Tx1 and C12TRx1 between the sources of FETs Q6$b$ and Q6$c$ of the switches Qb and Qc in OFF state, which are the near to the transmit terminal Tx1 and transmit/receive terminal TRx1, and the gates adjacent to the sources turns on the nearest FETs Q6$b$ and Q6$c$ of the switches Qb and Qc in OFF state.

FIG. 3 is a diagram showing, of the high-frequency switches shown in FIG. 2, the switch Qb of OFF state in an equivalent circuit thereof. In FIG. 3, the switch Qb includes: six N-channel HEMT transistors Q1$b$... Q6$b$ connected in series; six gate resistances Rg1$b$... Rg6$b$; an additional resistance Rg7$b$ connected with the ON-OFF control input terminal Vctrl_b; six drain-source resistances Rd1$b$... Rd6$b$; a drain's additional capacitance C11Tx1; and a source's additional capacitance C12Tx1. The six serially-connected N-channel HEMT transistors Q1$b$... Q6$b$ include a combination of a drain-gate parasitic capacitance Cg11$b$ and a source-gate parasitic capacitance Cg12$b$... a combination of a drain-gate parasitic capacitance Cg61$b$ and a source-gate parasitic capacitance Cg62$b$.

FIG. 4 is a diagram for explaining a distribution of RF leak signals applied to the six gate resistances of the six HEMT transistors of the switch in OFF state and the additional resistance thereof under the influence of an RF signal from the switch of ON state of the high-frequency switches shown in FIG. 2. Here, note that the switch Qk in ON state and the switch Ql in OFF state in FIG. 4 correspond to the switch Qa in ON state and the switch Qb in OFF state in FIG. 2.

In FIG. 4, when setting one ON-OFF control input terminal Vctrl_k and the other ON-OFF control input terminal Vctrl_l to 4.5 volts and 0 volt respectively, the one switch Qk is turned ON and the other switch Ql is turned OFF. The six gate resistances Rg1k... Rg6k of the one switch Qk are all 10 kΩ. The additional resistance Rg7k connected with the ON-OFF control input terminal Vctrl_k is 20 kΩ. The six drain-source resistances Rd1k... Rd6k are all 15 kΩ. The drain-gate parasitic capacitance and source-gate parasitic capacitance of each HEMT transistor are 0.4 pF apiece. Further, the drain's additional capacitance C11Tx1k, and the source's additional capacitance C12Tx1k are each 0.8 pF. Also, the six gate resistances Rg1l... Rg6l of the other switch Ql are all 10 kΩ. The additional resistance Rg7l connected to the ON-OFF control input terminal Vctrl_l is 20 kΩ. The six drain-source resistances Rd1l... Rd6l are all 15 kΩ. The drain-gate parasitic capacitance and source-gate parasitic capacitance of each HEMT transistor are 0.4 pF apiece. The drain's additional capacitance C11Tx1l and the source's additional capacitance C12Tx1l are each 0.8 pF.

Three FETs Qk1, Qk2 and Qk3 are composed of one FET with three gates Gk1, Gk2 and Gk3 forming a multi-gate structure, and three FETs Qk4, Qk5 and Qk6 are composed of one FET with three gates Gk4, Gk5 and Gk6 forming a multi-gate structure. Likewise, three FETs Ql1, Ql2 and Ql3 are composed of one FET with three gates Gl1, Gl2 and Gl3 forming a multi-gate structure, and three FETs Ql4, Ql5 and Ql6 are composed of one FET with three gates Gl4, Gl5 and Gl6 forming a multi-gate structure.

As in the case of Patent Citation 4, an inter-gate region (i.e. a common connecting node of FETs Qk1 and Qk2) between the gates Gk1 and Gk2 of the multi-gate structure is connected with the source of FET Qk1 through the potential-stabilizing resistance Rd1k. Also, an inter-gate region (i.e. a common connecting node of FETs Qk2 and Qk3) between the gates Gk2 and Gk3 of the multi-gate structure is connected with the source of the FET Qk1 through the potential-stabilizing resistances Rd2k and Rd1k. Further, an inter-gate region (i.e. a common connecting node of FETs Qk2 and Qk3) between the gates Gk2 and Gk3 of the multi-gate structure is connected with the drain of FET Qk3 through the potential-stabilizing resistance Rd3k. In addition, an inter-gate region (i.e. a common connecting node of FETs Qk4 and Qk5) between the gates Gk4 and Gk5 of the multi-gate structure is connected with the source of FET Qk4 through the potential-stabilizing resistance Rd4k. An inter-gate region (i.e. a common connecting node of FETs Qk5 and Qk6) between the gates Gk5 and Gk6 of the multi-gate structure is connected with the source of FET Qk4 through the potential-stabilizing resistances Rd5k and Rd4k. Moreover, an inter-gate region (i.e. a common connecting node of FETs Qk5 and Qk6) between the gates Gk5 and Gk6 of the multi-gate structure is connected with the drain of FET Qk6 through the potential-stabilizing resistance Rd6k.

An inter-gate region (i.e. a common connecting node of FETs Ql1 and Ql2) between the gates Gl1 and Gl2 of the multi-gate structure is connected with the source of FET Ql1 through the potential-stabilizing resistance Rd1l. In addition, an inter-gate region (i.e. a common connecting node of FETs Ql2 and Ql3) between the gates Gl2 and Gl3 of the multi-gate structure is connected with the source of FET Ql1 through the potential-stabilizing resistances Rd2l and Rd1l. Further, an inter-gate region (i.e. a common connecting node of FETs Ql2 and Ql3) between the gates Gl2 and Gl3 of the multi-gate structure is connected with the drain of FET Ql3 through the potential-stabilizing resistance Rd3l. Still further, an inter-gate region (i.e. a common connecting node of FETs Ql4 and Ql5) between the gates Gk4 and Gk5 of the multi-gate structure is connected with the source of FET Ql4 through the potential-stabilizing resistance Rd4l. An inter-gate region (i.e. a common connecting node of FETs Ql5 and Ql6) between the gates Gl5 and Gl6 of the multi-gate structure is connected with the source of FET Ql4 through the potential-stabilizing resistances Rd5l and Rd4l. Moreover, an inter-gate region (i.e. a common connecting node of FETs Ql5 and Ql6) between the gates Gl5 and Gl6 of the multi-gate structure is connected with the drain of FET Ql6 through the potential-stabilizing resistance Rd6l.

In FIG. 4, the one ON-OFF control input terminal Vctrl_k is set to 4.5 volts, whereby the one switch Qk is turned ON. The resistance of drain-source channels of the six N-channel HEMT transistors of the one switch Qk is made extremely low. Therefore, the one switch Qk is put in ON state where the on-resistance is low. An RF signal supplied to the transmit terminal Tx1k is passed to the common input/output terminal I/O through the switch Qk in ON state with a low insertion loss. At this time, all of heterojunctions (i.e. Schottky junctions) between the gate and drain of each of the six N-channel HEMT transistors of the switch Qk, between the gate and source and between the gate and channel are biased in the forward direction. The forward voltages of the heterojunctions of the HEMT transistors are 0.7 volts approximately, and therefore the rise in charged voltage of the stray capacitance of the common input/output terminal I/O is clamped to 4.5−0.7=3.8 volts.

The DC level of the common input/output terminal I/O is a clamped voltage of about 3.8 volts, whereas the other ON-OFF control input terminal Vctrl_l is at zero volt. Therefore, the other switch Ql is in OFF state. The drain-source channels of the six N-channel HEMT transistors of the other switch Ql have an almost infinitely large resistance. Therefore, the other switch Ql is put in OFF state, whereby high isolation can be achieved between the common input/output terminal I/O, which has been supplied with an RF signal, and the transmit terminal Tx1l.

As to an antenna switch MMIC for mobile phone terminals, the insertion loss of a switch in ON state needs to be of an extremely low level, whereas a switch in OFF state needs to offer high isolation and have a low distortion property. A switch in OFF state needs to isolate between the common input/output terminal I/O and signal terminal, and reduce the distortion at the common input/output terminal I/O as small as possible. Frequencies which are twice the GSM900 RF signals' frequencies of 880-915 MHz overlap PCS1900 RF signals' frequencies of 1850-1910 MHz, and therefore it is necessary to suppress the second harmonic distortion of a switch in OFF state. Further, frequencies which are two to three times the DCS1800 RF signals' frequencies of 1710-1785 MHz and PCS1900 RF signals' frequencies of 1850-1910 MHz spread over a wide band of 3.42-5.73 GHz. Therefore, considering the influences on human bodies and various electronic devices, it is required to suppress the second harmonic distortion and third harmonic distortion of a switch in OFF state.

It is necessary to reduce the intermodulation distortion between a common input/output terminal I/O and transmit/ receive terminals (e.g. the transmit/receive terminals TRx1 and TRx5 of FIG. 1) of an antenna switch MMIC for WCDMA system, which can handle an RF transmit signal and an RF receive signal in parallel by means of code division. Specifically, while an RF transmit signal of WCDMA system is passed from the transmit/receive terminal for WCDMA system to the common input/output terminal I/O, an RF receive signal of WCDMA system is sent from the common input/output terminal I/O to the transmit/receive terminal for WCDMA system. On the other hand, at the common input/output terminal I/O, a disturbing signal received through an antenna and an RF transmit signal of WCDMA system are mixed by intermodulation. As a result of the mixing, intermodulation distortion signals overlapping the frequency band of RF receive signals of WCDMA system will arise at the transmit/receive terminal for WCDMA system as disturbing signals.

From the examination by the inventors, it has been found that the time the switch Ql in OFF state in FIG. 4 causes second and third harmonic distortions of a large level is when an RF signal from the switch Qk in ON state largely changes the capacitances of heterojunctions of the HEMT transistors' gates of the switch Ql in OFF state. An RF signal from the switch Qk in ON state is superposed on a clamped voltage of about 3.8 volts of DC level at the common input/output terminal I/O. In case that the amplitude level of an RF signal from the switch Qk in ON state is extremely low, the heterojunctions of N-channel HEMT transistors' gates are backward-biased deeply by the DC level of the common input/output terminal I/O of about 3.8 volts, and the ON-OFF control voltage Vctrl_l of zero volt, and therefore the electron densities of channels near the heterojunctions are extremely low. In such situation, the heterojunctions of HEMT transistors' gates have an extremely small capacitance value. When the amplitude level of an RF signal from the switch Qk in ON state is increased, the superposed voltage level is varied from about 3.8 volts to zero. The heterojunctions of N-channel HEMT transistors' gates have a threshold voltage Vth of about −1 volt. The heterojunctions of N-channel HEMT transistors' gates are biased to be close to the threshold voltage Vth, and the electron densities of channels near the heterojunctions are increased. Under such situation, in the HEMT transistors, the change of the capacitance value depending on the amplitude of the superposed voltage is increased, and the switch Ql in OFF state in FIG. 4 causes second and third harmonic distortions of a large level. Hence, the inventors found from a circuit simulation that increasing the ON-OFF control voltage Vctrl_k for turning on the switch Qk from a conventional value of 3 to 4. 5 volts makes possible to suppress the phenomenon that an RF signal from the switch Qk in ON state largely changes the capacitances of heterojunctions of HEMT transistors' gates of the switch Ql in OFF state. The third harmonic distortion was about −70.5 dBc in case that the ON-OFF control voltage Vctrl_k for turning on the switch Qk was the conventional value of 3 volts. However, the third harmonic distortion could be lowered to about −77 dBc by increasing the ON-OFF control voltage Vctrl_k for turning on the switch Qk to 4.5 volts.

Thus, second and third harmonic distortions could be reduced by increasing the ON-OFF control voltage Vctrl_k for turning on the switch Qk from 3 to 4.5 volts. Further, it was found from the circuit simulation that the intermodulation distortion critical for WCDMA system can be reduced by about 5 dB by increasing ON-OFF control voltage Vctrl_k for turning on Qk from 3 to 4.5 volts.

However, as to a switch prepared actually, the improvement of distortion as expected from the simulation could not be achieved. For example, it has been found that even if the ON-OFF control voltage Vctrl_k for turning on the switch Qk is increased from 3 to 4.5 volts, the intermodulation distortion critical for WCDMA system cannot be reduced remarkably.

FIG. 7 is a diagram showing the intermodulation distortion in the switch Ql in OFF state, in case of increasing, from 3 to 4.5 volts, the ON-OFF control voltage Vctrl_k to turn on the switch Qk in the high-frequency switch shown in FIG. 4. Even in case that the ON-OFF control voltage Vctrl_k is made 4.5 volts, the intermodulation distortion Lc is lowered to only about −95 dBm. It is far from −100 dBm, a target value of the intermodulation distortion Lc which was set at the beginning of the development.

Consequently, it was found that the capacitances of heterojunctions of HEMT transistors' gates of the switch Ql in OFF state did not substantially contribute to the occurrence of distortion owing to the mixing (intermodulation) of a disturbing signal received through an antenna and an RF transmit signal of WCDMA system at the common input/output terminal I/O. This fact made the inventor start considering that gate resistances of HEMT transistors of the switch Ql in OFF state may play a role in the occurrence of intermodulation distortion.

The lower right portion of FIG. 4 shows a distribution of RF leak signals applied to the six gate resistances Rg1*l*, Rg2*l*, Rg3*l*, Rg4*l*, Rg5*l* and Rg6*l* of the six HEMT transistors and the additional resistance Rg7*l* of the switch Ql in OFF state under the influence of RF signals Pin from the switch Qk in ON state. It is noted that the distribution of RF leak signals in the lower right portion of FIG. 4 is a result of simulation by a computer, the RF power of the RF signals Pin is 20 dBm, and the frequency is 1880 MHz in a frequency band of PCS1900. The maximum power of the RF transmit signals of PCS1900 is about 33 dBm, and therefore it can be said that the RF signal Pin of 20 dBm has a transmit power higher than the medium level. In the lower right portion of FIG. 4, voltages Vpp of the resistances Rg1*l*, Rg2*l*, Rg3*l*, Rg4*l*, Rg5*l*, Rg6*l* and Rg7*l* represent peak-to-peak RF signal voltages. The characteristic curve L1 of the distribution of RF leak signals to the six gate resistances of the six HEMT transistors, and the additional resistance of the switch Ql in OFF state shown in the lower right portion of FIG. 4 shows a characteristic when the drain's additional capacitance C11Tx1*l* and source's additional capacitance C12Tx1*l*, both of 0.8 pF, are connected. The characteristic curve L2 represents a characteristic when the drain's additional capacitance C11Tx1*l* and source's additional capacitance C12Tx1*l* of 0.8 pF are not connected. With any of the characteristic curves L1 and L2, uneven RF leak signals' stationary wave with a deformed-U shape is present from the leftmost gate resistance to rightmost gate resistance of the switch Ql in OFF state.

If the six gate resistances Rg1*l*, Rg2*l*, Rg3*l*, Rg4*l*, Rg5*l* and Rg6*l* of the six HEMT transistors of the switch Ql in OFF state, and the additional resistance Rg7*l* are perfectly linear resistances, any distortion such as the intermodulation distortion is not caused. However, a vast majority of resistance elements, which include a semiconductor resistor formed in a semiconductor IC, are not perfectly linear resistances, but nonlinear resistances.

Now, an applied voltage across a resistance shall be represented by V. Then, a current flowing through a nonlinear resistance is given by the following expression.

$$I = a \times V + b \times V^2 + c \times V^3 \qquad \text{(Expression 1)}$$

Therefore, the current flowing through the nonlinear resistance given by the above Expression 1 dominantly depends on the first term of $a \times V$ when the applied voltage V is small, and it dominantly depends on the second and third terms of $b \times V^2 + c \times V^3$ when the applied voltage V is large.

In contrast, in case of a perfectly linear resistance, the invariables a and b in the above expression are both zero, and a current flowing through the perfectly linear resistance is given by the following expression.

$$I = a \times V + b \times V^2 + c \times V^3 \quad \text{(Expression 2)}$$
$$= a \times V + 0 \times V^2 + 0 \times V^3 = a \times V$$

It has been shown from the simulation by the inventors that the intermodulation distortion occurs because the six gate resistances Rg1l to Rg6l of the switch Ql in OFF state in FIG. 4, which are all set to 10 kΩ and have a property of a nonlinear resistance given by Expression 1, are supplied with not RF leak signals of a uniform level, but an RF leak signal of a stationary wave with a deformed-U shape. In other words, the cause seems to be that an RF leak signal voltage of High level causes a large distortion current to flow through the leftmost gate resistance Rg1l and rightmost gate resistance Rg6l of the switch Ql in OFF state, and an RF leak signal voltage of Low level causes a small distortion current to flow through the gate resistance Rg3l and gate resistance Rg4l in center portions of the switch Ql in OFF state.

Hence, the invention was made based on results of difficult analyses performed by the inventors prior to the invention. Therefore, it is an object of the invention to reduce the intermodulation distortion critical for WCDMA system, or the harmonic distortion critical for GSM system in an antenna switch mounted on an RF communication terminal device.

The above and other objects and novel features of the invention will be apparent from the description hereof and the accompanying drawings.

As described in Patent Citation 5, it is a very effective technique to supply the DC boost circuit with a DC control voltage and an RF signal, and then extract a DC output voltage larger than the DC control voltage from the DC boost circuit for the purpose of reducing harmonic signal components in the RF switch.

Prior to the invention, the inventors have been engaged in the development of an antenna switch microwave monolithic IC (MMIC) mounted on a mobile phone, which enables transmission and reception with GSM850, GSM900, DCS1800 and PCS1900 multibands and an RF module incorporating the same. In the development, the inventors examined an antenna switch as described in Patent Citation 5. However, it was found from the examination that the antenna switch was insufficient in the operation reliability over extended periods of use. Further, the inventors investigated the case of the insufficient operation reliability. The result of the investigation on the cause, which was made by the inventors, will be described below.

FIG. 11 is a circuit diagram showing a DC boost circuit of an RF switch examined by the inventors prior to the invention, which is substantially the same as the DC boost circuit of the RF switch described in Patent Citation 5.

The DC boost circuit 200 of the RF switch of FIG. 11 rectifies part of RF input signals RFin of the antenna switch MMIC, and superposes it on a DC control voltage Vdc, thereby to produce a DC output voltage Vout larger than the DC control voltage Vdc. The DC boost circuit 200 includes capacitance elements 206(C1) and 211(C2), resistance elements 207(R11), 208(R12) and 212(R2), and diodes 209(D1) and 210(D2). The resistance values of the resistance elements 207 and 208 are set to a sufficiently larger value (e.g. 10 kΩ) in comparison to the impedance 50Ω of an antenna of a mobile phone. Thus, the input impedance of the DC boost circuit 200 has a sufficiently larger value in comparison to the antenna impedance 50Ω. Therefore, most of the RF input signals RFin input to the high-frequency input terminal 201 flow toward the high-frequency signal terminal 202 connected to FET used as a switch element, and the small remaining RF signal power is supplied to the input terminal of the DC boost circuit 200.

The description of a voltage-raising operation by the DC boost circuit 200 will be presented below. First, in case that the voltage amplitude at the high-frequency input terminal 201 is negative, the diode 209 is forward-biased and brought into conduction, whereas the diode 210 is backward-biased and brought out of conduction. In this time, a current flows into the capacitance element 206 through the diode 209 and resistance element 207 from the DC control input terminal 203 with the DC control voltage Vdc put thereon. The inflowing current charges up one terminal of the capacitance element 206, which is connected with the resistance elements 207 and 208, to a positive voltage, and charges up the other terminal of the capacitance element 206, which is connected with the high-frequency input terminal 201, to a negative voltage. Second, in case that the voltage amplitude at the high-frequency input terminal 201 is positive, the diode 209 is backward-biased and brought out of conduction, and the diode 210 is forward-biased and brought into conduction. In this time, a positive charge which has been charged into the capacitance element 206 flows into the capacitance element 211 through the resistance element 208 and diode 210. As a result, one terminal of the capacitance element 211 connected with the cathode of the diode 210 is charged up to a positive voltage, and the other terminal of the capacitance element 211 connected with the DC control input terminal 203 is charged up to a negative voltage. According to positive and negative voltage amplitudes of an RF input signal RFin at the high-frequency input terminal 201, a charge is put across the capacitance element 211 to a charged voltage Vb. Thus, a DC output voltage Vout which is larger by the charged voltage Vb in comparison to the DC control voltage Vdc at the DC control input terminal 203 arises from the DC output terminal 204. In case that the DC control voltage Vdc at the DC control input terminal 203 is 3 volts, and the charged voltage across the capacitance element 211 is 2 volts approximately, the DC output voltage Vout arising from the DC output terminal 204 is about 5 volts.

However, it was found from the examination by the inventors that a large backward voltage was put across the diodes 209 and 210 of the DC boost circuit 200 of the RF switch of FIG. 11. In case that 3 volts are applied to the DC control-voltage-supply terminal 203, and then the DC output voltage Vout of about 5 volts is output from the DC output terminal 204, an RF signal current of about 1 mA flows into the high-frequency input terminal 201 from the DC control input terminal 203 through the diode 209 and the resistance element 207 of 10 kΨ at time of a negative voltage amplitude of the RF input signal RFin at the high-frequency input terminal 201. Then, a voltage drop of about 1 volt is developed across the diode 209, and a voltage drop of about 10 volts is developed across the resistance element 207 of 10 kΩ. Consequently, the voltage at a common connecting point of the resistance elements 207 and 208 is made about −8 volts, which is lower than 3 volts of the DC control voltage Vdc at the DC control input terminal 203 by the voltage drop of about 11 volts attributed to the diode 209 and resistance element 207. The voltage of the cathode of the diode 210 is kept at the DC output voltage Vout of about 5 volts at the DC output terminal 204, and the voltage of about −8 volts is applied to the anode of the diode 210. As a result, a backward voltage of about 13 volts is applied across the diode 210. At the time of a positive voltage amplitude of the RF input signal RFin at the high-frequency input terminal 201, an RF signal current of about 1 mA flows into the DC output terminal 204 and DC control input terminal 203 from the high-frequency input terminal 201 through the capacitance element 206, the resistance element 208 of 10 kΩ and the diode 210. A voltage drop of about 10 volts is developed across the resistance element 208 of 10 kΩ, and a voltage drop of about 1 volt is developed across the diode 210. As a result, the voltage at the common connecting point of the resistance elements 207 and 208 is made about 16 volts, which is higher than about 5 volts of the DC output voltage Vout at the DC output terminal 204 by the voltage drop of about 11 volts attributed to the diode 210 and resistance element 208. The voltage of the anode of the diode 209 is kept at the DC control voltage Vdc of 3 volts at the DC control input terminal 203, and the voltage of the common connecting point of the resistance elements 207 and 208 is at a voltage of about 16 volts. Consequently, a backward voltage of about 13 volts is put across the diode 209.

As described above, the large backward voltage of about 13 volts across the diode 210 at time of a negative voltage amplitude of the RF input signal RFin at the high-frequency input terminal 201, and the large backward voltage of about 13 volts across the diode 209 at time of a positive voltage amplitude of the RF input signal RFin at the high-frequency input terminal 201 become causes of deterioration of the characteristics of the diodes 210 and 209. Therefore, it was shown from the examination by the inventors that the DC boost circuit 200 shown in FIG. 11 was questionable in terms of the long-term life of a device and had the problem of the low operation reliability in an application of the DC boost circuit to an antenna switch MMIC.

Therefore, it is an object of the invention to provide a semiconductor IC having a built-in DC boost circuit whose life and operation reliability are improved. The above and other objects of the invention and novel features thereof will be apparent from the description hereof and the accompanying drawings.

Technical Solution

Of the invention herein disclosed, the representative embodiments will be briefly outlined below.

A semiconductor IC according to an embodiment of the invention includes a plurality of high-frequency switches (Qm, Qn).

One ends of one high-frequency switch (Qm) and other high-frequency switch (Qn) of the plurality of high-frequency switches (Qm, Qn) are connected with a common input/output terminal (I/O). The common input/output terminal (I/O) is arranged to be connectable with an antenna (ANT) of a radio-frequency communication terminal device.

An RF transmit signal (WCDMA_Tx) and an RF receive signal (WCDMA_Rx) according to a predetermined communication system can be supplied to the other end (Txm) of the one high-frequency switch (Qm). At least one of an other RF transmit signal (RF_Tx) and an other RF receive signal (RF_Rx) different from the RF transmit signal (WCDMA_Tx) and RF receive signal (WCDMA_Rx) can be supplied to the other end (Txn) of the other high-frequency switch (Qn).

The one high-frequency switch (Qm) includes a plurality of field effect transistors (Qm1, ..., Qm6) connected in series, and the other high-frequency switch (Qn) includes a plurality of other field effect transistors (Qn1, ..., Qn6) connected in series.

The field effect transistors (Qm1, ..., Qm6) of the one high-frequency switch (Qm) are arranged so that a control voltage (Vctrl_m) for ON-OFF control of the one high-frequency switch (Qm) can be supplied to gates (Gm1, ..., Gm6) thereof. The other field effect transistors (Qn1, ..., Qn6) of the other high-frequency switch (Qn) are arranged so that an other control voltage (Vctrl_n) for ON-OFF control of the other high-frequency switch (Qn) can be supplied to other gates (Gn1, ..., Gn6) thereof.

A plurality of resistances (Rg1m, ..., Rg6m) are connected between the gates (Gm1, ..., Gm6) of the field effect transistors (Qm1, ..., Qm6) of the one high-frequency switch (Qm), and a control terminal supplied with the control voltage (Vctrl_m). A plurality of other resistances (Rg1n, ..., Rg6n) are connected between the other gates (Gn1, ..., Gn6) of the other field effect transistors (Qn1, ..., Qn6) of the other high-frequency switch (Qn), and an other control terminal supplied with the other control voltage (Vctrl_n).

In the other high-frequency switch (Qn), a near-I/O resistance (Rg1n, Rg2n) between the other control terminal (Vctrl_n) and a gate (Gn1) of a near-I/O field effect transistor (Qn1) of the other field effect transistors (Qn1, ..., Qn6) nearest to the common input/output terminal (I/O) has a first voltage-current characteristic.

In the other high-frequency switch (Qn), a middle-portion resistance (Rg3n, Rg4n) between the other control terminal (Vctrl_n) and a gate (Gn3, 4) of a middle-portion field effect transistor (Qn3, 4) in a middle portion between the near-I/O field effect transistor (Qn1) and a near-other-end field effect transistor (Qn6) of the other field effect transistors (Qn1, ..., Qn6) nearest to the other end (Txn) of the other high-frequency switch (Qn) has a second voltage-current characteristic.

In the other high-frequency switch (Qn), the first voltage-current characteristic of the near-I/O resistance (Rg1n, Rg2n, Rg3n) is set higher than the second voltage-current characteristic of the middle-portion resistance (Rg3n, Rg4n) in linearity (see FIG. 5).

With means according to the embodiment of the invention, in the other high-frequency switch (Qn) driven by the RF transmit signal (WCDMA_Tx) based on the predetermined communication system, the first voltage-current characteristic of the near-I/O resistance (Rg1n, Rg2n, Rg3n) is set higher than the second voltage-current characteristic of the middle-portion resistance (Rg3n, Rg4n) in linearity. Therefore, even in case that an uneven RF leak signal is applied to the near-I/O resistance (Rg1n, Rg2n, Rg3n) and middle-portion resistance (Rg3n, Rg4n), it is possible to suppress the distortion of current flowing through the near-I/O resistance (Rg1n, Rg2n, Rg3n) of the gate (Gn1) of the near-I/O field effect transistor (Qn1) nearest to the common input/output terminal (I/O) in the other high-frequency switch (Qn). Consequently, it is possible to reduce the intermodulation distortion critical for WCDMA system, or the harmonic distortion critical for GSM system.

In the semiconductor IC according to a preferred embodiment of the invention, as to the other high-frequency switch (Qn), a near-other-end resistance (Rg4n, Rg5n, Rg6n) between the other control terminal (Vctrl_n), and a gate (Gn6) of the near-other-end field effect transistor (Qn6) of the other field effect transistors (Qn1, ..., Qn6) nearest to the other end (Txn) of the other high-frequency switch (Qn) has a third voltage-current characteristic.

In the other high-frequency switch (Qn), the third voltage-current characteristic of the near-other-end resistance (Rg4n, Rg5n, Rg6n) is set higher than the second voltage-current characteristic of the middle-portion resistance (Rg3n, Rg4n) in linearity (see FIG. 5).

With means according to the preferred embodiment of the invention, as to the other high-frequency switch (Qn) driven by the RF transmit signal (WCDMA_Tx) based on the predetermined communication system, the third voltage-current characteristic of the near-other-end resistance (Rg4n, Rg5n, Rg6n) is set higher than the second voltage-current characteristic of the middle-portion resistance (Rg3n, Rg4n) in linearity. Therefore, even in case that an uneven RF leak signal is applied to the near-other-end resistance (Rg4n, Rg5n, Rg6n) and middle-portion resistance (Rg3n, Rg4n), it is possible to suppress the distortion of current flowing through the near-other-end resistance (Rg4n, Rg5n, Rg6n) of the gate (Gn6) of the near-other-end field effect transistor (Qn6) nearest to the other end (Txn) in the other high-frequency switch (Qn). Consequently, it is possible to reduce the intermodulation distortion critical for WCDMA system, or the harmonic distortion critical for GSM system.

In a semiconductor IC according to another preferred embodiment of the invention, the near-I/O resistance (Rg1n, Rg2n, Rg3n) is set larger than the middle-portion resistance (Rg3n, Rg4n) in resistance value, and the near-other-end resistance (Rg4n, Rg5n, Rg6n) is set larger than the middle-portion resistance (Rg3n, Rg4n) in resistance value (see FIG. 5).

With means according to the preferred embodiment of the invention, even in case that a near-I/O RF leak signal applied to the near-I/O resistance (Rg1n, Rg2n, Rg3n) is higher than a middle-portion RF leak signal applied to the middle-portion resistance (Rg3n, Rg4n) in level, e.g. the intermodulation distortion critical for WCDMA system can be reduced. This is because even if a near-I/O RF leak signal of High level is applied to the near-I/O resistance (Rg1n, Rg2n, Rg3n) larger than the middle-portion resistance (Rg3n, Rg4n) in resistance value, a current flowing through the near-I/O resistance (Rg1n, Rg2n, Rg3n) is reduced per se, and the distortion of the signal current is also reduced.

With means according to the preferred embodiment of the invention, even in case that a near-other-end RF leak signal applied to the near-other-end resistance (Rg4n, Rg5n, Rg6n) is higher than a middle-portion RF leak signal applied to the middle-portion resistance (Rg3n, Rg4n) in level, e.g. the intermodulation distortion critical for WCDMA system can be reduced. This is because even if a near-other-end RF leak signal of High level is applied to the near-other-end resistance (Rg4n, Rg5n, Rg6n) larger than the middle-portion resistance (Rg3n, Rg4n) in resistance value, a current flowing through the near-other-end resistance (Rg4n, Rg5n, Rg6n) can be reduced per se, and the distortion of the signal current is also reduced.

In the semiconductor IC according to a more preferred embodiment of the invention, in the other high-frequency switch (Qn), a first resistance (Rg1n) is connected between a gate (Gn2) of a second near-I/O field effect transistor (Qn2) of the other field effect transistors (Qn1, . . . , Qn6), which is second near to the common input/output terminal (I/O) after the near-I/O field effect transistor (Qn1), and the gate (Gn1) of the near-I/O field effect transistor (Qn1). A second resistance (Rg2n) is connected between the gate (Gn2) of the second near-I/O field effect transistor (Qn2) and the gate (Gn3, 4) of the middle-portion field effect transistor (Qn3, 4). A third resistance (Rg3n) is connected between the gate (Gn3, 4) of the middle-portion field effect transistor (Qn3, 4) and the other control terminal (Vctrl_n).

The near-I/O resistance (Rg1n, Rg2n, Rg3n) connected with the gate (Gn1) of the near-I/O field effect transistor (Qn1) includes the first resistance (Rg1n), second resistance (Rg2n) and third resistance (Rg3n). A second near-I/O resistance (Rg2n, Rg3n) connected with the gate (Gn2) of the second near-I/O field effect transistor (Qn2) includes not the first resistance (Rg1n), but the second resistance (Rg2n) and third resistance (Rg3n). The middle-portion resistance (Rg3n, Rg4n) connected with the gate (Gn3, 4) of the middle-portion field effect transistor (Qn3, 4) includes not the first resistance (Rg1n) and second resistance (Rg2n), but the third resistance (Rg3n) (see FIG. 5).

With means according to the more preferred embodiment of the invention, the high resistance value of the near-I/O resistance (Rg1n, Rg2n, Rg3n) can be materialized by not one high resistance, but a total of the first resistance (Rg1n), second resistance (Rg2n) and third resistance (Rg3n).

In the semiconductor IC according to the more preferred embodiment of the invention, in the other high-frequency switch (Qn), a fourth resistance (Rg4n) is connected between the gate (Gn3, 4) of the middle-portion field effect transistor (Qn3, 4), and the other control terminal (Vctrl_n). A fifth resistance (Rg5n) is connected between a gate (Gn5) of a second near-other-end field effect transistor (Qn5) of the other field effect transistors (Qn1, . . . , Qn7) of the other high-frequency switch (Qn), which is second near to the other end (Txn) of the other high-frequency switch (Qn) after the near-other-end field effect transistor (Qn6), and the gate (Gn3, 4) of the middle-portion field effect transistor (Qn3, 4). A sixth resistance (Rg6n) is connected between the gate (Gn5) of the second near-other-end field effect transistor (Qn5), and the gate (Gn6) of the near-other-end field effect transistor (Qn6).

The near-other-end resistance (Rg4n, Rg5n, Rg6n) connected with the gate (Gn6) of the near-other-end field effect transistor (Qn6) includes the fourth resistance (Rg4n), fifth resistance (Rg5n) and sixth resistance (Rg6n). A second near-other-end resistance (Rg4n, Rg5n) connected with the gate (Gn5) of the second near-other-end field effect transistor (Qn5) includes not the sixth resistance (Rg6n), but the fourth resistance (Rg4n) and fifth resistance (Rg5n). The middle-portion resistance (Rg3n, Rg4n) connected with the gate (Gn3, 4) of the middle-portion field effect transistor (Qn3, 4) includes not the fifth resistance (Rg5n) and sixth resistance (Rg6n), but the fourth resistance (Rg4n) (see FIG. 5).

With means according to the more preferred embodiment of the invention, the high resistance value of the near-other-end resistance (Rg4n, Rg5n, Rg6n) can be materialized by not one high resistance, but a total of the fourth resistance (Rg4n), fifth resistance (Rg5n) and sixth resistance (Rg6n).

In the semiconductor IC according to a specific embodiment of the invention, the RF transmit signal (WCDMA1900_Tx) and RF receive signal (WCDMA2100_Rx) based on WCDMA system as the predetermined communication system can be supplied to the other end (TRx1) of the one high-frequency switch (SW_TRx1) of the plurality of high-frequency switches (SW_TRx1, SW_Tx1, SW Tx2). The other RF transmit signal (GSM850_Tx/GSM900_Tx, DCS1800_Tx/PCS1900_Tx) can be supplied to the other end (Tx1, Tx2) of the other high-frequency switch (SW_Tx1, SW Tx2) of the plurality of high-frequency switches (SW_TRx1, SW_Tx1, SW Tx2).

One grounded switch (GSW_TRx1) is connected between the other end (TRx1) of the one high-frequency switch (SW_TRx1) and a grounded node (GND), and other grounded switch (GSW_Tx1, GSW Tx2) is connected between the other end (Tx1, Tx2) of the other high-frequency switch (SW_Tx1, SW Tx2) and the grounded node (GND).

At time of controlling the one high-frequency switch (SW_TRx1) to ON state, the one grounded switch (GSW_TRx1) is controlled to OFF state, the other high-frequency switch (SW_Tx1, SW Tx2) is controlled to OFF state, and the other grounded switch (GSW_Tx1, GSW Tx2) is controlled to ON state.

At time of controlling the other high-frequency switch (SW_Tx1, SW Tx2) to ON state, the other grounded switch (GSW_Tx1, GSW Tx2) is controlled to OFF state, the one high-frequency switch (SW_TRx1) is controlled to OFF state, and the one grounded switch (GSW_TRx1) is controlled to ON state (see FIG. 6).

With means according to the more specific embodiment of the invention, the one high-frequency switch (SW_TRx1) and the one grounded switch (GSW_TRx1) are controlled in on and off complementarily, and the other high-frequency switch (SW_Tx1, SW Tx2) and the other grounded switch (GSW_Tx1, GSW Tx2) are controlled in on and off complementarily. As a result, the isolation of the antenna switch can be further enhanced.

In the semiconductor IC according to another specific embodiment of the invention, an I/O additional capacitance (C11Tx1n) is connected between the common input/output terminal (I/O) and the gate (Gn1) of the near-I/O field effect transistor (Qn1) of the other high-frequency switch (Qn), and an other-end additional capacitance (C12Tx1n) is connected between the other end (Txn) of the other high-frequency switch (Qn) and the gate (Gn6) of the near-other-end field effect transistor (Qn6) of the other high-frequency switch (Qn) (see FIG. 5).

With means according to the more specific embodiment of the invention, it is possible to suppress the phenomenon that positive and negative directions' voltage fluctuations of an RF transmit signal from the one high-frequency switch (Qm) in ON state turn on the near-I/O FET (Qn1) and near-other-end FET (Qn6) of the other high-frequency switch (Qn) at time of bringing the one high-frequency switch (Qm) and other high-frequency switch (Qn) to ON state and OFF state respectively.

In the semiconductor IC according to a more specific embodiment of the invention, the other RF transmit signal (GSM850_Tx/GSM900_Tx, DCS1800_Tx/PCS1900_Tx) supplied to the other end (Tx1, Tx2) of the other high-frequency switch (SW_Tx1, GSW Tx2) of the high-frequency switches (SW_TRx1, SW_Tx1, GSW Tx2) is an RF transmit signal of GSM850, GSM900, DCS1800 or PCS1900 (see FIG. 6).

Of the invention herein disclosed, other representative embodiments will be briefly outlined below.

A representative semiconductor IC of the invention includes a DC boost circuit (100). The DC boost circuit includes a high-frequency input terminal (101), a DC control input terminal (103) and a DC output terminal (104).

A high-frequency input signal (RFin) is supplied to the high-frequency input terminal, a DC control voltage (Vdc) is supplied to the DC control input terminal, and a DC output voltage (Vout) arises from the DC output terminal.

In the DC boost circuit, the high-frequency input terminal is connected with one terminal of a series of a first capacitance element (106; C1) and a first resistance element (107; R1) connected in series. A first diode (108; D1) and a second diode (109; D2) are connected in parallel in opposite directions with a second capacitance element (110; C2) therebetween. A common connecting point of the first and second diodes is connected with the other terminal of the series of first capacitance and resistance elements. A common connecting point of the first diode and one terminal of the second capacitance is connected with the DC control input terminal, and a common connecting point of the second diode and the other terminal of the second capacitance is connected with the DC output terminal through the second resistance element.

The first resistance element is set larger in resistance value than a first series resistance (rs1) of the first diode and a second series resistance (rs2) of the second diode in the first and second diodes connected in parallel in opposite directions with the second capacitance element therebetween (see FIG. 10).

Advantageous Effects

The effect achieved by a representative embodiment of the invention herein disclosed will be briefly described below.

That is, the invention can reduce the intermodulation distortion critical for WCDMA system, or the harmonic distortion critical for GSM system in an antenna switch mounted on an RF communication terminal device.

Further, the effect achieved by a representative embodiment of the invention herein disclosed will be briefly described below.

That is, the invention can provide a semiconductor IC having a built-in DC boost circuit whose life and operation reliability are improved.

BEST MODE FOR CARRYING OUT THE INVENTION

<<Configuration of Mobile Phone>>

Figure 1:
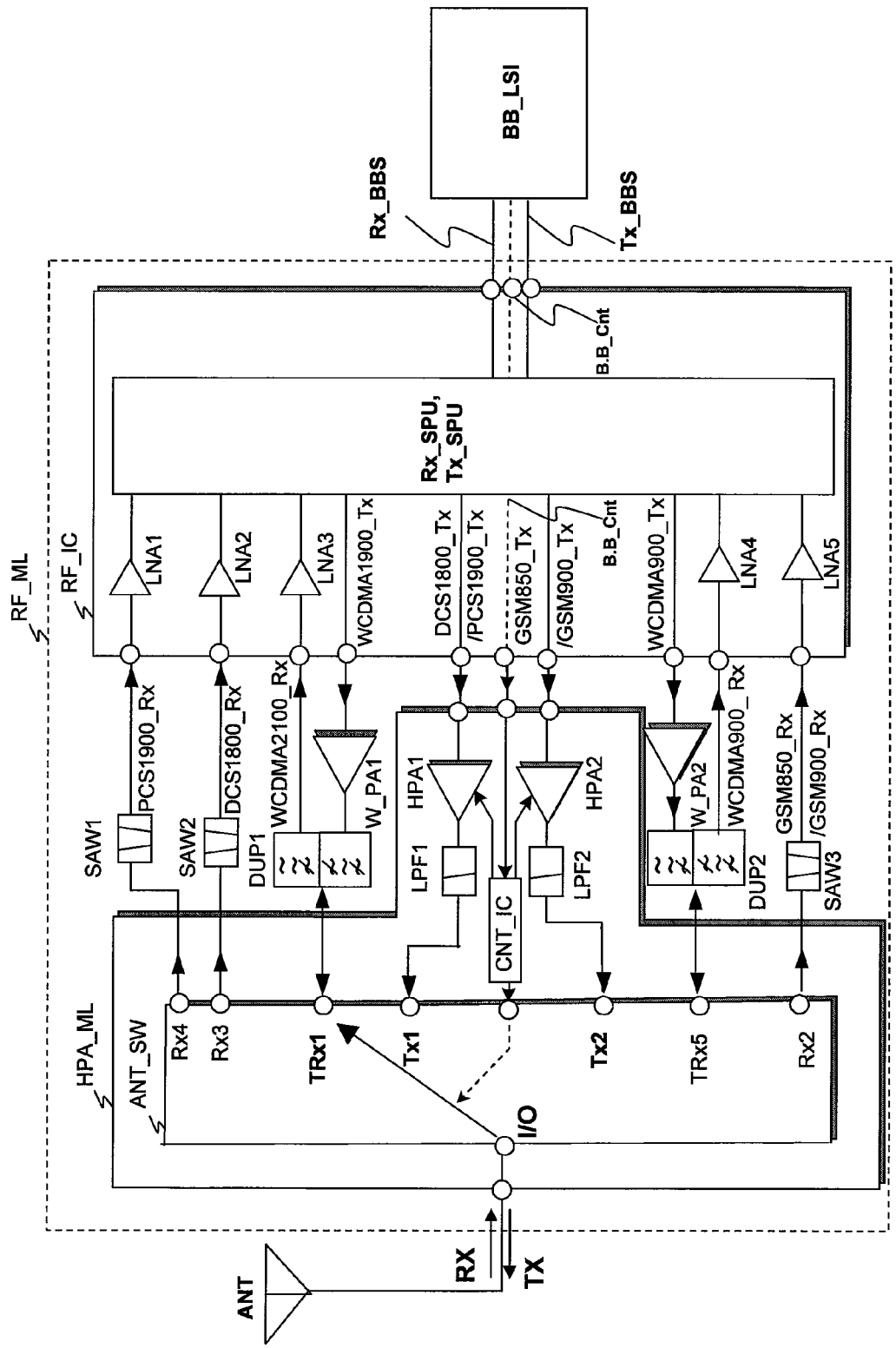
FIG. 1 is a block diagram showing a configuration of a mobile phone equipped with an RF module incorporating an antenna switch MMIC developed prior to the invention and a baseband signal processing LSI, and it is also a block diagram showing a configuration of a mobile phone equipped with an RF module incorporating an antenna switch MMIC according to an embodiment of the invention, and a baseband signal processing LSI.
Figure 2:
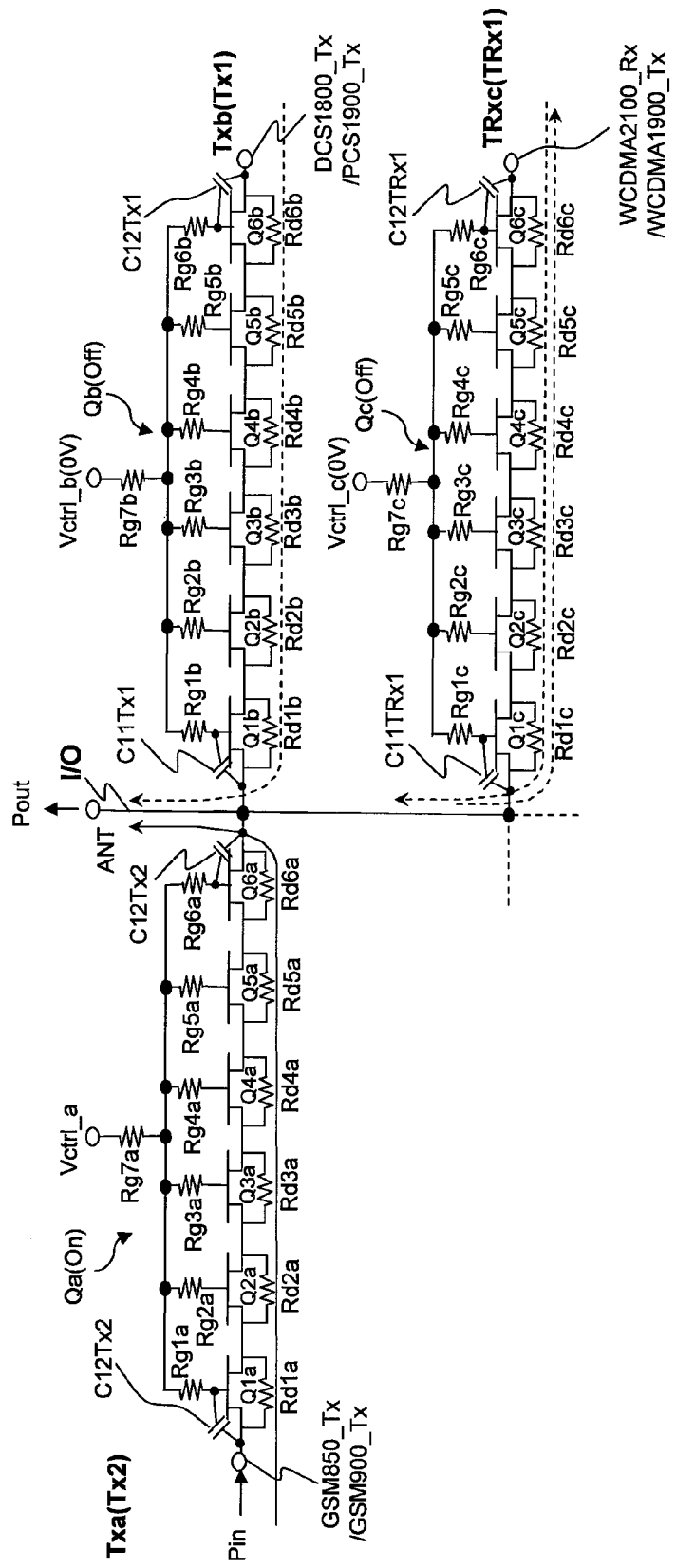
FIG. 2 is a block diagram showing a configuration of a plurality of high-frequency switches of the antenna switch MMIC developed prior to the invention.
Figure 3:
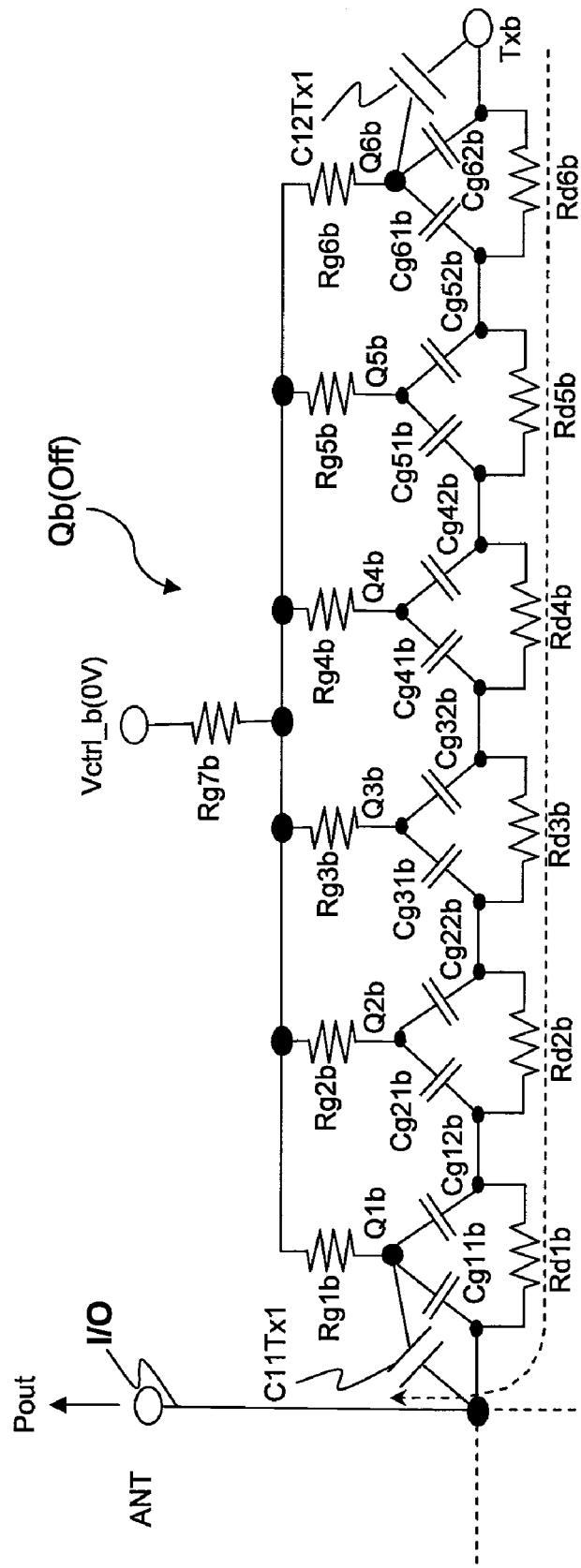
FIG. 3 is a diagram showing, of the high-frequency switches shown in FIG. 2, the high-frequency switch in OFF state in an equivalent circuit thereof.

FIG. 1 is a block diagram showing a configuration of a mobile phone equipped with an RF module incorporating an antenna switch MMIC according to an embodiment of the invention, and a baseband signal processing LSI.

In the drawing, the mobile phone antenna ANT for transmission and reception is connected to a common input/output terminal I/O of the antenna switch MMIC (ANT_SW) of the RF module RF_ML. A control signal B.B_Cnt from the baseband signal processing LSI (BB_LSI) is passed through an RF analog signal processing semiconductor IC (RF_IC), and supplied to a controller integrated circuit (CNT_IC) of a high-output-power-amplifier module (HPA_ML). A flow of an RF signal from the antenna ANT for transmission and reception to the common input/output terminal I/O leads to a receive operation RX of the mobile phone, and a flow of an RF signal from the common input/output terminal I/O to the antenna ANT for transmission and reception is involved in a transmit operation TX of the mobile phone.

RF IC (RF_IC) converts up a transmit baseband signal Tx_BBS from the baseband signal processing LSI (BB_LSI) to an RF transmit signal in frequency, and reversely converts down an RF receive signal, which has been received through the antenna ANT for transmission and reception, to a receive baseband signal Rx_BBS in frequency, and then supplies the resultant signal to the baseband signal processing LSI (BB_LSI).

The antenna switch MMIC (ANT_SW) of the RF module RF_ML establishes a signal path between the common input/output terminal I/O and one of the transmit terminals Tx1 and Tx2, receive terminals Rx2, Rx3 and Rx4 and transmit/receive terminals TRx1 and TRx5 to conduct the receive operation RX or transmit operation TX. The antenna switch MMIC (ANT_SW) is arranged so that the required isolation can be achieved by setting the impedance of a signal path, except the one established for the receive operation RX or transmit operation TX, to an extremely high value. In the field of antenna switches, the common input/output terminal I/O is referred to as "Single Pole", and a total of seven terminals of the transmit terminals Tx1 and Tx2, receive terminals Rx2, Rx3 and Rx4, and transmit/receive terminals TRx1 and TRx5 are referred to as "7 throw". Therefore, the antenna switch MMIC (ANT_SW) of FIG. 1 is a switch of Single Pole 7 throw (SP7T) type.

The baseband signal processing LSI (BB_LSI) is connected to an external nonvolatile memory and application processor, which are not shown. The application processor is connected with a liquid crystal display device and a key input device, which are not shown, and it can execute various application software programs including a general-purpose program and an electronic game. A boot program (start initializing program) and an operating system program (OS) for a mobile device such as a mobile phone, a program for phase demodulation for a receive baseband signal of e.g. GSM system, and phase modulation for a transmit baseband signal by a digital signal processor (DSP) inside the baseband signal processing LSI, and various application software programs can be stored in the external nonvolatile memory.

<<Transmit and Receive Operations According to GSM850 and GSM900>>

In case that a transmit baseband signal Tx_BBS from BB_LSI is to be up-converted to a GSM850 band in frequency, the transmit signal processing unit Tx_SPU of RF IC converts up the transmit baseband signal Tx_BBS to the GSM850 band in frequency, whereby a GSM850 RF transmit signal GSM850_Tx (824-849 MHz) is produced. In case that a transmit baseband signal Tx_BBS from BB_LSI is to be up-converted to a GSM900 band in frequency, the transmit signal processing unit Tx_SPU of RF IC converts up the transmit baseband signal Tx_BBS to the GSM900 band in frequency, whereby a GSM900 RF transmit signal GSM900_Tx (880-915 MHz) is produced. The GSM850 RF transmit signal GSM850_Tx and GSM900 RF transmit signal GSM900_Tx are amplified in power by a high-output-power amplifier HPA2 of the high-output-power-amplifier module (HPA_ML), passed through the low-pass filter LPF2, and supplied to the transmit terminal Tx2 of the antenna switch MMIC (ANT_SW). The GSM850 RF transmit signal GSM850_Tx and GSM900 RF transmit signal GSM900_Tx, which are supplied to the transmit terminal Tx2, can be sent out from the antenna ANT for transmission and reception through the common input/output terminal I/O.

A GSM850 RF receive signal GSM850_Rx (869-894 MHz) and a GSM900 RF receive signal GSM900_Rx (925-960 MHz), which have been received through the antenna ANT for transmission and reception, are supplied to the common input/output terminal I/O of the antenna switch MMIC (ANT_SW). The GSM850 RF receive signal GSM850_Rx and GSM900 RF receive signal GSM900_Rx taken from the receive terminal Rx2 of the antenna switch MMIC (ANT_SW) are passed through the surface-acoustic-wave filter SAW3, amplified by the low-noise amplifier LNA5 of RF IC (RF_IC), and then supplied to the receive signal processing unit Rx_SPU. The receive signal processing unit Rx_SPU converts down the GSM850 RF receive signal GSM850_Rx or GSM900 RF receive signal GSM900_Rx to the receive baseband signal Rx_BBS in frequency. In a GSM850 transmit/receive mode, the antenna switch MMIC (ANT_SW) responds to a control signal B.B_Cnt, and performs the transmission of an RF transmit signal GSM850_Tx with a connection between the input/output terminal I/O and transmit terminal Tx2, and the reception of an RF receive signal GSM850_Rx with a connection between the input/output terminal I/O and receive terminal Rx2 by means of time division. Likewise, in a GSM900 transmit/receive mode, the antenna switch MMIC (ANT_SW) responds to a control signal B.B_Cnt, and performs the transmission of an RF transmit signal GSM900_Tx with a connection between the input/output terminal I/O and transmit terminal Tx2, and the reception of an RF receive signal GSM900_Rx with a connection between the input/output terminal I/O and receive terminal Rx2 by means of time division.

<<Transmit and Receive Operations According to DCS1800 and PCS1900>>

In case that a transmit baseband signal Tx_BBS from BB_LSI is to be up-converted to a DCS1800 band in frequency, the transmit signal processing unit Tx_SPU of RF IC converts up the transmit baseband signal Tx_BBS to the DCS1800 band in frequency, whereby a DCS1800 RF transmit signal DCS1800_Tx (1710-1780 MHz) is produced. In case that a transmit baseband signal Tx_BBS from BB_LSI is to be up-converted to a PCS1900 band in frequency, the transmit signal processing unit Tx_SPU of RF IC converts up the transmit baseband signal Tx_BBS to the PCS1900 band in frequency, whereby a PCS1900 RF transmit signal PCS1900_Tx (1850-1910 MHz) is produced. The DCS1800 RF transmit signal DCS1800_Tx and PCS1900 RF transmit signal PCS1900_Tx are amplified in power by a high-output-power amplifier HPA1 of the high-output-power-amplifier module (HPA_ML), passed through the low-pass filter LPF1, and supplied to the transmit terminal Tx1 of the antenna switch MMIC (ANT_SW). The DCS1800 RF transmit signal DCS1800_Tx and PCS1900 RF transmit signal PCS1900_Tx, which are supplied to the transmit terminal Tx1, can be sent out from the antenna ANT for transmission and reception through the common input/output terminal I/O.

A DCS1800 RF receive signal DCS1800_Rx (1805-1880 MHz) and a PCS1900 RF receive signal PCS1900_Rx (1930-1990 MHz), which have been received through the antenna ANT for transmission and reception, are supplied to the common input/output terminal I/O of the antenna switch MMIC (ANT_SW). The DCS1800 RF receive signal DCS1800_Rx taken from the receive terminal Rx3 of the antenna switch MMIC (ANT_SW), is passed through the surface-acoustic-wave filter SAW2, and amplified by the low-noise amplifier LNA2 of RF IC (RF_IC). The PCS1900 RF receive signal PCS1900_Rx taken from the receive terminal Rx4 of the antenna switch MMIC (ANT_SW) is passed through the surface-acoustic-wave filter SAW1, amplified by the low-noise amplifier LNA1 of RF IC (RF_IC), and then supplied to the receive signal processing unit Rx_SPU. The receive signal processing unit Rx_SPU converts down the DCS1800 RF receive signal DCS1800_Rx or PCS1900 RF receive signal PCS1900_Rx to a receive baseband signal Rx_BBS in frequency.

In a DCS1800 transmit/receive mode, the antenna switch MMIC (ANT_SW) responds to a control signal B.B_Cnt, and performs the transmission of an RF transmit signal DCS1800_Tx with a connection between the input/output terminal I/O and transmit terminal Tx1, and the reception of an RF receive signal DCS1800_Rx with a connection between the input/output terminal I/O and receive terminal Rx3 by means of time division. Likewise, in a PCS1900 transmit/receive mode, the antenna switch MMIC (ANT_SW) responds to a control signal B.B_Cnt, and performs the transmission of an RF transmit signal PCS1900_Tx with a connection between the input/output terminal I/O and transmit terminal Tx1, and the reception of an RF receive signal PCS1900_Rx with a connection between the input/output terminal I/O and receive terminal Rx4 by means of time division.

<<Transmit and Receive Operations According to WCDMA>>

In case that a transmit baseband signal Tx_BBS from BB_LSI is to be up-converted to a WCDMA1900 band in frequency, the transmit signal processing unit Tx_SPU of RF IC converts up the transmit baseband signal Tx_BBS to the WCDMA1900 band in frequency, whereby a WCDMA1900 RF transmit signal WCDMA1900_Tx (1920-1980 MHz) is produced. The WCDMA1900 RF transmit signal WCDMA1900_Tx is amplified in power by a high-output power amplifier W_PA1, passed through a duplexer DUP1, and supplied to the transmit/receive terminal TRx1 of the antenna switch MMIC (ANT_SW). The WCDMA1900 RF transmit signal WCDMA1900_Tx, which is supplied to the transmit/receive terminal TRx1, can be sent out from the antenna ANT for transmission and reception through the common input/output terminal I/O.

In WCDMA system, the transmit operation and receive operation can be handled in parallel by means of code division. Specifically, a WCDMA2100 RF receive signal WCDMA2100_Rx (2110-2170 MHz), which has been received through the antenna ANT for transmission and reception, is supplied to the common input/output terminal I/O of the antenna switch MMIC (ANT_SW). The WCDMA2100 RF receive signal WCDMA2100_Rx taken from the transmit/receive terminal TRx1 of the antenna switch MMIC (ANT_SW) is passed through the duplexer DUP1, amplified by the low-noise amplifier LNA3 of RF IC (RF_IC), and then supplied to the receive signal processing unit Rx_SPU. The receive signal processing unit Rx_SPU converts down the WCDMA2100 RF receive signal WCDMA2100_Rx to a receive baseband signal Rx_BBS in frequency.

In a parallel processing mode for WCDMA1900 transmission and WCDMA2100 reception, the antenna switch MMIC (ANT_SW) responds to a control signal B.B_Cnt, and performs, in parallel, the transmission of an RF transmit signal WCDMA1900_Tx and the reception of an RF receive signal WCDMA2100_Rx with a steady connection between the input/output terminal I/O and transmit/receive terminal TRx1.

WCDMA900 is a new system, which was proposed at the end of January 2006, targets mobile television broadcasting, video phones, services like DSL in remote places and the like. While it seems that WCDMA900 uses a frequency band of 900 MHz, the transmit frequency of RF transmit signals WCDMA900_Tx from terminal devices and the transmit frequency of RF receive signals WCDMA900_Rx to terminal devices have not been disclosed so far. However, it is inferred that with WCDMA900, the transmit frequency of RF receive signals WCDMA900_Rx is higher than the transmit frequency of RF transmit signals WCDMA900_Tx.

In case that a transmit baseband signal Tx_BBS from BB_LSI is to be up-converted to a WCDMA900 band in frequency, the transmit signal processing unit Tx_SPU of RF IC converts up the transmit baseband signal Tx_BBS to the WCDMA900 band in frequency, whereby a WCDMA900 RF transmit signal WCDMA900_Tx (about 900 MHz) is produced. The WCDMA900 RF transmit signal WCDMA900_Tx is amplified in power by a high-output power amplifier W_PA2, passed through a duplexer DUP2, and supplied to the transmit/receive terminal TRx5 of the antenna switch MMIC (ANT_SW). The WCDMA900 RF transmit signal WCDMA900_Tx, which is supplied to the transmit/receive terminal TRx5, can be sent out from the antenna ANT for transmission and reception through the common input/output terminal I/O.

A WCDMA900 RF receive signal WCDMA900_Rx (about 900 MHz), which has been received through the antenna ANT for transmission and reception is supplied to the common input/output terminal I/O of the antenna switch MMIC (ANT_SW). The WCDMA900 RF receive signal WCDMA900_Rx taken from the transmit/receive terminal TRx5 of the antenna switch MMIC (ANT_SW) is passed through the duplexer DUP2, amplified by the low-noise amplifier LNA4 of RF IC (RF_IC), and then supplied to the receive signal processing unit Rx_SPU. The receive signal processing unit Rx_SPU converts down the WCDMA900 RF receive signal WCDMA900_Rx to a receive baseband signal Rx_BBS in frequency.

In a parallel processing mode for WCDMA900 transmission and WCDMA900 reception, the antenna switch MMIC (ANT_SW) responds to a control signal B.B_Cnt, and performs, in parallel, the transmission of an RF transmit signal WCDMA900_Tx and the reception of an RF receive signal WCDMA900_Rx with a steady connection between the input/output terminal I/O and transmit/receive terminal TRx5.

<<Basic Configuration of High-Frequency Switches of the Antenna Switch>>

Figure 5:
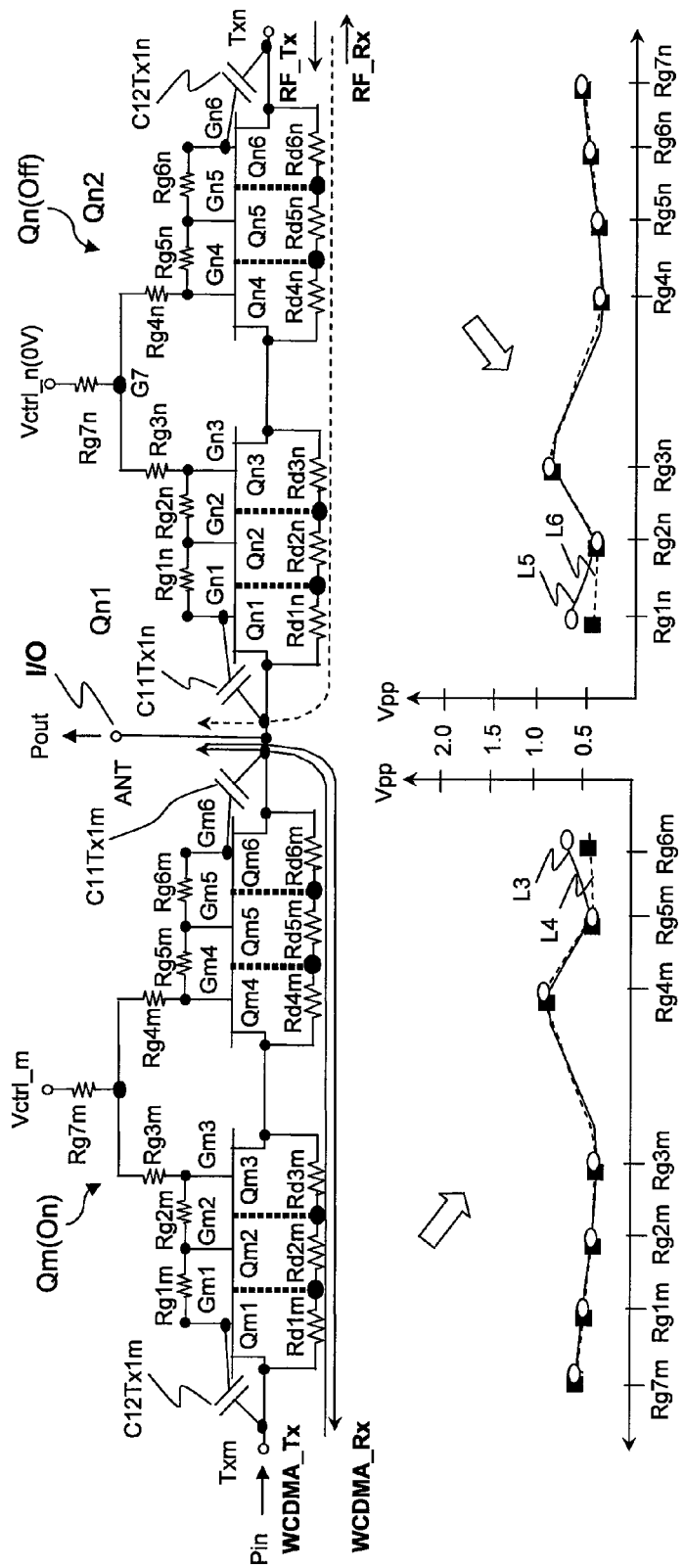
FIG. 5 is a block diagram showing a basic configuration of the high-frequency switches of the antenna switch MMIC according to an embodiment of the invention shown in FIG. 1.

FIG. 5 is a block diagram showing a basic configuration of the high-frequency switches of the antenna switch MMIC (ANT_SW) according to the embodiment of the invention shown in FIG. 1.

The chip of the antenna switch MMIC according to the embodiment of the invention shown in FIG. 1 includes a plurality of high-frequency switches Qm and Qn as shown in FIG. 5. One end of one high-frequency switch Qm of the plurality of high-frequency switches Qm and Qn, and one end of other high-frequency switch Qn are connected with the common input/output terminal I/O. The common input/output terminal I/O is connected with an antenna ANT of a mobile phone, which is a radio-frequency communication terminal device. To the other end Txm of the high-frequency switch Qm, WCDMA system's RF transmit signal WCDMA_Tx and RF receive signal WCDMA_Rx can be supplied. To the other end Txn of the high-frequency switch Qn, at least one of an other RF transmit signal RF_Tx and an other RF receive signal RF_Rx different from the RF transmit signal WCDMA_Tx and RF receive signal WCDMA_Rx can be supplied.

The one high-frequency switch Qm includes six FETs Qm1, ..., Qm6 connected in series, and the other high-frequency switch Qn includes other six FETs Qn1, ..., Qn6 connected in series. Incidentally, three FETs Qm1, Qm2 and Qm3 are composed of one FET with three gates Gm1, Gm2 and Gm3 forming a triple-gate structure, and three FETs Qm4, Qm5 and Qm6 are composed of one FET with three gates Gm4, Gm5 and Gm6 forming a triple-gate structure. Likewise, three FETs Qn1, Qn2 and Qn3 are composed of one FET with three gates Gn1, Gn2 and Gn3 forming a triple-gate structure, and three FETs Qn4, Qn5 and Qn6 are composed of one FET with three gates Gn4, Gn5 and Gn6 forming a triple-gate structure.

As in the case of Patent Citation 4, an inter-gate region (i.e. a common connecting node of FETs Qm1 and Qm2) between the gates Gm1 and Gm2 of the multi-gate structure is connected with the source of FET Qm1 through the potential-stabilizing resistance Rd1$m$. Also, an inter-gate region (i.e. a common connecting node of FETs Qm2 and Qm3) between the gates Gm2 and Gm3 of the multi-gate structure is connected with the source of the FET Qm1 through the potential-stabilizing resistances Rd2$m$ and Rd1$m$. Further, an inter-gate region (i.e. a common connecting node of FETs Qm2 and Qm3) between the gates Gm2 and Gm3 of the multi-gate structure is connected with the drain of FET Qm3 through the potential-stabilizing resistance Rd3$m$. In addition, an inter-gate region (i.e. a common connecting node of FETs Qm4 and Qm5) between the gates Gm4 and Gm5 of the multi-gate structure is connected with the source of FET Qm4 through the potential-stabilizing resistance Rd4$m$. An inter-gate region (i.e. a common connecting node of FETs Qm5 and Qm6) between the gates Gm5 and Gm6 of the multi-gate structure is connected with the source of FET Qm4 through the potential-stabilizing resistances Rd5$m$ and Rd4$m$. Moreover, an inter-gate region (i.e. a common connecting node of FETs Qm5 and Qm6) between the gates Gm5 and Gm6 of the multi-gate structure is connected with the drain of FET Qm6 through the potential-stabilizing resistance Rd6$m$.

An inter-gate region (i.e. a common connecting node of FETs Qn1 and Qn2) between the gates Gn1 and Gn2 of the multi-gate structure is connected with the source of FET Qn1 through the potential-stabilizing resistance Rd1$n$. In addition, an inter-gate region (i.e. a common connecting node of FETs Qn2 and Qn3) between the gates Gn2 and Gn3 of the multi-gate structure is connected with the source of FET Qn1 through the potential-stabilizing resistances Rd2$n$ and Rd1$n$. Further, an inter-gate region (i.e. a common connecting node of FETs Qn2 and Qn3) between the gates Gn2 and Gn3 of the multi-gate structure is connected with the drain of FET Qn3 through the potential-stabilizing resistance Rd3$n$. Still further, an inter-gate region (i.e. a common connecting node of FETs Qn4 and Qn5) between the gates Gn4 and Gn5 of the multi-gate structure is connected with the source of FET Qn4 through the potential-stabilizing resistance Rd4$n$. An inter-gate region (i.e. a common connecting node of FETs Qn5 and Qn6) between the gates Gn5 and Gn6 of the multi-gate structure is connected with the source of FET Qn4 through the potential-stabilizing resistances Rd5$n$ and Rd4$n$. Moreover, an inter-gate region (i.e. a common connecting node of FETs Qn5 and Qn6) between the gates Gn5 and Gn6 of the multi-gate structure is connected with the drain of FET Qn6 through the potential-stabilizing resistance Rd6$n$.

To the gates Gm1, ..., Gm6 of FETs Qm1, ..., Qm6 of the one high-frequency switch Qm, a control voltage Vctrl_m for ON-OFF control of the one high-frequency switch Qm can be supplied. To the gates Gn1, ..., Gn6 of FETs Qn1, ..., Qn6 of the other high-frequency switch Qn, another control voltage Vctrl_n for ON-OFF control of the other high-frequency switch Qn can be supplied.

Between the six gates Gm1, ..., Gm6 of the six FETs Qm1, ..., Qm6 of the one high-frequency switch Qm, and a control terminal supplied with the control voltage Vctrl_m, six resistances Rg1$m$, ..., Rg6$m$ are connected. Between the six gates Gn1, . . . , Gn6 of the six FETs Qn1, . . . , Qn6 of the other high-frequency switch Qn, and another control terminal supplied with the control voltage Vctrl_n, other six resistances Rg1n, . . . , Rg6n are connected.

In the other high-frequency switch Qn, a near-I/O resistances Rg1n, Rg2n and Rg3n between a gate Gn1 of a near-I/O FET Qn1 of the six FETs Qn1, . . . , Qn6 nearest to the common input/output terminal I/O, and the control terminal Vctrl_n have a first voltage-current characteristic. In the other high-frequency switch Qn, middle-portion resistances Rg3n and Rg4n between the control terminal Vctrl_n and gates Gn3 and Gn4 of middle-portion FETs Qn3, 4 in middle portions between a near-I/O FET Qn1 and a near-other-end FET Qn6 of the six FETs Qn1, . . . , Qn6 nearest to the other end Txn of the other high-frequency switch Qn have a second voltage-current characteristic. In the other high-frequency switch Qn, the first voltage-current characteristic of the near-I/O resistances Rg1n, Rg2n and Rg3n is set higher than the second voltage-current characteristic of the middle-portion resistances Rg3n and Rg4n in linearity. Therefore, in regard to the other high-frequency switch Qn driven by WCDMA system's RF transmit signal WCDMA_Tx from the one high-frequency switch Qm, the first voltage-current characteristic of the near-I/O resistances Rg1n, Rg2n and Rg3n is set higher than the second voltage-current characteristic of the middle-portion resistances Rg3n and Rg4n in linearity. Hence, even in case that an uneven RF leak signal is applied to the near-I/O resistances Rg1n, Rg2n and Rg3n, and the middle-portion resistances Rg3n and Rg4n, it is possible to suppress the distortion of a current flowing through the near-I/O resistances Rg1n, Rg2n and Rg3n of the gate Gn1 of the near-I/O FET Qn1 nearest to the common input/output terminal I/O in the other high-frequency switch Qn. Consequently, the intermodulation distortion critical for WCDMA system, and the harmonic distortion critical for GSM system can be reduced.

In the other high-frequency switch Qn, near-other-end resistances Rg4n, Rg5n and Rg6n between the other control terminal Vctrl_n and a gate Gn6 of a near-other-end FET Qn6 of FETs Qn1, . . . , Qn6 nearest to the other end Txn of the other high-frequency switch Qn, have a third voltage-current characteristic. With the other high-frequency switch Qn, the third voltage-current characteristic of the near-other-end resistances Rg4n, Rg5n and Rg6n is set higher than the second voltage-current characteristic of the middle-portion resistances Rg3n and Rg4n in linearity. Therefore, in regard to the other high-frequency switch Qn driven by WCDMA system's RF transmit signal WCDMA_Tx from the one high-frequency switch Qm, the third voltage-current characteristic of the near-other-end resistances Rg4n, Rg5n and Rg6n is set higher than the second voltage-current characteristic of the middle-portion resistances Rg3n and Rg4n in linearity. Hence, even in case that an uneven RF leak signal is applied to the near-other-end resistances Rg4n, Rg5n and Rg6n, and the middle-portion resistances Rg3n and Rg4n, it is possible to suppress the distortion of a current flowing through the near-other-end resistances Rg4n, Rg5n and Rg6n of the gate Gn6 of the near-other-end FET Qn6 nearest to the other end Txn in the other high-frequency switch Qn. Consequently, the intermodulation distortion critical for WCDMA system, and the harmonic distortion critical for GSM system can be reduced.

Further, the resistance values of the near-I/O resistances Rg1n, Rg2n and Rg3n are set larger than the resistance values of the middle-portion resistances Rg3n and Rg4n. Hence, even in case that the level of a near-I/O RF leak signal applied to the near-I/O resistances Rg1n, Rg2n and Rg3n is higher than the level of a middle-portion RF leak signal applied to the middle-portion resistances Rg3n and Rg4n, the intermodulation distortion critical for WCDMA system can be reduced. This is because even if a near-I/O RF leak signal at High level is applied to the near-I/O resistances Rg1n, Rg2n and Rg3n larger in resistance value than the middle-portion resistances Rg3n and Rg4n, a current flowing through the near-I/O resistances Rg1n, Rg2n and Rg3n is reduced per se, and the distortion of the signal current is also reduced. Beside, the resistance values of the near-other-end resistances Rg4n, Rg5n and Rg6n are set larger than the resistance values of the middle-portion resistances Rg3n and Rg4n. Therefore, even in case that the level of a near-other-end RF leak signal applied to the near-other-end resistances Rg4n, Rg5n and Rg6n is higher than the level of a middle-portion RF leak signal applied to the middle-portion resistances Rg3n and Rg4n, the intermodulation distortion critical for WCDMA system can be reduced. This is because even if a near-other-end RF leak signal of High level is applied to the near-other-end resistances Rg4n, Rg5n and Rg6n larger than the middle-portion resistances Rg3n and Rg4n in resistance value, a current flowing through the near-other-end resistances Rg4n, Rg5n and Rg6n is reduced per se, and the distortion of the signal current is also reduced.

Now, the high-frequency switches of the antenna switch MMIC (ANT_SW) according to the embodiment of the invention shown in FIG. 5 will be described further in detail.

In the one high-frequency switch Qm, the gate resistance Rg1m of 10 kΩ is connected between the gate Gm1 of the near-other-end FET Qm1 near to the other end Txm, and the gate Gm2 of the second near-other-end FET Qm2. The gate resistance Rg2m of 10 kΩ is connected between the gate Gm2 of the second near-other-end FET Qm2, and the gate Gm3 of the middle-portion FET Qm3. In the one high-frequency switch Qm, the gate resistance Rg6m of 10 kΩ is connected between the gate Gm6 of the near-I/O FET Qm6 near to the common input/output terminal I/O, and the gate Gm5 of the second near-I/O FET Qm5. The gate resistance Rg5m of 10 kΩ is connected between the gate Gm5 of the second near-I/O FET Qm5 and the gate Gm4 of the middle-portion FET Qm4. The gate Qm3 of the middle-portion FET Qm3 and the gate Qm4 of the middle-portion FET Qm4 are connected with one ends of the gate resistances Rg3m and Rg4m of 10 kΩ, respectively. The other ends of the gate resistances Rg3m and Rg4m are connected with one end of the resistance Rg7m of 20 kΩ. To the other end of the resistance Rg7m, the control voltage Vctrl_m is supplied.

The resistance Rd1m of 15 kΩ is connected between the source and drain of the near-other-end FET Qm1. The resistance Rd2m of 15 kΩ is connected between the source and drain of the second near-other-end FET Qm2. The resistance Rd3m of 15 kΩ is connected between the source and drain of the middle-portion FET Qm3. The resistance Rd4m of 15 kΩ is connected between the source and drain of the middle-portion FET Qm4. The resistance Rd5m of 15 kΩ is connected between the source and drain of the second near-I/O FET Qm5. The resistance Rd6m of 15 kΩ is connected between the source and drain of the near-I/O FET Qm6.

Therefore, between the gate Gm1 of the near-other-end FET Qm1 and the control voltage Vctrl_m, the gate resistance Rg1m of 10 kΩ, the gate resistance Rg2m of 10 kΩ, the gate resistance Rg3m of 10 kΩ, and the resistance Rg7m of 20 kΩ are connected in series. Between the gate Gm6 of the near-I/O FET Qm6 and the control voltage Vctrl_m, the gate resistance Rg6m of 10 kΩ, the gate resistance Rg5m of 10 kΩ, the gate resistance Rg4m of 10 kΩ and the resistance Rg7m of 20 kΩ are connected in series. Between the gate Gm2 of the second near-other-end FET Qm2 and the control voltage Vctrl_m, the gate resistance Rg2m of 10 kΩ, the gate resistance Rg3m of 10 kΩ and the resistance Rg7m of 20 kΩ are connected in series. Between the gate Gm5 of the second near-I/O FET Qm5 and the control voltage Vctrl_m, the gate resistance Rg5m of 10 kΩ, the gate resistance Rg4m of 10 kΩ and the resistance Rg7m of 20 kΩ are connected in series. Between the gate Gm3 of the middle-portion FET Qm3 and the control voltage Vctrl_m, the gate resistance Rg3m of 10 kΩ and the resistance Rg7m of 20 kΩ are connected in series. Between the gate Gm4 of the middle-portion FET Qm4 and the control voltage Vctrl_m, the gate resistance Rg4m of 10 kΩ and the resistance Rg7m of 20 kΩ are connected in series. The six gate resistances Rg1m to Rg6m, and the one resistance Rg7m have a nonlinear voltage-current characteristic as shown by the above Expression 1.

Figure 4:
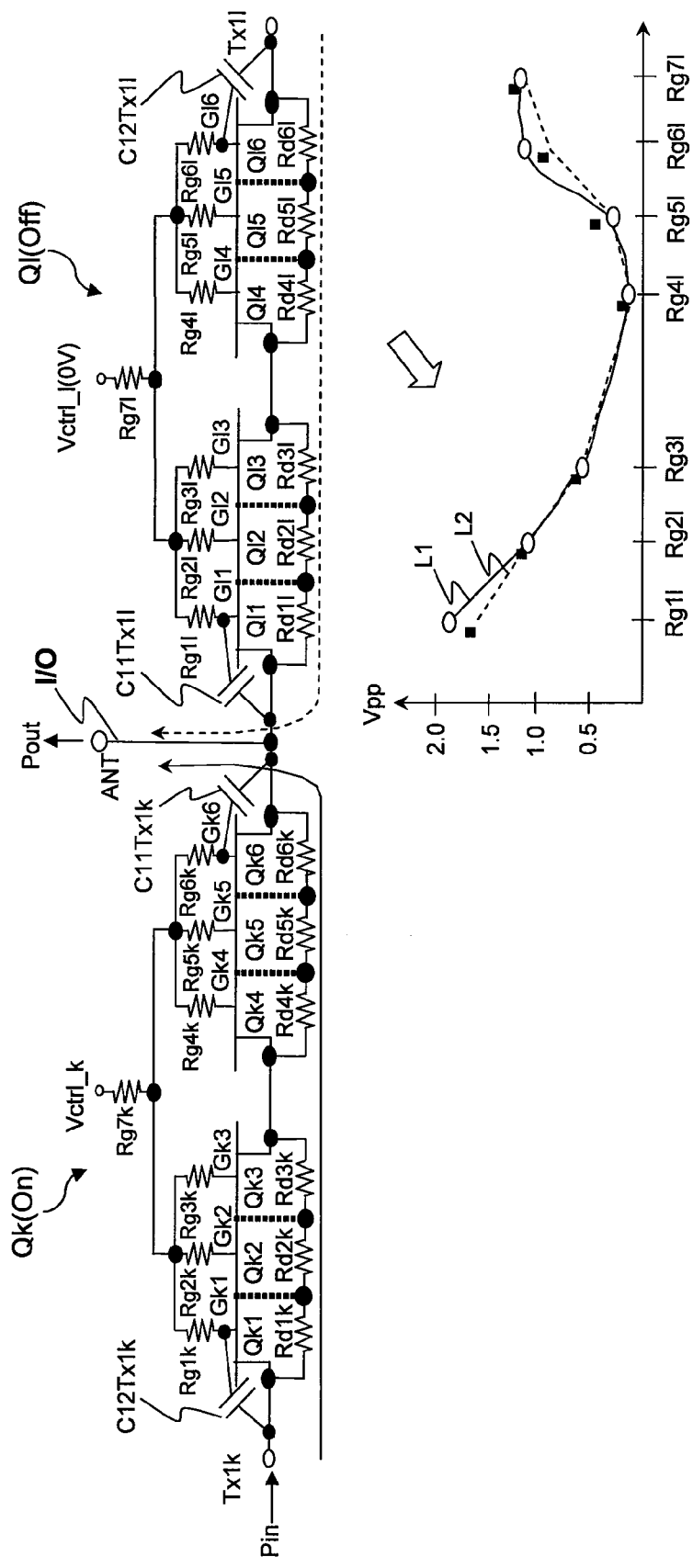
FIG. 4 is a diagram for explaining a distribution of RF leak signals applied to six gate resistances of six HEMT transistors of the switch in OFF state and an additional resistance under the influence of an RF signal from the switch of ON state of the high-frequency switches shown in FIG. 2.

Also, in the one high-frequency switch Qm of the antenna switch MMIC (ANT_SW) shown in FIG. 5, as in FIG. 4, a stationary wave with a deformed-U shape develops, an RF leak signal voltage of High level arises on the gate Gm1 of the near-other-end FET Qm1, and the gate Gm6 of the near-I/O FET Qm6, and an RF leak signal voltage of LOW level appears on the gate Gm3 of the middle-portion FET Qm3 and the gate Gm4 of the middle-portion FET Qm4. The resistance value of a gate resistance network of the gate Gm1 of the near-other-end FET Qm1 and the gate Gm6 of the near-I/O FET Qm6, which are supplied with an RF leak signal voltage of High level, is higher than the resistance value of a gate resistance network of the gate Gm3 of the middle-portion FET Qm3 and the gate Gm4 of the middle-portion FET Qm4, which are supplied with an RF leak signal voltage of Low level. On application of the RF leak signal voltage of High level of the gate resistance network with a larger resistance value, which the near-other-end FET Qm1 and near-I/O FET Qm6 belong to, a current flowing through the gate resistance network of the near-other-end FET Qm1 and near-I/O FET Qm6 is reduced per se, and the distortion of the signal current is also reduced.

The lower left portion of FIG. 5 shows a distribution of RF leak signals applied to the six gate resistances Rg1m, Rg2m, Rg3m, Rg4m, Rg5m and Rg6m of the six HEMT transistors and the additional resistance Rg7m of the switch Qm in OFF state under the influence of PCS system's RF transmit signals from the switch Qn in ON state. It is noted that as in the case of FIG. 4, the distribution of RF leak signals in the lower left portion of FIG. 5 is a result of simulation by a computer, and the RF power of the RF signals Pin is 20 dBm, the frequency is 1880 MHz within a frequency band of PCS1900. The maximum power of the RF transmit signals of PCS1900 is about 33 dBm, and therefore it can be said that the RF signal Pin of 20 dBm has a transmit power higher than the medium level. In the lower left portion of FIG. 5, voltages Vpp of the resistances Rg1m, Rg2m, Rg3m, Rg4m, Rg5m, Rg6m and Rg7m represent peak-to-peak RF signal voltages. The characteristic curve L3 of the distribution of RF leak signals to the six gate resistances of the six HEMT transistors and the additional resistance of the switch Qm in OFF state shown in the lower left portion of FIG. 5 shows a characteristic when the additional capacitances C11Tx1m and C12Tx1m of 0.8 pF are connected, and the characteristic curve L4 shows a characteristic when the additional capacitances C11Tx1m and C12Tx1m of 0.8 pF are not connected. As to any of the characteristic curves L3 and L4 of the lower left portion of FIG. 5, RF leak signals applied to the six gate resistances Rg1m, Rg2m, Rg3m, Rg4m, Rg5m and Rg6m are uniformed in level substantially.

The source's additional capacitance C12Tx1m of 0.8 pF is connected between the other end Txm and the gate Gm1 of near-other-end FET Qm1. Further, the drain's additional capacitance C11Tx1m of 0.8 pF is connected between the common input/output terminal I/O and the gate Gm6 of the near-I/O FET Qm6. Thus, it becomes possible to suppress the phenomenon that positive and negative directions' voltage fluctuations of an RF transmit signal from the other high-frequency switch Qn in ON state turn on the near-I/O FET Qm6 and near-other-end FET Qm1 of the one high-frequency switch Qm in case that the control voltage Vctrl_m and control voltage Vctrl_n are made 0 volt and 4.5 volts respectively, thereby bringing the one high-frequency switch Qm and other high-frequency switch Qn to OFF and ON states respectively.

In the other high-frequency switch Qn, the gate resistance Rg6n of 10 kΩ is connected between the gate Gn6 of the near-other-end FET Qn6, which is near to the other end Txn, and the gate Gn5 of the second near-other-end FET Qn5. The gate resistance Rg5n of 10 kΩ is connected between the gate Gn5 of the second near-other-end FET Qn5 and the gate Qn4 of the middle-portion FET Qn4. In the other high-frequency switch Qn, the gate resistance Rg1n of 10 kΩ is connected between the gate Gn1 of the near-I/O FET Qn1, which is near to the common input/output terminal I/O, and the gate Gn2 of the second near-I/O FET Qn2. The gate resistance Rg2n of 10 kΩ is connected between the gate Gn2 of the second near-I/O FET Qn2 and the gate Gn3 of the middle-portion FET Qn3. The gate Gn3 of the middle-portion FET Qn3 and the gate Gn4 of the middle-portion FET Qn4 are connected with one ends of the respective gate resistances Rg3n and Rg4n of 10 kΩ. The other ends of the gate resistances Rg3n and Rg4n are connected with one end of the resistance Rg7n of 20 kΩ. To the other end of the resistance Rg7n, a control voltage Vctrl_n is supplied.

The resistance Rd6n of 15 kΩ is connected between the source and drain of the near-other-end FET Qn6. The resistance Rd5n of 15 kΩ is connected between the source and drain of the second near-other-end FET Qn5. The resistance Rd4n of 15 kΩ is connected between the source and drain of the middle-portion FET Qn4. The resistance Rd3n of 15 kΩ is connected between the source and drain of the middle-portion FET Qn3. The resistance Rd2n of 15 kΩ is connected between the source and drain of the second near-I/O FET Qn2. The resistance Rd1n of 15 kΩ is connected between the source and drain of the near-I/O FET Qn1.

Therefore, between the gate Gn6 of the near-other-end FET Qn6 and the control voltage Vctrl_n, the gate resistance Rg6n of 10 kΩ, the gate resistance Rg5n of 10 kΩ, the gate resistance Rg4n of 10 kΩ and the resistance Rg7n of 20 kΩ are connected in serial. Between the gate Gn1 of the near-I/O FET Qn1 and the control voltage Vctrl_n, the gate resistance Rg1n of 10 kΩ, the gate resistance Rg2n of 10 kΩ, the gate resistance Rg3n of 10 kΩ and the resistance Rg7n of 20 kΩ are connected in series. Between the gate Gn5 of the second near-other-end FET Qn5 and the control voltage Vctrl_n, the gate resistance Rg5n of 10 kΩ, the gate resistance Rg4n of 10 kΩ and the resistance Rg7n of 20 kΩ are connected in series. Between the gate Gn2 of the second near-I/O FET Qn2 and the control voltage Vctrl_n, the gate resistance Rg2n of 10 kΩ, the gate resistance Rg3n of 10 kΩ, and the resistance Rg7n of 20 kΩ are connected in series. Between the gate Gn4 of the middle-portion FET Qn4 and the control voltage Vctrl_n, the gate resistance Rg4n of 10 kΩ and the resistance Rg7n of 20 kΩ are connected in series. Between the gate Gn3 of the middle-portion FET Qn3 and the control voltage Vctrl_n, the gate resistance Rg3n of 10 kΩ and the resistance Rg7n of 20 kΩ are connected in series. The six gate resistances Rg1n to Rg6n, and resistance Rg7n have a nonlinear voltage-current characteristic as shown by the above Expression 1.

Also, in the other high-frequency switch Qn of the antenna switch MMIC (ANT_SW) shown in FIG. 5, as in FIG. 4, a stationary wave with a deformed-U shape develops, an RF leak signal voltage of High level arises on the gate Gn6 of the near-other-end FET Qn6 and the gate Gn1 of the near-I/O FET Qn1, and an RF leak signal voltage of LOW level appears on the gate Gn4 of the middle-portion FET Qn4 and the gate Gn3 of the middle-portion FET Qn3. The resistance value of a gate resistance network of the gate Gn6 of the near-other-end FET Qn6 and the gate Gn1 of the near-I/O FET Qn1, which are supplied with an RF leak signal voltage of High level, is higher than the resistance value of a gate resistance network of the gate Gn4 of the middle-portion FET Qn4 and the gate Gn3 of the middle-portion FET Qn3, which are supplied with an RF leak signal voltage of Low level. On application of the RF leak signal voltage of High level of the gate resistance network with a larger resistance value, which near-other-end FET Qn6 and near-I/O FET Qn1 belong to, a current flowing through the gate resistance network of the near-other-end FET Qn6 and near-I/O FET Qn1 is reduced per se, and the distortion of the signal current is also reduced.

The lower right portion of FIG. 5 shows a distribution of RF leak signals applied to the six gate resistances Rg1n, Rg2n, Rg3n, Rg4n, Rg5n and Rg6n of the six HEMT transistors and the additional resistance Rg7n of the switch Qn in OFF state under the influence of WCDMA system's RF transmit signals Pin from the switch Qm in ON state. In the lower right portion of FIG. 5, voltages Vpp of the resistances Rg1n, Rg2n, Rg3n, Rg4n, Rg5n, Rg6n and Rg7n represent peak-to-peak RF signal voltages. The characteristic curve L5 of the distribution of RF leak signals to the six gate resistances of the six HEMT transistors and the additional resistance of the switch Qn in OFF state shown in the lower right portion of FIG. 5 shows a characteristic when the additional capacitances C11Tx1n and C12Tx1n of 0.8 pF are connected, and the characteristic curve L6 shows a characteristic when the additional capacitances C11Tx1n and C12Tx1n of 0.8 pF are not connected. As to any of the characteristic curves L5 and L6 of the lower right portion of FIG. 5, RF leak signals applied to the six gate resistances Rg1n, Rg2n, Rg3n, Rg4n, Rg5n and Rg6n are uniformed in level substantially.

Figure 7:
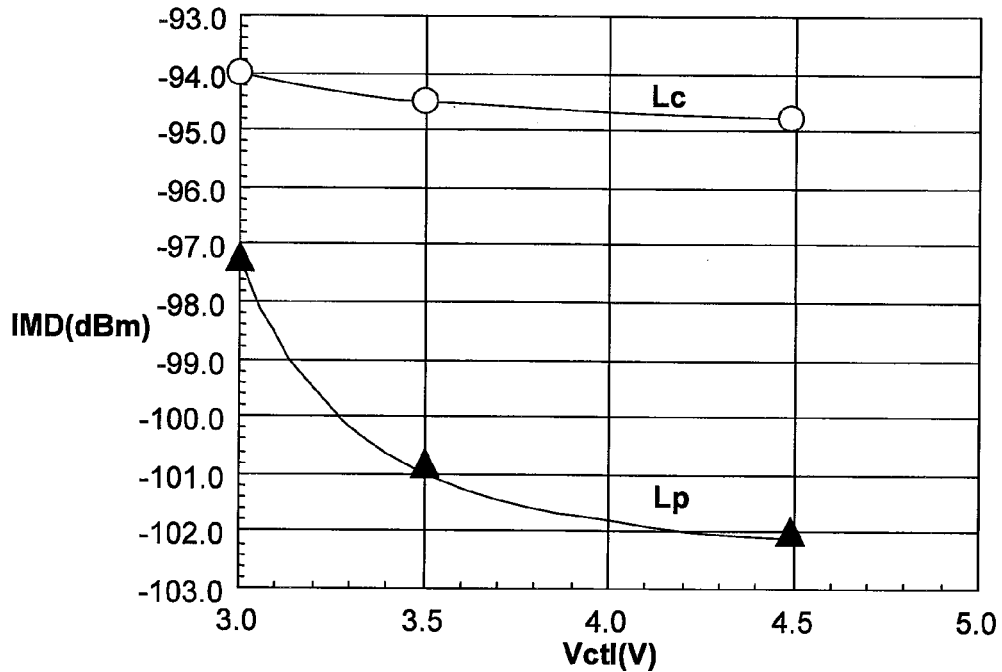
FIG. 7 is a diagram showing the intermodulation distortion in a switch Ql in OFF state, which is caused by increasing an ON-OFF control voltage for turning on a switch Qk from 3 to 4.5 volts in the high-frequency switch shown in FIG. 4, and it also shows the intermodulation distortion in an other switch Qn controlled to OFF state by a control voltage of 0 volt, in case of increasing, from 3 to 4.5 volts, a control voltage for turning on one switch Qm to pass an RF transmit signal of WCDMA system in the high-frequency switch shown in FIG. 5.

The characteristic curve Lp of FIG. 7 shows the intermodulation distortion of the other switch Qn controlled to be in OFF state by the control voltage Vctrl_n of 0 volt in case that the control voltage Vctrl_m for turning on the one switch Qm for transmitting WCDMA system's RF transmit signal is increased from 3 to 4.5 volts in the high-frequency switch shown in FIG. 5. The other switch Qn is a switch to pass e.g. an RF transmit signal of PCS system, which is different from an RF transmit signal of WCDMA system, and it may be a switch to pass GSM850, GSM900 and DCS1800 RF transmit signals. By increasing the control voltage Vctrl_m for turning on the one switch Qm to pass an RF transmit signal of WCDMA system from 3.0 to 4.5 volts, the intermodulation distortion in the other switch Qn for another system to pass an RF transmit signal was able to be reduced from −97 to −102 dBm, and −100 dBm, a target value of the intermodulation distortion which was set at the beginning of the development, was able to be achieved.

Beside, as in FIG. 5, the source's additional capacitance C12Tx1n of 0.8 pF is connected between the other end Txn and the gate Gn6 of the near-other-end FET Qn6, and the drain's additional capacitance C11Tx1n of 0.8 pF is connected between the common input/output terminal I/O and the gate Gn1 of the near-I/O FET Qn1. Consequently, the control voltage Vctrl_m, and control voltage Vctrl_n are made 4.5 volts and 0 volt, respectively. It becomes possible to suppress the phenomenon that positive and negative directions' voltage fluctuations of an RF transmit signal of WCDMA system from the one high-frequency switch Qm in ON state turn on the near-other-end FET Qn6 and near-I/O FET Qn1 of the other high-frequency switch Qn in case that the one high-frequency switch Qm and other high-frequency switch Qn are brought to OFF and ON states respectively.

<<Specific Configuration of the High-Frequency Switches of the Antenna Switch>>

Figure 6:
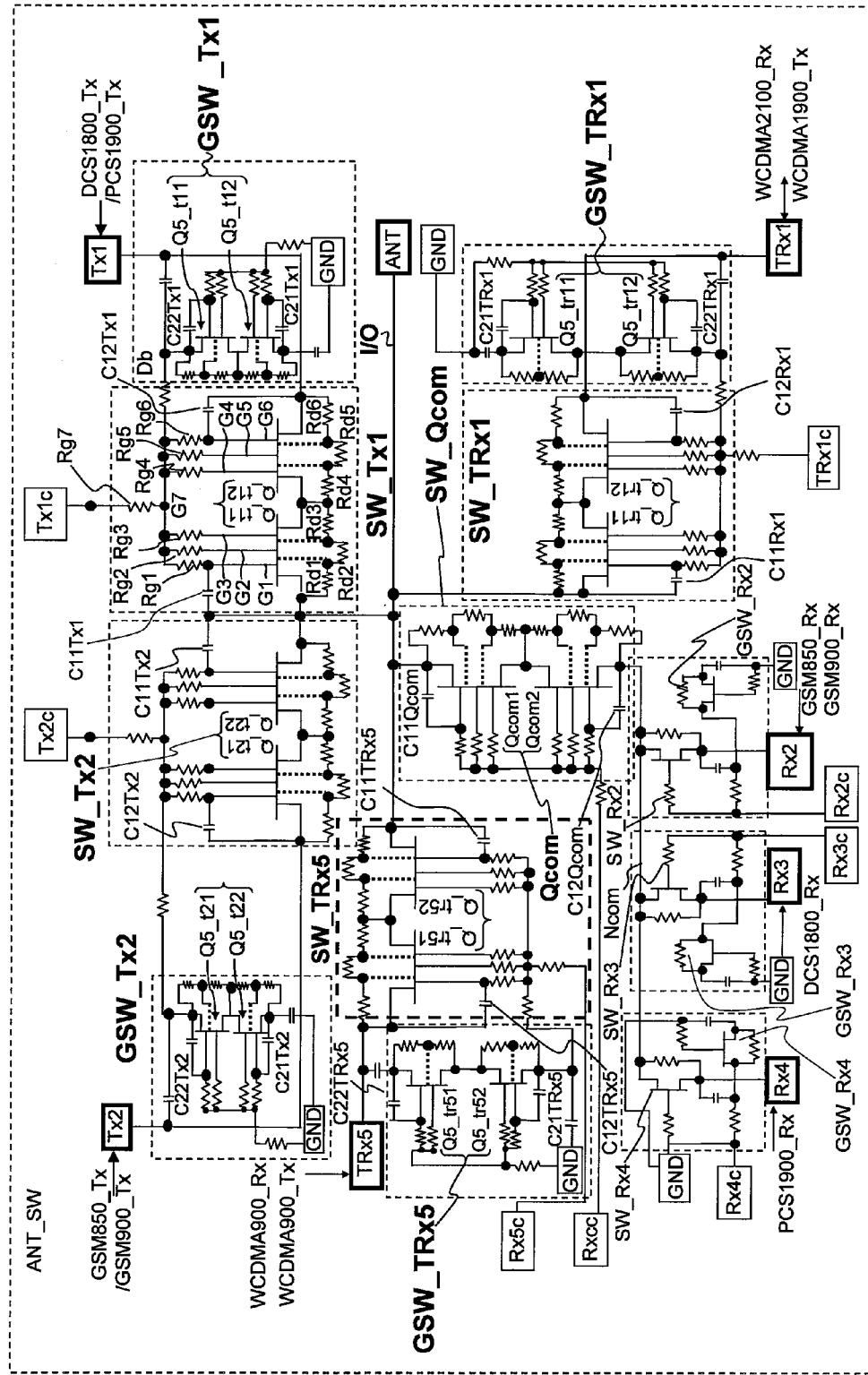
FIG. 6 is a block diagram showing a specific configuration of the high-frequency switches of the antenna switch MMIC according to the embodiment of the invention shown in FIG. 1.

FIG. 6 is a block diagram showing a specific configuration of the high-frequency switches of the antenna switch MMIC (ANT_SW) according to the embodiment of the invention shown in FIG. 1.

The chip of the antenna switch MMIC (ANT_SW) according to the embodiment of the invention shown in FIG. 1 includes a plurality of high-frequency switches as shown in FIG. 6. In FIG. 6, the common input/output terminal I/O of the antenna switch MMIC (ANT_SW) is connected with a transmit/receive antenna ANT.

Between the signal terminal Tx1 supplied with a DCS1800 RF transmit signal DCS1800 (1710-1780 MHz) and PCS1900 RF transmit signal PCS1900 Tx (1850-1910 MHz), and the common input/output terminal I/O, a high-frequency switch SW_Tx1 controlled in on and off by a control signal on the control terminal Tx1c is connected. HEMT transistors Q_t11 and Q_t12 of the high-frequency switch SW_Tx1 are controlled to ON by a control signal of 4.5 volts supplied to the control terminal Tx1c, and a DCS1800 RF transmit signal DCS1800 or GSM900 RF transmit signal PCS1900_Tx on the signal terminal Tx1 is passed to the common input/output terminal I/O. In case that HEMT transistors Q_t11 and Q_t12 of the high-frequency switch SW_Tx2 are controlled to OFF by a control signal of 0 volt on the control terminal Tx1c, HEMT transistors Q5_t11 and Q5_t12 of the grounded switch GSW_Tx1 of a depletion mode with gates connected to Ground are controlled to ON, whereby the isolation of the signal terminal Tx1 is enhanced. As to the high-frequency switch SW_Tx1, of three gate resistances of the HEMT transistor Q_t11, the near-I/O gate resistance Rg1, which is near to the input/output terminal I/O, is set to 30 kΩ. The second near-I/O gate resistance Rg2, which is second near to the input/output terminal I/O, is set to 20 kΩ, and the middle-portion gate resistance Rg3 is set to 10 kΩ. Of three gate resistances of the HEMT transistor Q_t12, the near-other-end gate resistance Rg6, which is near to the other end Tx1, is set to 30 kΩ, the second near-other-end gate resistance Rg5, which is second near to the other end Tx1, is set to 20 kΩ, and the middle-portion gate resistance Rg4 is set to 10 kΩ. Thus, the high-frequency switch SW_Tx1 in OFF state can reduce the intermodulation distortion critical for WCDMA system.

Between the signal terminal Tx2 supplied with a GSM850 RF transmit signal GSM850_Tx (824-849 MHz) and GSM900 RF transmit signal GSM900_Tx (880-915 MHz), and the common input/output terminal I/O, a high-frequency switch SW_Tx2 controlled in on and off by a control signal on the control terminal Tx2c is connected. HEMT transistors Q_t21 and Q_t22 of the high-frequency switch SW_Tx2 are controlled to ON by a control signal of 4.5 volts supplied to the control terminal Tx2c, and a GSM850 RF transmit signal GSM850_Tx or GSM900 RF transmit signal GSM900_Tx on the signal terminal Tx2 is passed to the common input/output terminal I/O. In case that HEMT transistors Q_t21 and Q_t22 of the high-frequency switch SW_Tx2 are controlled to OFF by a control signal of 0 volt on the control terminal Tx2c, HEMT transistors Q5_t21 and Q5_t22 of the grounded switch GSW_Tx2 of a depletion mode with gates connected to Ground are controlled to ON, whereby the isolation of the signal terminal Tx2 is enhanced. As to the high-frequency switch SW_Tx2, of three gate resistances of the HEMT transistor Q_t22, the near-I/O gate resistance, which is near to the input/output terminal I/O, is set to 30 kΩ. The second near-I/O gate resistance, which is second near to the input/output terminal I/O, is set to 20 kΩ, and the middle-portion gate resistance is set to 10 kΩ. Of three gate resistances of the HEMT transistor Q_t21, the near-other-end gate resistance, which is near to the other end Tx2, is set to 30 kΩ, the second near-other-end gate resistance, which is second near to the other end Tx2, is set to 20 kΩ, and the middle-portion gate resistance is set to 10 kΩ. Thus, the high-frequency switch SW_Tx2 in OFF state can reduce the intermodulation distortion critical for WCDMA system and the harmonic distortion critical for GSM system.

Between the signal terminal TRx5 supplied with an RF transmit signal WCDMA900_Tx and RF receive signal WCDMA900_Rx of WCDMA900 RF, and the common input/output terminal I/O, a high-frequency switch SW_TRx5 controlled in on and off by a control signal on the control terminal Rx5c is connected. HEMT transistors Q_tr51 and Q_tr52 of the high-frequency switch SW_TRx5 are controlled to ON by a control signal of 4.5 volts supplied to the control terminal Rx5c, and a WCDMA900 RF transmit signal WCDMA900_Tx on the signal terminal TRx1 is passed to the common input/output terminal I/O. A WCDMA900 RF receive signal WCDMA900_Rx received through the antenna is passed to the transmit/receive signal terminal TRx5 from the common input/output terminal I/O. In case that HEMT transistors Q_tr51 and Q_tr52 of the high-frequency switch SW_TRx5 are controlled to OFF by a control signal of 0 volt on the control terminal Rx5c, HEMT transistors Q5_tr51 and Q5_tr52 of the grounded switch GSW_TRx5 of a depletion mode with gates connected to Ground are controlled to ON, whereby the isolation of the signal terminal TRx5 is enhanced.

Between the signal terminal TRx1 supplied with a WCDMA1900 RF transmit signal WCDMA1900_Tx (1920-1980 MHz) and WCDMA2100 RF receive signal WCDMA2100_Rx (2110-2170 MHz), and the common input/output terminal I/O, a high-frequency switch SW_TRx1 controlled in on and off by a control signal on the control terminal TRx1c is connected. HEMT transistors Q_tr11 and Q_tr12 of the high-frequency switch SW_TRx1 are controlled to ON by a control signal of 4.5 volts supplied to the control terminal TRx1c, and a WCDMA1900 RF transmit signal WCDMA1900_Tx on the signal terminal TRx1 is passed to the common input/output terminal I/O. In addition, a WCDMA2100 RF receive signal WCDMA2100_Rx received through the antenna is passed to the transmit/receive signal terminal TRx1 from the common input/output terminal I/O. In case that HEMT transistors Q_tr11 and Q_tr12 of the high-frequency switch SW_TRx1 are controlled to OFF by a control signal of 0 volt on the control terminal TRx1c, HEMT transistors Q5_tr11 and Q5_tr12 of the grounded switch GSW_TRx1 of a depletion mode with gates connected to Ground are controlled to ON, whereby the isolation of the signal terminal TRx1 is enhanced.

Between the signal terminal Rx2 supplied with a GSM850 RF receive signal GSM850_Rx (869-894 MHz) and GSM900 RF receive signal GSM900_Rx (925-960 MHz), and the common input/output terminal I/O, a high-frequency switch SW_Rx2 controlled in on and off by a control signal on the control terminal Rx2c is connected. HEMT transistor of the high-frequency switch SW_Rx2 is controlled to ON by a control signal of 4.5 volts supplied to the control terminal Rx2c, and a GSM850 RF receive signal or GSM900 RF receive signal on the signal terminal Rx2 is passed to the common input/output terminal I/O. In case that the HEMT transistor of the high-frequency switch SW_Rx2 is controlled to OFF by a control signal of 0 volt on the control terminal Rx2c, HEMT transistor of the grounded switch GSW_Rx2 of a depletion mode with the gate connected to Ground is controlled to ON, whereby the isolation of the signal terminal Rx2 is enhanced.

Between the signal terminal Rx3 supplied with a DCS1800 RF receive signal DCS1800_Rx (1805-1880 MHz), and the common input/output terminal I/O, a high-frequency switch SW_Rx3 controlled in on and off by a control signal on the control terminal Rx3c is connected. HEMT transistor of the high-frequency switch SW_Rx3 is controlled to ON by a control signal of 4.5 volts supplied to the control terminal Rx3c, and a DCS1800 RF receive signal DCS1800_Rx on the signal terminal Rx3 is passed to the common input/output terminal I/O. In case that HEMT transistor of the high-frequency switch SW_Rx3 is controlled to OFF by a control signal of 0 volt on the control terminal Rx3c, HEMT transistor of the grounded switch GSW_Rx3 of a depletion mode with the gate connected to Ground is controlled to ON, whereby the isolation of the signal terminal Rx3 is enhanced.

Between the signal terminal Rx4 supplied with a PCS1900 RF receive signal PCS1900_Rx (1930-1990 MHz), and the common input/output terminal I/O, a high-frequency switch SW_Rx4 controlled in on and off by a control signal on the control terminal Rx4c is connected. HEMT transistor of the high-frequency switch SW_Rx4 is controlled to ON by a control signal of 4.5 volts supplied to the control terminal Rx4c, and a PCS1900 RF receive signal PCS1900_Rx on the signal terminal Rx4 is passed to the common input/output terminal I/O. In case that HEMT transistor of the high-frequency switch SW_Rx4 is controlled to OFF by a control signal of 0 volt on the control terminal Rx4c, HEMT transistor of the grounded switch GSW_Rx4 of a depletion mode with the gate connected to Ground is controlled to ON, whereby the isolation of the signal terminal Rx4 is enhanced.

A common receive high-frequency switch SW_Qcom is connected with the high-frequency switch SW_Rx2 for a GSM850 RF receive signal GSM850_Rx and GSM900 RF receive signal GSM900_Rx, the high-frequency switch SW_Rx3 for a DCS1800 RF receive signal DCS1800_Rx, and the high-frequency switch SW_Rx4 for a PCS1900 RF receive signal PCS1900_Rx. HEMT transistors of the common receive high-frequency switch SW_Qcom are controlled to ON by a control signal of 4.5 volts supplied to the control terminal Rxcc, and one of four RF receive signals is passed to the common input/output terminal I/O. As to the common receive high-frequency switch SW_Qcom, of three gate resistances of the HEMT transistor Q_com1, the near-I/O gate resistance, which is near to the input/output terminal I/O, is set to 30 kΩ. The second near-I/O gate resistance, which is second near to the input/output terminal I/O, is set to 20 kΩ, and the middle-portion gate resistance is set to 10 kΩ. With three gate resistances of the HEMT transistor Q_com2, the near-other-end gate resistance, which is near to the high-frequency switches SW_Rx2, SW_Rx3 and SW_Rx4, is set to 30 kΩ, the second near-other-end gate resistance, which is second near to the other end Tx2, is set to 20 kΩ, and the middle-portion gate resistance is set to 10 kΩ. Thus, the common receive high-frequency switch SW_Qcom in OFF state can reduce the intermodulation distortion critical for WCDMA system, and the harmonic distortion critical for GSM system.

Figure 8:
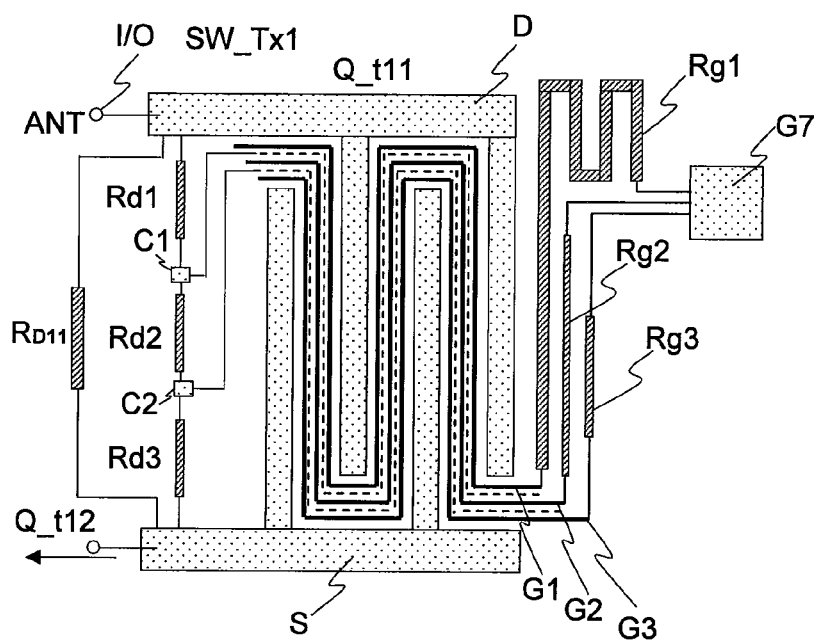
FIG. 8 is a plane view mainly showing a multi-gate structure HEMT transistor and gate resistances of a high-frequency switch for a DCS1800 RF transmit signal and PCS1900 RF transmit signal, which is one high-frequency switch of the antenna switch MMIC according to the embodiment of the invention shown in FIG. 6.

FIG. 8 is a plane view mainly showing the multi-gate structure HEMT transistor Q_t11 and gate resistances Rg1, Rg2 and Rg3 of the high-frequency switch SW_Tx1 for a DCS1800 RF transmit signal DCS1800_Tx and PCS1900 RF transmit signal PCS1900_Tx, which is one high-frequency switch of the antenna switch MMIC (ANT_SW) according to the embodiment of the invention shown in FIG. 6. The drain electrode D and source electrode S of the multi-gate structure HEMT transistor Q_t11 are connected with the common input/output terminal I/O, and the drain electrode of the other multi-gate structure HEMT transistor Q_t12 of the high-frequency switch SW_Tx1, respectively. The gate G1 of the multi-gate structure HEMT transistor Q_t11 is connected with the gate resistance Rg1 of 30 kΩ, the gate G2 is connected with the gate resistance Rg2 of 20 kΩ, and the gate G3 is connected with the gate resistance Rg3 of 10 kΩ. The near-I/O gate resistance Rg1, which is near to the common input/output terminal I/O, and the second near-I/O gate resistance Rg2 are higher in resistance value than the middle-portion gate resistance Rg3, and therefore the high-frequency switch SW_Tx1 in OFF state can reduce the intermodulation distortion critical for WCDMA system. The inter-gate region between the gate G1 and gate G2 of the multi-gate structure HEMT transistor Q_t11 is connected to the drain electrode D of the HEMT transistor Q_t11 through the contact electrode C1 and potential-stabilizing resistance Rd1. The inter-gate region between the gate G2 and gate G3 of the HEMT transistor Q_t11 is connected to the contact electrode C1 through the contact electrode C2 and potential-stabilizing resistance Rd2, and also connected to the source electrode S of the HEMT transistor Q_t11 through the contact electrode C2 and potential-stabilizing resistance Rd3. Further, between the drain electrode D and source electrode S of the HEMT transistor Q_t11 is connected a resistance $R_{D11}$ for equalizing the drain voltage and source voltage with each other in case of the HEMT transistor Q_t11 in OFF state. Now, it is noted that the resistances Rg1, Rg2, Rg3, Rd1, Rd2, Rd3 and $R_{D11}$ are mesa resistors of compound semiconductor formed by mesa-etching the compound semiconductor.

Also, in FIG. 8, Rg1, Rg2 and Rg3 may be formed by a semiconductor layer, which has smaller in the resistivity per unit area (sheet resistance). Usually, the better the linearity of a semiconductor layer is, the smaller the sheet resistance is. Hence, a semiconductor layer with a small sheet resistance is used for the near-I/O gate resistance, which is near to the input/output terminal I/O, and semiconductor layers larger in sheet resistance are used for the other gate resistances. Thus, the whole distortion tendency can be improved while minimizing the area of gate resistances occupying the inside of the chip.

Otherwise, a metal layer may be used for the gate resistance Rg1. Usually, a metal layer is smaller in sheet resistance, but better in linearity in comparison to a semiconductor layer. On this account, a metal layer is used for the near-I/O gate resistance, which is near to the input/output terminal I/O, and semiconductor layers are used for the other gate resistances, whereby the whole distortion tendency can be improved while minimizing the area of gate resistances occupying the inside of the chip.

Also, the other HEMT transistor Q_t12 of a multi-gate structure, and the gate resistances Rg4, Rg5 and Rg6 of the high-frequency switch SW_Tx1 are formed in the same way as the HEMT transistor Q_t11 and gate resistances Rg1, Rg2 and Rg3 shown in FIG. 8. Further, HEMT transistors Q5_t11 and Q5_t12 of the grounded switch GSW_Tx1, HEMT transistors Q_t21 and Q_t22 of the high-frequency switch SW_Tx2, HEMT transistors Q5_t21 and Q5_t22 of the grounded switch GSW_Tx2, HEMT transistors Q_t51 and Q_t52 of the high-frequency switch SW_TRx5, HEMT transistors Q5_t51 and Q5_t52 of the grounded switch GSW_TRx5, HEMT transistors Q_tr11 and Q_tr12 of the high-frequency switch SW_TRx1, HEMT transistors Q5_tr11 and Q5_tr12 of the grounded switch GSW_TRx1, HEMT transistors Qcom1 and Qcom2 of the common receive high-frequency switch SW_Qcom, and their gate resistances are formed in the same way as the HEMT transistor Q_t11, and gate resistances Rg1, Rg2 and Rg3 shown in FIG. 8. Thus, the antenna switch MMIC according to the embodiment of the invention as shown in FIG. 8 can reduce the intermodulation distortion critical for WCDMA system, and the harmonic distortion critical for GSM system.

<<Other Embodiments>>

While the invention which the inventor made has been described above based on the embodiment specifically, it is not so limited. It is needless to say that various changes and modifications may be made without departing from the scope of the invention.

For example, as to the high-frequency switches of the antenna switch MMIC (ANT_SW) of FIG. 5, HEMT transistors of the one high-frequency switch Qm and other high-frequency switch Qn can be replaced with N-channel insulated gate MOS transistors of a depletion type. Incidentally, in this case, a bias voltage of 3.8 volts generated by the controller integrated circuit CNT_IC of FIG. 1 is supplied to the common input/output terminal I/O. In case that a single source voltage of 3 volts is supplied to the controller integrated circuit CNT_IC of FIG. 1 from the outside, the controller integrated circuit CNT_IC has therein a booster circuit, such as a charge-pump circuit, for boosting the single source voltage of 3 volts to the bias voltage of 3.8 volts.

Also, as to the high-frequency switch of FIG. 5, in any of the case of the high-frequency switch including HEMT transistors, and the case of the high-frequency switch including insulated gate MOS transistors, a booster circuit, such as a charge-pump circuit, for boosting the single source voltage of 3 volts to the 4.5-volt voltage of High level at the ON-OFF control input terminals Vctrl_m and Vctrl_n is included inside the controller integrated circuit CNT_IC.

Further, in FIG. 8, as to the high-frequency switch of the antenna switch MMIC according to the embodiment of the invention shown in FIG. 6, the mesa resistor of compound semiconductor of 30 kΩ which makes the near-I/O gate resistance Rg1 near to the common input/output terminal I/O may be replaced with a metallic thin-film resistor, which is made of a high-melting-point metal, such as tungsten and molybdenum, and superior in the linearity of a voltage-current characteristic. Likewise, the mesa resistor of compound semiconductor of 20 kΩ which forms the second near-I/O gate resistance Rg2 may be replaced with a metallic thin-film resistor superior in the linearity of a voltage-current characteristic.

Figure 9:
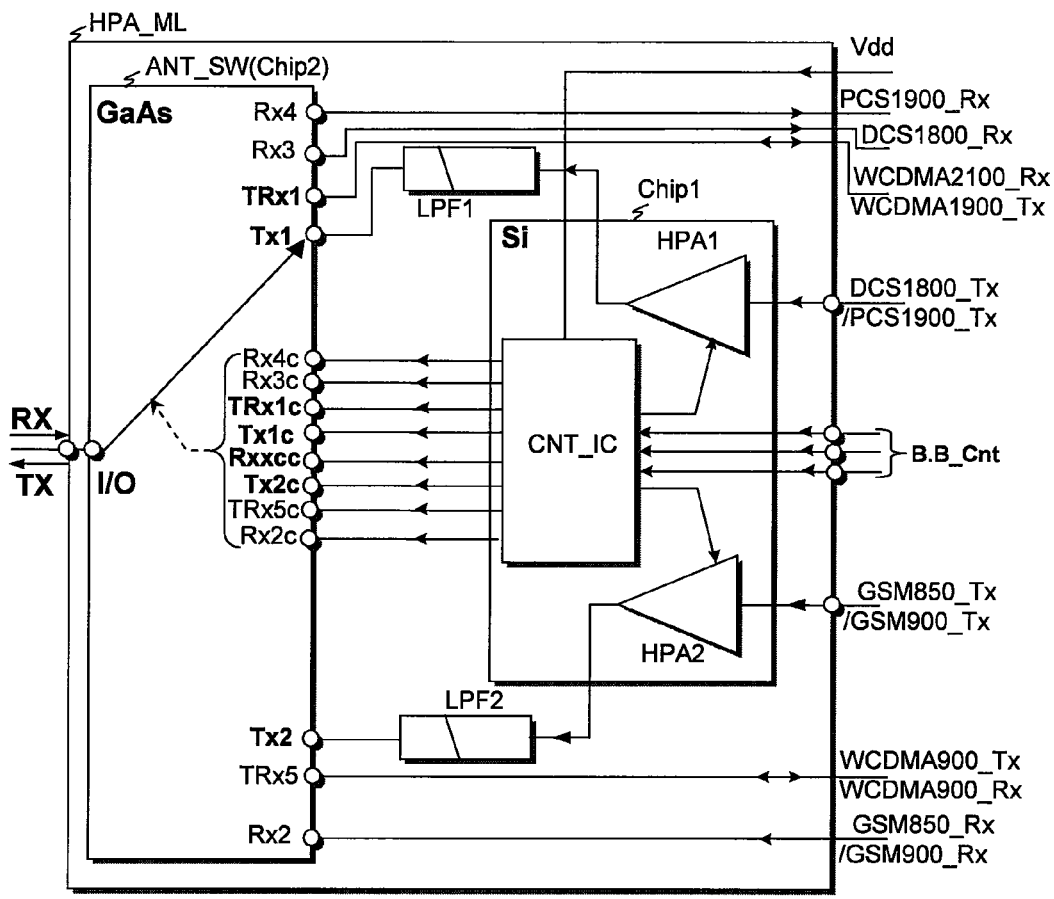
FIG. 9 is a block diagram showing another configuration of a high-output-power-amplifier module, which includes the antenna switch MMIC, high-output power amplifiers and low-pass filters.

FIG. 9 is a block diagram showing another configuration of the high-output-power-amplifier module HPA_ML, which includes the antenna switch MMIC, high-output power amplifiers HPA1 and HPA2, and low-pass filters LPF1 and LPF2.

In the drawing, the antenna switch MMIC (ANT_SW) is composed of a GaAs compound semiconductor IC in a chip chip2, and takes the configuration of the high-frequency switch circuit as shown in FIG. 6. In the antenna switch MMIC, a signal path is established between the common input/output terminal I/O and one of transmit terminals Tx1 and Tx2, receive terminals Rx2, Rx3 and Rx4, transmit/receive terminals TRx1 and TRx5 by means of control signals Rx4c, Rx3c, ..., Rx2c, whereby the receive operation RX or transmit operation TX is performed. The controller CNT_IC which produces control signals Rx4c, Rx3c, ..., Rx2c for controlling the antenna switch MMIC in response to a control signal B.B_Cnt of 3 bits from the baseband LSI is formed in the chip chip1 of the silicon semiconductor IC. As to the controller CNT_IC of the silicon semiconductor IC chip chip1, the controller CNT_IC includes a booster circuit which is supplied with a single source voltage Vdd of 3 volts thereby to produce high-level voltages of 4.5 volts of the control signals Rx4c, Rx3c, ..., Rx2c.

Power-amplifying transistors of the high-output power amplifiers HPA1 and HPA2 of the silicon semiconductor IC chip chip1 are power MOSFETs having a LD (Lateral Diffused) structure, which can be formed by the same process as that used for CMOS devices of the controller CNT_IC. For the power-amplifying transistors in the final states of the high-output power amplifiers HPA1 and HPA2, HBTs (Hetero Bipolar transistors) of GaAs, InGaAs, SiGe or the like superior in power-addition efficiency may be used.

The silicon semiconductor IC chip chip1, and GaAs compound semiconductor IC chip chip2 can be mounted on a multilayer-wiring insulating board or tabs of a plurality of external connection leads for the high-output-power-amplifier module HPA_ML. As capacitors of the low-pass filters LPF1 and LPF2, chip capacitors may be used. Inductors of the low-pass filters LPF1 and LPF2 can be formed from multi-layered wires inside a multilayer-wiring insulating board, or formed with parts of the plurality of external connection leads.

In the above embodiment, the baseband signal processing LSI and application processor are formed in separate semiconductor chips respectively. However, according to another embodiment, the application processor can be integrated into the semiconductor chip of the baseband signal processing LSI, making an integrated one-chip.

<<Representative Embodiments>>

Of the invention herein disclosed, other representative embodiments will be outlined. In the description of the outlines of the representative embodiments, the reference numerals, characters and signs for reference to the drawings, which are accompanied with paired round brackets, only exemplify what the concepts of components referred to by the numerals, characters and signs contain.

[1] A semiconductor IC according to a representative embodiment of the invention includes a DC boost circuit (100). The DC boost circuit includes a high-frequency input terminal (101), a DC control input terminal (103) and a DC output terminal (104).

A high-frequency input signal (RFin) is supplied to the high-frequency input terminal of the DC boost circuit, and a DC control voltage (Vdc) is supplied to the DC control input terminal, whereby a DC output voltage (Vout) arises from the DC output terminal.

The DC boost circuit includes a first capacitance element (106; C1), a second capacitance element (110; C2), a first diode (108; D1), a second diode (109; D2), a first resistance element (107; R1) and a second resistance element (111; R2). The high-frequency input terminal is connected with one terminal of a series of the first capacitance and resistance elements connected in series. The other terminal of the series of the first capacitance and resistance elements is connected with a cathode of the first diode and an anode of the second diode. An anode of the first diode, and one terminal of the second capacitance element are connected with the DC control input terminal. A cathode of the second diode and the other terminal of the second capacitance element are connected with one terminal of the second resistance element. The other terminal of the second resistance element is connected with the DC output terminal.

Figure 10:
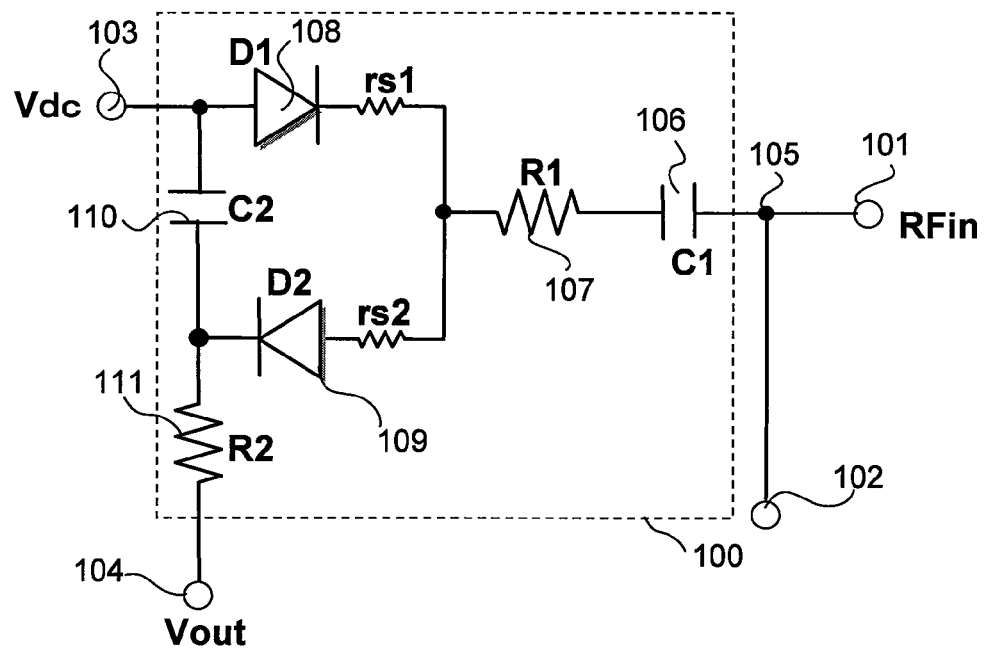
FIG. 10 is a circuit diagram showing a DC boost circuit 100 incorporated in a semiconductor IC according to an embodiment of the invention.

The first resistance element is set larger in resistance value than a first series resistance (rs1) of the first diode and a second series resistance (rs2) of the second diode in a closed loop including the first and second diodes and second capacitance element (see FIG. 10).

According to the embodiment, the first resistance element set to have a larger resistance value makes the input impedance of the DC boost circuit high. A voltage drop by the first series resistance of the first diode and a voltage drop by the second series resistance of the second diode, which result from negative and positive voltage amplitudes of the high-frequency input signal supplied to the high-frequency input terminal, are made smaller than a voltage drop by the first resistance element. A backward voltage applied to the first diode and a backward voltage applied to the second diode are made smaller. Thus, a semiconductor IC with a built-in DC boost circuit improved in life and operation reliability can be provided.

The semiconductor IC (300) according to a preferred embodiment further includes a high-frequency switch (320; Qsw) connected between a signal input terminal (306) and a signal output terminal (301). A high-frequency input signal (RFin) is supplied to the signal input terminal of the high-frequency switch, and the DC output voltage (Vout) arising from the DC output terminal of the DC boost circuit is supplied to a control input terminal of the high-frequency switch (see FIG. 12).

According to the preferred embodiment, the life and operation reliability of a semiconductor IC incorporating a high-frequency switch and a DC boost circuit can be improved.

In the semiconductor IC according to a more preferred embodiment, the high-frequency switch (320) includes a field effect transistor (Qsw). The DC output voltage of High level is supplied to a gate of the field effect transistor serving as the control input terminal of the high-frequency switch, whereby the field effect transistor is brought into conduction, and the high-frequency input signal supplied to the signal input terminal of the high-frequency switch is passed to the signal output terminal (see FIG. 12).

Figure 12:
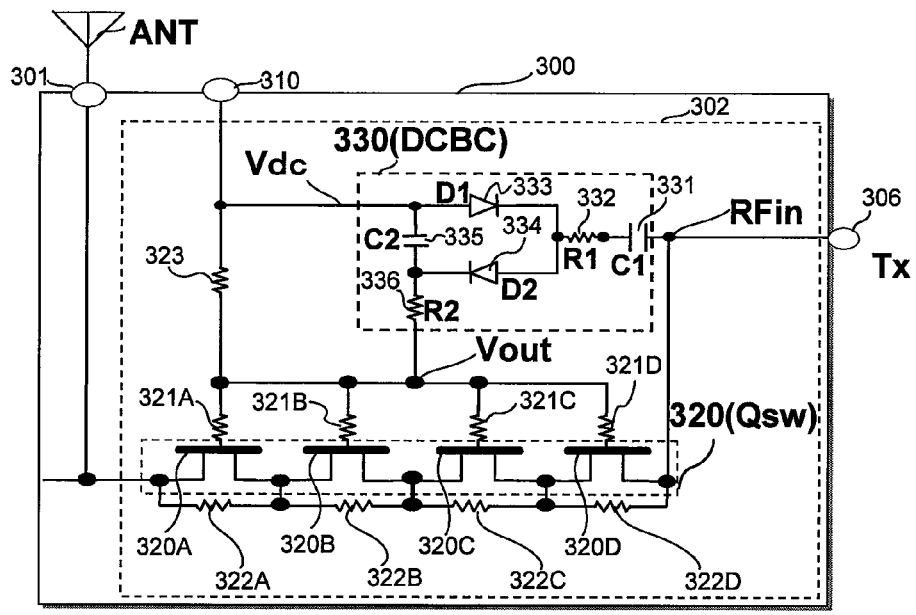
FIG. 12 is a circuit diagram showing a DC boost circuit and a high-frequency switch circuit for transmission which are incorporated in a semiconductor IC according to an embodiment of the invention.

In the semiconductor IC according to a specific embodiment, the field effect transistor serving as the high-frequency switch consists of a plurality of field effect transistors with drain-source paths thereof connected in series between the signal input terminal and signal output terminal of the high-frequency switch (see FIG. 12).

According to the specific embodiment, the voltage of each of the field effect transistors connected in serial is made smaller, and the harmonic distortion can be reduced.

In the semiconductor IC according to a more specific embodiment, the field effect transistor serving as the high-frequency switch is composed of a heterojunction HEMT formed in a compound semiconductor chip (see FIG. 12).

According to the more specific embodiment, the on-resistance of the high-frequency switch can be lowered, and the signal loss can be reduced.

[2] A semiconductor IC (300) according to an embodiment from another aspect includes an input/output terminal (301) connectable to a transmit/receive antenna (ANT), at least one receive signal output terminal (308), and at least one transmit signal input terminal (306). A high-frequency switch (304) for reception is connected between the input/output terminal and the receive signal output terminal. A transmit high-frequency switch (302) is connected between the input/output terminal and the transmit signal input terminal.

A receive control voltage is supplied to a receive control input terminal (312) of the high-frequency switch for reception.

The high-frequency switch for reception includes a field effect transistor (360) for reception. The receive control voltage of High level is supplied to a gate of the field effect transistor for reception serving as the control input terminal for reception of the high-frequency switch for reception. The field effect transistor for reception is thereby brought into conduction, and a receive high-frequency input signal (Rx1) supplied to the input/output terminal from the transmit/receive antenna is passed to the receive signal output terminal.

The high-frequency switch for transmission includes a field effect transistor (320) for transmission and a DC boost circuit (330). The DC boost circuit includes a high-frequency input terminal, a DC control input terminal and a DC output terminal. A transmit high-frequency output signal (Tx1) is supplied to the high-frequency input terminal of the DC boost circuit, and a DC control voltage is supplied to the DC control input terminal, whereby a DC output voltage arises from the DC output terminal. The transmit high-frequency output signal is supplied to a signal input terminal for transmission of the high-frequency switch for transmission. A signal output terminal for transmission of the high-frequency switch for transmission is connected with the input/output terminal (301). The DC output voltage of High level from the DC output terminal of the DC boost circuit is supplied to a gate of the field effect transistor for transmission serving as a control input terminal for transmission of the high-frequency switch for transmission. The field effect transistor for transmission is thereby brought into conduction, and the transmit high-frequency output signal supplied to the signal input terminal for transmission of the high-frequency switch for transmission is passed to the input/output terminal.

The DC boost circuit includes a high-frequency input terminal (101), a DC control input terminal (103) and a DC output terminal (104).

A high-frequency input signal (RFin) is supplied to the high-frequency input terminal of the DC boost circuit, and a DC control voltage (Vdc) is supplied to the DC control input terminal, whereby a DC output voltage (Vout) arises from the DC output terminal.

The DC boost circuit includes a first capacitance element (106; C1), a second capacitance element (110; C2), a first diode (108; D1), a second diode (109; D2), a first resistance element (107; R1) and a second resistance element (111; R2). The high-frequency input terminal is connected with one terminal of a series of the first capacitance and resistance elements connected in series. The other terminal of the series of the first capacitance and resistance elements is connected with a cathode of the first diode and an anode of the second diode. An anode of the first diode, and one terminal of the second capacitance element are connected with the DC control input terminal, and a cathode of the second diode and the other terminal of the second capacitance element are connected with one terminal of the second resistance element. The other terminal of the second resistance element is connected with the DC output terminal.

The first resistance element is set larger in resistance value than a first series resistance (rs1) of the first diode and a second series resistance (rs2) of the second diode in a closed loop including the first and second diodes and second capacitance element (see FIG. 10).

[3] A high-frequency module (RF_ML) according to another embodiment of the invention includes a power amplifier (HPA1, HPA2), and an antenna switch semiconductor IC (ANT_SW). The power amplifier amplifies a high-frequency transmit signal (RF_Tx1, RF_Tx2) produced by an RF analog signal processing semiconductor IC (RF_IC) and supplies it to an antenna (ANT). The antenna switch semiconductor IC supplies a high-frequency receive signal received through the antenna (RF_Rx1, RF_Rx2) to the high-frequency analog signal processing semiconductor IC, and supplies an output signal of the power amplifier to the antenna. The antenna switch semiconductor IC is the semiconductor IC described in [1] or the semiconductor IC described in [2] (see FIG. 17).

<<Description of the Embodiments>>

Now, the embodiments will be described further in detail. The detailed description about the best modes of carrying out the invention will be presented below with reference to the drawings. In all the drawings for explaining the best modes of carrying out the invention, members having identical functions are identified by the same reference numeral, character or sign, and the repeated description thereof is omitted.

<<DC Boost Circuit>>

FIG. 10 is a circuit diagram showing a DC boost circuit 100 incorporated in a semiconductor IC according to an embodiment of the invention.

As shown in the drawing, the DC boost circuit 100 includes capacitance elements 106 (C1) and 110 (C2), resistance elements 107(R1) and 111(R2) and diodes 108(D1) and 109 (D2). Since the resistance value of the resistance element 107 is set to a value (e.g. 10 kΩ) sufficiently higher than the antenna impedance of 50Ω, the input impedance of the DC boost circuit 100 is made a value sufficiently higher than 50Ω. Therefore, most of the high-frequency input signal' power RFin, which is input to the high-frequency signal input terminal 101, flows toward the high-frequency signal input terminal 102 connected to a switch element, and a small part of the power is allowed to flow into the DC boost circuit 100. The series resistance rs1 of the diode 108 and the series resistance rs2 of the diode 109 are both of several ohms approximately, which is sufficiently lower than the resistance value (e.g. 10 kΩ) of the resistance element 107. A voltage drop of the series resistance rs1 of the diode 108 and a voltage drop of the series resistance rs2 of the diode 109, which are produced by negative and positive voltage amplitudes of the high-frequency input signal' power RFin supplied to the high-frequency signal input terminal 101, are smaller than a voltage drop by the resistance element 107. Then, a backward voltage applied to the diode 108 and a backward voltage applied to the diode 109 are made smaller, and therefore the life and operation reliability of the DC boost circuit 100 can be increased. Incidentally, the order of connecting the capacitance element 106 and resistance element 107, which are to be connected in series, may be the one shown in FIG. 10, or may be reversed.

The operation of the DC boost circuit 100 will be described below.

First, assumed is the time when the voltage amplitude of a high-frequency signal at the connecting point 105 is negative, in which the diode 108 is forward-biased and brought into conduction, and the diode 109 is backward-biased and brought out of conduction. At this time, a current flows into the capacitance element 106 through the diode 108, one terminal of the capacitance element 106 connected with the connecting point 105 is charged to a negative voltage, and the other terminal of the capacitance element 106 connected with the diodes 108 and 109 is charged to a positive voltage. Next, assumed is the time when the voltage amplitude of a high-frequency signal at the connecting point 105 is positive, in which the diode 108 is backward-biased and brought out of conduction and the diode 109 is forward-biased and brought into conduction. At this time, a positive charge, which has been charged to the other terminal of the capacitance element 106, flows into the capacitance element 110 through the diode 109. Then, one terminal of the capacitance element 110 connected with the connecting point of the DC control-voltage-supply terminal 103 and diode 108 is charged to a negative voltage, and the other terminal of the capacitance element 110 connected with the connecting point of the diode 109 and resistance element 111 is charged to a positive voltage. The operation of charging the capacitance element 106 in response to a negative voltage amplitude of a high-frequency signal, and the operation of charging the capacitance element 110 in response to a positive voltage amplitude of the high-frequency signal are repeated, and then the capacitance element 110 is charged. The DC output voltage Vout, which depends on the sum of a DC control voltage Vdc applied to the DC control-voltage-supply terminal 103 and a charged potential difference Vb across the capacitance element 110, is output through the DC output terminal 104 of the DC boost circuit, and used for control of the antenna switch MMIC. In other words, the DC output voltage Vout larger than the DC control voltage Vdc at the DC control-voltage-supply terminal 103 by the charged potential difference Vb arises from the DC output terminal 104. In case that the DC control voltage Vdc at the DC control-voltage-supply terminal 103 is 3 volts, and the charged potential difference Vb across the capacitance element 110 is 2 volts approximately, the DC output voltage Vout arising from the DC output terminal 104 is about 5 volts.

Here is considered the magnitude of the backward voltage on the diodes 108 and 109 in case that 3 volts is applied to the DC control-voltage-supply terminal 103 of the DC boost circuit 100 incorporated in the semiconductor IC according to the embodiment of the invention shown in FIG. 10, and then the DC output voltage Vout of about 5 volts is output through the DC output terminal 104. In this case, an RF signal current of about 1 mA flows at the time when the RF input signal RFin at the high-frequency input terminal 101 takes a negative voltage amplitude. The current passes through the DC control-voltage-supply terminal 103, the diode 108 (including the series resistance rs1) and the resistance element 107 of 10 kΩ, and flows into the High-frequency input terminal 102. A voltage drop of about 1 volt is developed across the diode 108 (including the series resistance rs1). Therefore, the voltage at one terminal of the resistance element 107 connected to the common connecting point of the diodes 108 and 109 is about 2 volts, which is lower than the DC control voltage Vdc of 3 volts at the DC control-voltage-supply terminal 103 by the voltage drop of about 1 volt developed across the diode 108 (including the series resistance rs1). The voltage of the cathode of the diode 109 is kept at the DC output voltage Vout of about 5 volts at the DC output terminal 104, and a voltage of about 2 volts is applied to the anode of the diode 109. Consequently, an extremely low backward voltage of about 3 volts is impressed across the diode 109. At the time when an RF input signal RFin at the high-frequency input terminal 101 takes a positive voltage amplitude, an RF signal current of about 1 mA passes through the high-frequency input terminal 101, the capacitance element 106, the resistance element 107 of 10 kΩ, and the diode 109 (including the series resistance rs2), and then flows into the DC output terminal 104 and DC control-voltage-supply terminal 103. Across the diode 109 (including the series resistance rs2), a voltage drop of about 1 volt is developed. Therefore, the voltage at the one terminal of the resistance element 107 connected to the common connecting point of the diodes 108 and 109 is about 6 volts, which is higher than the DC output voltage Vout of about 5 volts at the DC output terminal 104 by a voltage drop of about 1 volt across the diode 109 (including the series resistance rs2). The voltage of the anode of the diode 108 is kept at 3 volts of the DC control voltage Vdc of the DC control input terminal 203, and the voltage of the one terminal of the resistance element 107 connected with the common connecting point of the diodes 108 and 109 is about 6 volts. As a result, an extremely low backward voltage of about 3 volts is applied across the diode 108. Thus, the backward voltages of diodes 108 and 109 of the DC boost circuit 100 incorporated in the semiconductor IC according to the embodiment of the invention shown in FIG. 10 can be made much lower in comparison to the DC boost circuit shown in FIG. 11. Therefore, the life and operation reliability of the DC boost circuit 100 shown in FIG. 10 can be increased remarkably.

<<High-Frequency Switch Driven by the DC Boost Circuit>>

FIG. 12 is a circuit diagram showing a DC boost circuit (DCBC) 330 and a high-frequency switch circuit 302 for transmission incorporated in a semiconductor IC 300 according to an embodiment of the invention.

As shown in the drawing, the high-frequency switch circuit 302 for transmission is connected with a high-frequency signal input terminal 306, a high-frequency signal output terminal 301 and a control input terminal 310. The DC boost circuit (DCBC) 330 incorporated in the semiconductor IC 300 of FIG. 12 is essentially the same as the DC boost circuit 100 shown in FIG. 10. Specifically, in the circuit diagram of the DC boost circuit (DCBC) 330 of FIG. 12, series resistances corresponding to the series resistance rs1 of the diode 108 of FIG. 10 and the series resistance rs2 of the diode 109 are not connected with the diodes 333 and 334.

However, the diodes 333 and 334 of FIG. 12 also include series resistances of several ohms approximately.

Therefore, as with the DC boost circuit 100 of FIG. 10, the DC boost circuit (DCBC) 330 of FIG. 12 can produce a DC output voltage Vout which is larger than a DC control voltage Vdc at the DC control input terminal 310 by the charged voltage Vb across the capacitance element 211 from the other end of the resistance element 336 (R2). In case that the DC control voltage Vdc at the DC control input terminal 310 is 3 volts, and the charged voltage Vb across the capacitance element 335 (C2) is 2 volts approximately, the DC output voltage Vout arising from the other end of the resistance element 336 (R2) is about 5 volts. The high-frequency switch (Qsw) 320 of the semiconductor IC 300 of FIG. 12 is driven by the DC output voltage Vout of High level from the DC boost circuit (DCBC) 330, and brought into conduction. An RF transmit signal Tx supplied to the high-frequency signal input terminal 306, which corresponds to the high-frequency input signal RFin, is transferred through the conducting high-frequency switch (Qsw) 320 to the signal output terminal 301 connected with the antenna ANT. The DC output voltage Vout of High level from the DC boost circuit (DCBC) 330 lowers the on-resistance Ron of the high-frequency switch (Qsw) 320, and therefore the RF signal loss transferred to the signal output terminal 301 connected with the antenna ANT can be reduced. The signal output terminal 301 connected with the antenna ANT also serves as a signal input/output terminal, and then a high-frequency switch for reception is connected with the signal output terminal 301, which is not shown in FIG. 12. In a transmit operation mode, the high-frequency switch for reception is controlled to its non-conducting state, and the high-frequency switch (Qsw) 320 for transmission is controlled to its conducting state. At the time when the high-frequency switch (Qsw) 320 is controlled to ON state, the voltage of the signal input/output terminal 301 is brought to High level by the DC output voltage Vout of High level from the DC boost circuit (DCBC) 330. At this time, a DC control voltage of Low level is applied to a DC control input terminal of a gate of the high-frequency switch for reception, which is not shown, whereby the high-frequency switch for reception is brought out of conduction. The voltage between gate and source of FET of the high-frequency switch for reception becomes a deep backward bias voltage because of the high-level voltage of the source and drain of the high-frequency switch for reception, and low-level DC control voltage on the gate. In case that the gate-source voltage of FET of the high-frequency switch for reception is a shallow backward bias voltage, the change in the value of the gate capacitance of FET of the high-frequency switch for reception driven by an RF transmit signal passed from the high-frequency switch for transmission is made larger. A large change of the value of the gate capacitance of FET of the high-frequency switch for reception can cause a large harmonic distortion in the antenna switch. In the semiconductor IC 300 shown in FIG. 12, the gate-source voltage of FET of the high-frequency switch for reception is made a deep backward bias voltage because of the DC output voltage Vout of High level from the DC boost circuit (DCBC) 330. Thus, the change of the value of the gate capacitance of FET of the high-frequency switch for reception can be made smaller, and the harmonic distortion in the antenna switch can be reduced.

In the semiconductor IC 300 shown in FIG. 12, the high-frequency switch (Qsw) 320 for transmission has a plurality of field effect transistors (FETs) 320A, 320B, 320C and 320D with their drain-source paths connected in series between the high-frequency signal input terminal 306 and signal output terminal 301. The voltage of each of the serially-connected field effect transistors (FETs) 320A, 320B, 320C and 320D is made smaller, whereby the harmonic distortion in the antenna switch can be reduced. Between the drains and sources of FETs 320A, 320B, 320C and 320D, resistance elements 322A, 322B, 322C and 322D with large resistances are connected, whereby the drain and source of each FET can be kept at substantially the same DC voltage. ON and OFF of FETs 320A, 320B, 320C and 320D are decided depending on whether the gate voltages of FETs 320A, 320B, 320C and 320D are higher or lower with respect to respective drain-source voltages of FETs which are kept at substantially the same voltage. To the gates of FETs 320A, 320B, 320C and 320D, the DC output voltage Vout from the DC boost circuit (DCBC) 330 is supplied through resistance elements 321A, 321B, 321C and 321D. Further, the DC control voltage Vdc on the DC control input terminal 310 is supplied to the gates of FETs 320A, 320B, 320C and 320D through a resistance element 323. Now, it is noted that HEMTs with a heterojunction structure having a low on-resistance are used as FETs 320A, 320B, 320C and 320D. Incidentally. HEMT is an abbreviation for "High Electron Mobility Transistor".

Figure 13:
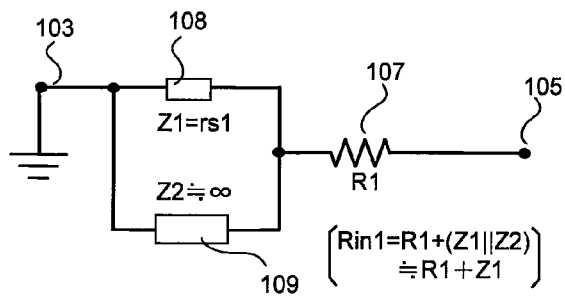
FIG. 13 is a circuit diagram showing a high-frequency equivalent circuit of the DC boost circuits for driving the high-frequency switch circuit for transmission incorporated in the semiconductor IC according to the embodiment of the invention shown in FIGS. 10 and 12.

FIG. 13 is a circuit diagram showing a high-frequency equivalent circuit of the DC boost circuits for driving the high-frequency switch circuit for transmission incorporated in the semiconductor IC according to the embodiment of the invention shown in FIGS. 10 and 12. The resistance value of the resistance element 107 is denoted by R1, and the equivalent impedances of the diodes 108 and 109 are denoted by Z1 and Z2, respectively. The equivalent impedance of one of the diodes 108 and 109 is larger than that of the other. Accordingly, if Z1<<Z2, then the input impedance Zin1 is given by:

$$Zin1 = R1 + (Z1 \| Z2) \cong R1 + Z1 \qquad \text{(Expression 3)}.$$

Figure 11:
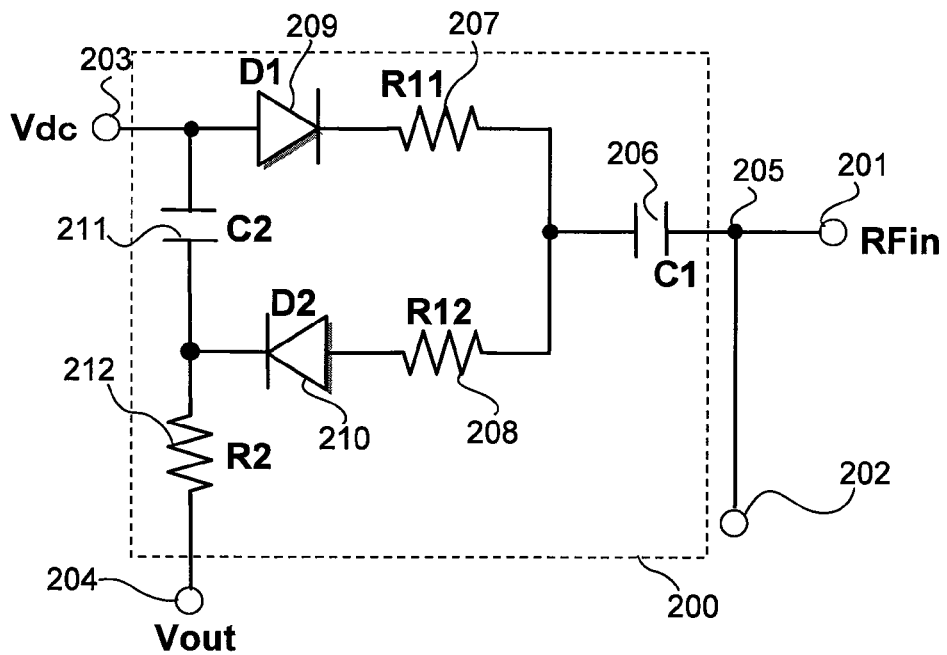
FIG. 11 is a circuit diagram showing a DC boost circuit of an RF switch which the inventors examined prior to the invention.
Figure 14:
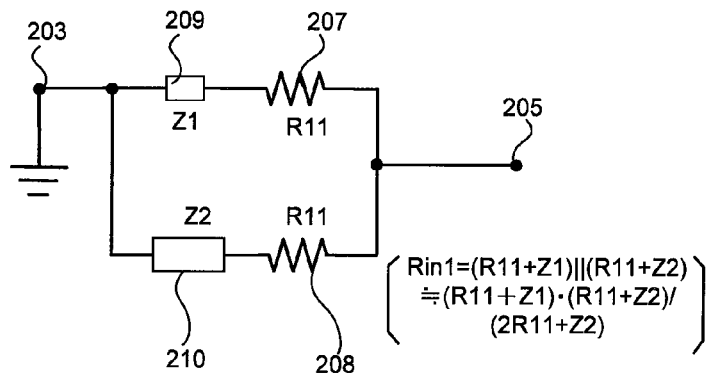
FIG. 14 is a circuit diagram showing a high-frequency equivalent circuit of the DC boost circuit shown in FIG. 11, which was examined by the inventors prior to the invention.

Likewise, FIG. 14 is a circuit diagram showing a high-frequency equivalent circuit of the DC boost circuit shown in FIG. 11, which was examined by the inventors prior to the invention. The resistance values of the resistance elements 207 and 208 are denoted by R11 identically, and the equivalent impedances of the diodes 209 and 210 are denoted by Z1 and Z2 respectively. The equivalent impedance of one of the diodes 209 and 210 is sufficiently larger than that of the other. Therefore, if Z1<<Z2, then the input impedance Zing is given by:

$$Zin2 = (R11 + Z1) \| (R11 + Z2) \qquad \text{(Expression 4)}$$
$$\cong (R11 + Z1) \times (R11 + Z2)/(2 \times R11 + Z2).$$

The level of a DC output voltage produced by a voltage boost by the DC boost circuit depends on the input power of a high-frequency input signal RFin supplied to the DC boost circuit. Specifically, the DC boost circuits shown in FIGS. 10 and 11 produce DC output voltages Vout of the same level at the time when their input impedances are equal to each other. From Expression 3 and Expression 4, to allow the DC boost circuits of FIGS. 10 and 11 to produce DC output voltage Vout of the same level, it is required that R1>R11 stands up. It has been found from a result of simulation by the inventors that DC output voltages Vout of the same level are produced at time of R1≅0.7×R11. In the voltage-raising operation by the DC boost circuit, the capacitance elements 106, 110, 206 and 211 are charged and discharged through the resistance elements 107, 207 and 208. As to a mobile phone arranged so as to perform transmission and reception in multibands of GSM850, GSM900, DCS1800, PCS1900 and the like, it is necessary to drive high-frequency switches of an antenna switch mounted thereon into/out of conduction at a high speed. For that purpose, the input impedance of the DC boost circuit needs to be lowered to a certain extent. As to the DC boost circuit according to the embodiment of the invention shown in FIG. 10, a reasonably low input impedance can be materialized by the resistance element 107 with a relatively low resistance value R1. The resistance element 107 with a relatively low resistance value R1 can be formed on a semiconductor chip with a small chip footprint. Thus, adopting the DC boost circuit according to the embodiment of the invention shown in FIG. 10, it becomes possible to reduce the chip area of an antenna switch MMIC.

<<Antenna Switch MMIC>>

Figure 15:
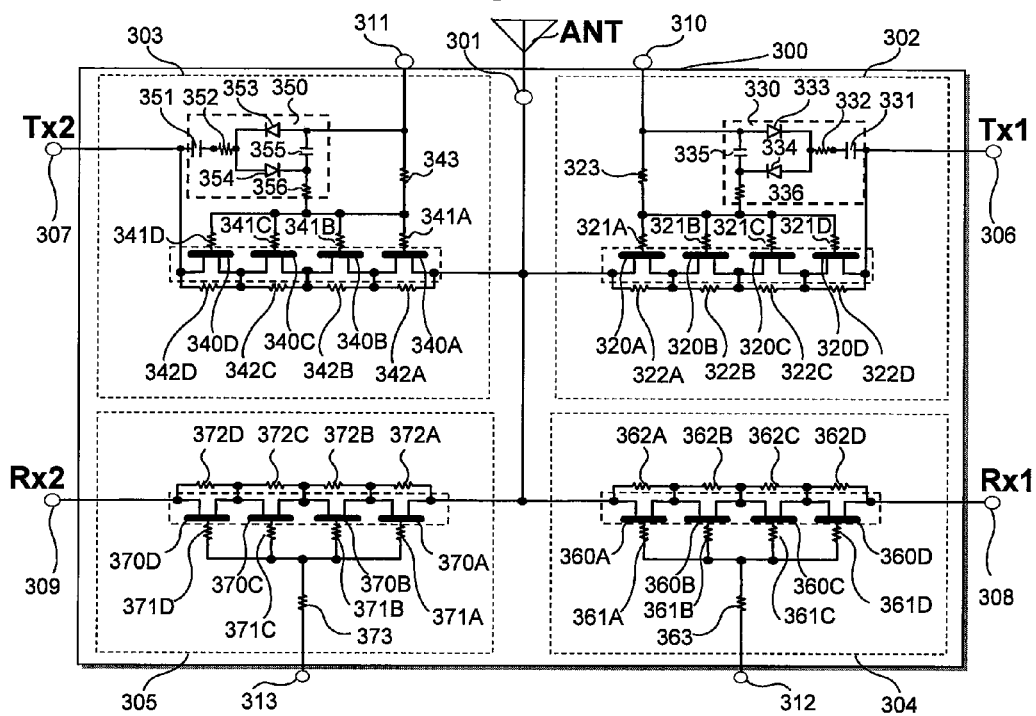
FIG. 15 is a circuit diagram showing an antenna switch microwave monolithic semiconductor IC according to another embodiment of the invention.

FIG. 15 is a circuit diagram showing an antenna switch microwave monolithic semiconductor IC (MMIC) 300 according to another embodiment of the invention.

The antenna switch MMIC (300) shown in FIG. 15 establishes a signal path between the common input/output terminal I/O (301), and one of transmit terminals Tx1 (306) and Tx2 (307), and receive terminals Rx1 (308) and Rx2 (309) to conduct the receive operation RX or transmit operation TX. The antenna switch MMIC (300) is arranged so that the required isolation can be achieved by setting the impedance of a signal path, except the one established for the receive operation RX or transmit operation TX, to an extremely high value. In the field of antenna switches, the common input/output terminal I/O (301) is referred to as "Single Pole", and a total of four signal paths between the Single Pole I/O (301), and the transmit terminals Tx1 (306) and Tx2 (307) and receive terminals Rx1 (308) and Rx2 (309) are referred to as "4 throw". Therefore, the antenna switch MMIC (300) of FIG. 15 is a switch of Single Pole 4 throw (SP4T) type.

The antenna switch MMIC (300) includes four high-frequency switches 302, 303, 304 and 305. The first transmit switch 302 connects between the common input/output terminal I/O (301) and first transmit terminal Tx1 (306) thereby to establish a path for a first transmit signal from the first transmit terminal Tx1 (306) to the common input/output terminal I/O (301). The second transmit switch 303 connects between the common input/output terminal I/O (301) and second transmit terminal Tx2 (307), thereby to establish a path for a second transmit signal from the second transmit terminal Tx2 (307) to the common input/output terminal I/O (301). The first receive switch 304 connects between the common input/output terminal I/O (301) and first receive terminal Rx1 (308), thereby to establish a path for a first receive signal from the common input/output terminal I/O (301) to the first receive terminal Rx1 (308). The second receive switch 305 connects between the common input/output terminal I/O (301) and second receive terminal Rx2 (309), thereby to establish a path for a second receive signal from the common input/output terminal I/O (301) to the second receive terminal Rx2 (309). As high-frequency switch FETs 320, 340, 360 and 370 included in the four high-frequency switches 302, 303, 304 and 305, HEMTs with a heterojunction structure having a low on-resistance are used.

To the common input/output terminal 301, a transmit/receive antenna ANT can be connected. To the first transmit terminal Tx1 (306), a first power amplifier can be connected through a first low-pass filter (not shown). To the second transmit terminal Tx2 (307), a second power amplifier, which is not shown, can be connected through a second low-pass filter (not shown). To the first receive terminal Rx1 (308), a first low-noise amplifier can be connected through a first surface-acoustic-wave filter (not shown). To the second receive terminal Rx2 (309), a second low-noise amplifier can be connected through a second surface-acoustic-wave filter (not shown).

The first transmit switch 302 includes first transmit FETs 320A-320D connected in series between the common input/output terminal I/O (301) and first transmit terminal Tx1 (306). Between the source and drain of each FET is connected a resistance element 322A-322D. The gates are connected with one ends of the resistance elements 321A-321D. The other ends of the resistance elements 321A-321D are connected with the first transmit DC control terminal 310 through a resistance element 323. The first transmit switch 302 includes a first transmit DC boost circuit 330 including a first capacitance element 331, a second capacitance element 335, a first resistance element 332, a second resistance element 336, a first diode 333 and a second diode 334. The resistance values of the first resistance element 332 and second resistance element 336 are set to be sufficiently larger, in resistance value, than a series resistance component of the first diode 333 and a series resistance component of the second diode 334. The first transmit DC boost circuit 330 of the first transmit switch 302 is supplied with a first transmit RF signal through the first transmit terminal Tx1 (306), and with a first transmit DC control voltage through the first transmit DC control terminal 310. Thus, the first transmit DC boost circuit 330 of the first transmit switch 302 of FIG. 15 executes a voltage-raising operation essentially the same as that by the DC boost circuit 100 shown in FIG. 10.

The second transmit switch 303 includes second transmit FETs 340A-340D connected in series between the common input/output terminal I/O (301) and second transmit terminal Tx2 (307). Between the source and drain of each FET, a resistance element 342A-342D is connected. The gates are connected with one ends of resistance elements 341A-341D, and the other ends of the resistance elements 341A-341D are connected with a second transmit DC control terminal 311 through a resistance element 343. The first transmit switch 303 includes a second transmit DC boost circuit 350 including a first capacitance element 351, a second capacitance element 355, a first resistance element 352, a second resistance element 356, a first diode 353 and a second diode 354. The resistance values of the first resistance element 352 and second resistance element 356 are set to be sufficiently larger, in resistance value, than a series resistance component of the first diode 353 and a series resistance component of the second diode 354. The second transmit DC boost circuit 350 of the second transmit switch 303 is supplied with a second transmit RF signal through the second transmit terminal Tx2 (307), and with a second transmit DC control voltage through the second transmit DC control terminal 311. Thus, the second transmit DC boost circuit 350 of the second transmit switch 303 of FIG. 15 executes a voltage-raising operation essentially the same as that by the DC boost circuit 100 shown in FIG. 10.

The first receive switch 304 includes first receive FETs 360A-360D connected in series between the common input/output terminal I/O (301) and first receive terminal Rx1 (308). Between the source and drain of each FET, a resistance element 362A-362D is connected. The gates are connected with one ends of resistance elements 361A-361D, and the other ends of the resistance elements 361A-361D are connected with a first receive DC control terminal 312 through a resistance element 363.

The second receive switch 305 includes second receive FETs 370A-370D connected in series between the common input/output terminal I/O (301) and second receive terminal Rx2 (309). Between the source and drain of each FET, a resistance element 372A-372D is connected. The gates are connected with one ends of resistance elements 371A-371D, and the other ends of the resistance elements 371A-371D are connected with a second receive DC control terminal 313 through a resistance element 373. The power level of a first RF receive signal supplied to the common input/output terminal I/O (301) from the transmit/receive antenna ANT in its reception mode is extremely small in comparison to the power level of an RF transmit signal supplied to the transmit/receive antenna ANT from the RF power amplifier in its transmission mode. Therefore, even in case that receive DC boost circuits like the first transmit DC boost circuit 330 of the first transmit switch 302, and the second transmit DC boost circuit 350 of the second transmit switch 303 are arranged in the first receive switch 304 and second receive switch 305, the voltage-boosting function of such receive DC boost circuits would be extremely low. On this account, no DC boost circuit for reception is arranged in the first receive switch 304 and second receive switch 305.

The first transmit FETs 320A-320D of the first transmit switch 302 of the antenna switch MMIC (300) of FIG. 15 are driven by a DC output voltage of High level from the first transmit DC boost circuit 330 and brought into conduction. A first transmit RF signal supplied to the first transmit terminal Tx1 (306) is passed through the conducting first transmit FETs 320A-320D to the common input/output terminal I/O (301) connected with the antenna ANT. The DC output voltage of High level from the first transmit DC boost circuit 330 lowers the on-resistance Ron of the first transmit FETs 320A-320D of the first transmit switch 302, whereby an RF signal loss passed to the common input/output terminal I/O (301) connected with the antenna ANT can be reduced. At the time when the first transmit FETs 320A-320D of the first transmit switch 302 are controlled to ON state by a DC output voltage of High level from the first transmit DC boost circuit 330, the voltage of the common input/output terminal I/O (301) is also made High level by the DC output voltage of High level. At this time, the second transmit DC control voltage at the second transmit DC control terminal 311 of the second transmit switch 303, the first receive DC control voltage at the first receive DC control terminal 312 of the first receive switch 304, and the second receive DC control voltage at the second receive DC control terminal 313 of the second receive switch 305 are made DC control voltages of Low level. Therefore, the second transmit FETs 340A-340D of the second transmit switch 303, the first receive FETs 360A-360D of the first receive switch 304, and the second receive FETs 370A-370D of the second receive switch 305 are brought out of conduction. In addition, the voltage between the gate and source of each EFT of the second transmit FETS 340A-340D, first receive FETs 360A-360D and second receive FETs 370A-370D in the non-conducting states is made deep backward bias voltages by the DC output voltage of High level. The changes of the values of gate capacitances of these FETs can be made smaller, and the harmonic distortion in the antenna switch can be reduced.

In case that the second transmit FETS 340A-340D of the second transmit switch 303 of the antenna switch MMIC (300) of FIG. 15 are driven by the DC output voltage of High level from the second transmit DC boost circuit 350 into conduction, the first transmit FETs 320A-320D of the first transmit switch 302, the first receive FETs 360A-360D of the first receive switch 304, and the second receive FETs 370A-370D of the second receive switch 305 are brought out of conduction. In addition, the voltage between the gate and source of each FET of the first transmit FETs 320A-320D, first receive FETs 360A-360D and second receive FETs 370A-370D, which are brought out of condition, is made deep backward bias voltages. The changes of the values of gate capacitances of these FETs can be made smaller, and the harmonic distortion in the antenna switch can be reduced.

While the antenna switch MMIC (300) of SP4T type is arranged as described above, it is possible to use mesa resistors of compound semiconductor or metallic thin-film resistors for the inside resistance elements of FIG. 15, and MIM (Metal Insulator Metal) capacitances for the inside capacitance elements of FIG. 15. However, the inside resistance elements and capacitance elements of FIG. 15 are not so limited. It is needless to say that they can be changed for resistance elements and capacitance elements fabricated by another manufacturing method.

<<Device Structure of the DC Boost Circuit>>

Figure 16:
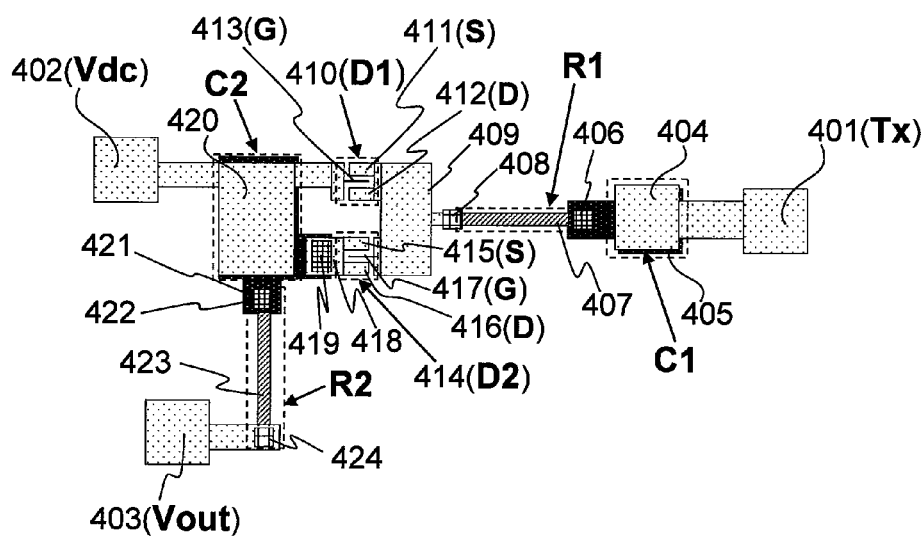
FIG. 16 is a plane view showing a device structure of the first transmit DC boost circuit of the first transmit switch, and the second transmit DC boost circuit of the second transmit switch of the antenna switch MMIC according to the embodiment of the invention shown in FIG. 15.

FIG. 16 is a plane view showing a device structure of the first transmit DC boost circuit 330 of the first transmit switch 302 and the second transmit DC boost circuit 350 of the second transmit switch 303 of the antenna switch MMIC (300) according to the embodiment of the invention shown in FIG. 15.

As shown in the drawing, the high-frequency input terminal 401 (Tx) of the DC boost circuit is connected with one end of the first capacitance element C1. The first capacitance element C1 is composed of a MIM capacitance constituted by a metal layer 404 of an underlying first layer line, a metal layer 405 of an overlying second layer line and an interlayer dielectric film. The metal layer 404 is connected through a connecting point 406 to one end of a resistance 407 forming the first resistance element R1. The other end of the resistance 407 is connected with a metal layer 409 through a connecting point 408. The metal layer 409 is connected with the cathode of the first diode D1 and the anode of the second diode D2. The first diode D1 is formed with FET (410) having a source electrode 411(S), a drain electrode 412(D) and a gate electrode 413(G). The metal layer 409 short-circuits between the source electrode 411(S) and drain electrode 412(D) of FET (410). The gate electrode 410(G) and source electrode 411(S) of FET (410) form the anode and cathode of a Schottky diode (D1). The source electrode 411(S) serving as the cathode, and the drain electrode 412(D) are connected with the metal layer 409. The gate electrode 413(G) serving as the anode is connected with a metal layer 420. The metal layer 420 is connected with a DC control input terminal 402 which accepts supply of a DC control voltage Vdc. Likewise, the second diode D2 is composed of FET (414) having a source electrode 415(S), a drain electrode 416(D) and a gate electrode 417(G). A metal layer 418 short-circuits between the source electrode 415(S) and drain electrode 416(D) of FET (414). The gate electrode 417(G) and source electrode 415(S) of FET (414) form the anode and cathode of a Schottky diode (D2). The gate electrode 417(G) of FET (414) is connected with the metal layer 409, and the metal layer 418 short-circuits between the source electrode 415(S) and drain electrode 416 (D). The gate electrode 417(G) and source electrode 415(S) of FET (414) form the anode and cathode of a Schottky diode (D2). The gate electrode 417(G) serving as the anode is connected with the metal layer 409. The source electrode 415(S) serving as the cathode and the drain electrode 416(D) are connected with the metal layer 418. The metal layer 418 is connected with one end of the second capacitance element C2 through a connecting point 419. The second capacitance element C2 is composed of a MIM capacitance constituted by a metal layer 421 of an underlying first layer line, a metal layer 420 of an overlying second layer line and an interlayer dielectric film. The metal layer 421 of the underlying first layer line is connected through a connecting point 422 to one end of a resistance 423 forming the second resistance element R2. The other end of the resistance 423 is connected through a connecting point 424 to a DC output terminal 403 from which a DC output voltage Vout arises. FETs 410 and 414 forming the Schottky diodes D1 and D2 are the same in structure as HEMTs of the high-frequency switch FETs 320, 340, 360 and 370 for forming the four high-frequency switches 302, 303, 304 and 305 of FIG. 15, and they can be fabricated by the same manufacture process.

<<RF Module>>

Figure 17:
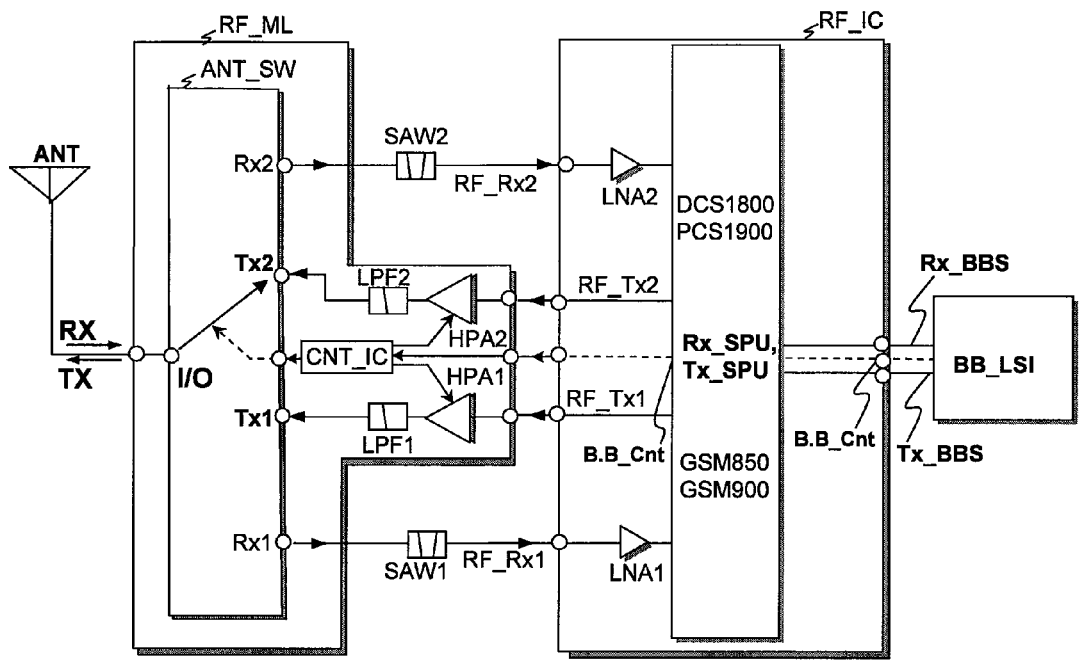
FIG. 17 is a block diagram showing a configuration of a mobile phone equipped with a high-frequency module incorporating an antenna switch MMIC, a high-frequency analog signal processing semiconductor IC and a baseband signal processing LSI according to an embodiment of the invention.

FIG. 17 is a block diagram showing a configuration of a mobile phone equipped with an RF module incorporating an antenna switch MMIC, an RF analog signal processing semiconductor IC and a baseband signal processing LSI according to an embodiment of the invention.

The RF module RF_ML shown in the drawing includes: the antenna switch microwave monolithic semiconductor IC (ANT_SW) shown in FIG. 15; RF power amplifiers HPA1 and HPA2; low-pass filters LPF1 and LPF2; and a controller integrated circuit (CNT_IC). The mobile phone antenna ANT for transmission and reception is connected with the common input/output terminal I/O of the antenna switch MMIC (ANT_SW) of the RF module RF_ML. A control signal B.B_Cnt from the baseband signal processing LSI (BB_LSI) is passed through an RF analog signal processing semiconductor IC (RF_IC) (hereinafter referred to as "RF IC"), and supplied to a controller integrated circuit (CNT_IC) of the RF module (RF_ML). A flow of an RF signal from the antenna ANT for transmission and reception to the common input/output terminal I/O leads to a receive operation RX of the mobile phone, and a flow of an RF signal from the common input/output terminal I/O to the antenna ANT for transmission and reception is involved in a transmit operation TX of the mobile phone.

RF IC (RF_IC) converts up a transmit baseband signal Tx_BBS from the baseband signal processing LSI (BB_LSI) to an RF transmit signal in frequency, and reversely converts down an RF receive signal, which has been received through the antenna ANT for transmission and reception, to a receive baseband signal Rx_BBS in frequency, and then supplies the resultant signal to the baseband signal processing LSI (BB_LSI).

The antenna switch MMIC (ANT_SW) of the RF module RF_ML establishes a signal path between the common input/output terminal I/O and one of the transmit terminals Tx1 and Tx2 and receive terminals Rx1 and Rx2 to conduct the receive operation RX or transmit operation TX. The antenna switch MMIC (ANT_SW) is arranged so that the required isolation can be achieved by setting the impedance of a signal path, except the one established for the receive operation RX or transmit operation TX, to an extremely high value.

The baseband signal processing LSI (BB_LSI) is connected to an external nonvolatile memory and application processor, which are not shown. The application processor is connected with a liquid crystal display device and a key input device, which are not shown, and it can execute various application software programs including a general-purpose program and an electronic game. A boot program (start initializing program) and an operating system program (OS) for a mobile device such as a mobile phone, a program for phase demodulation for a receive baseband signal of e.g. GSM system, and phase modulation for a transmit baseband signal by a digital signal processor (DSP) inside the baseband signal processing LSI, and various application software programs can be stored in the external nonvolatile memory.

Now, assumed is a case that a transmit baseband signal Tx_BBS from the baseband signal processing LSI (BB_LSI) is to be up-converted to a GSM850 or GSM900 transmit frequency band in frequency. Incidentally, the frequency of GSM850 RF transmit signals ranges from 824 to 849 MHz, and the frequency of GSM900 RF transmit signals ranges from 880 to 915 MHz. In this case, the transmit signal processing unit Tx_SPU of RF IC converts up the transmit baseband signal Tx_BBS to the transmit frequency band in frequency, whereby an RF transmit signal RF_Tx1 is produced. The RF transmit signal RF_Tx1 of the transmit frequency band is amplified in power by the RF high-output power amplifier HPA1 of the RF module RF_ML, passed through the low-pass filter LPF1, and supplied to the transmit terminal Tx1 of the antenna switch MMIC (ANT_SW). The GSM850 or GSM900 RF transmit signal RF_Tx1, which is supplied to the transmit terminal Tx1, can be sent out from the antenna ANT for transmission and reception through the common input/output terminal I/O.

A high-frequency receive signal RF_Rx1 of GSM850 or GSM900 received through the antenna ANT for transmission and reception is supplied to the common input/output terminal I/O of the antenna switch MMIC (ANT_SW). Incidentally, the frequency of GSM850 RF receive signals ranges from 869 to 894 MHz, and the frequency of GSM900 RF receive signals ranges from 925 to 960 MHz. A high-frequency receive signal RF_Rx1 of this receive frequency band taken from the receive terminal Rx1 of the antenna switch MMIC (ANT_SW) is passed through the surface-acoustic-wave filter SAW1, amplified by the low-noise amplifier LNA1 of RF IC (RF_IC), and then supplied to the receive signal processing unit Rx_SPU. The receive signal processing unit Rx_SPU converts down the GSM high-frequency receive signal GSM_Rx to a receive baseband signal Rx_BBS in frequency.

In a transmit/receive mode of GSM850 or GSM900, the antenna switch MMIC (ANT_SW) responds to a control signal B.B_Cnt, and performs the transmission of a high-frequency transmit signal RF_Tx1 with a connection between the common input/output terminal I/O and transmit terminal Tx1, and the reception of a high-frequency receive signal RF_Rx1 with a connection between the common input/output terminal I/O and receive terminal Rx1 by means of time division.

Now, assumed is a case that a transmit baseband signal Tx_BBS from the baseband signal processing LSI (BB_LSI) is to be up-converted to a DCS1800 or PCS1900 transmit frequency band in frequency. Incidentally, the frequency of DCS1800 RF transmit signals ranges from 1710 to 1780 MHz, and the frequency of PCS1900 RF transmit signals ranges from 1850 to 1910 MHz. In this case, the transmit signal processing unit Tx_SPU of RF IC converts up the transmit baseband signal Tx_BBS to the transmit frequency band in frequency, whereby an RF transmit signal RF_Tx2 of the transmit frequency band is produced. The RF transmit signal RF_Tx2 of the transmit frequency band is amplified in power by the RF high-output power amplifier HPA2 of the RF module RF_ML, passed through the low-pass filter LPF2, and supplied to the transmit terminal Tx2 of the antenna switch MMIC (ANT_SW). The DCS1800 or PCS1900 RF transmit signal RF_Tx2, which is supplied to the transmit terminal Tx2, can be sent out from the antenna ANT for transmission and reception through the common input/output terminal I/O.

A high-frequency receive signal RF_Rx2 of DCS1800 or PCS1900 received through the antenna ANT for transmission and reception is supplied to the common input/output terminal I/O of the antenna switch MMIC (ANT_SW). Incidentally, the frequency of DCS1800 RF receive signals ranges from 1805 to 180 MHz, and the frequency of PCS1900 RF receive signals ranges from 1930 to 1990 MHz. A high-frequency receive signal RF_Rx2 of DCS1800 or PCS1900 taken from the receive terminal Rx2 of the antenna switch MMIC (ANT_SW) is passed through the surface-acoustic-wave filter SAW2, amplified by the low-noise amplifier LNA2 of RF IC (RF_IC), and then supplied to the receive signal processing unit Rx_SPU. The receive signal processing unit Rx_SPU converts down the high-frequency receive signal RF_Rx2 of DCS1800 or PCS1900 to a receive baseband signal Rx_BBS in frequency.

In a transmit/receive mode of DCS1800 or PCS1900, the antenna switch MMIC (ANT_SW) responds to a control signal B.B_Cnt, and performs the transmission of a high-frequency transmit signal RF_Tx2 with a connection between the common input/output terminal I/O and transmit terminal Tx2, and the reception of a high-frequency receive signal RF_Rx2 with a connection between the common input/output terminal I/O and receive terminal Rx2 by means of time division.

While the invention which the inventor made has been described above based on the embodiments specifically, it is not so limited. It is needless to say that various changes and modifications may be made without departing from the scope of the invention.

For example, as to the high-frequency switches of the antenna switch MMIC (300) of FIG. 15, HEMT transistors of the high-frequency switches 320, 340, 360 and 370 can be replaced with N-channel insulated gate MOS transistors of a depletion type. Incidentally, in this case, a bias voltage of about 4 volts generated by the controller integrated circuit CNT_IC of FIG. 17 is supplied to the common input/output terminal I/O. In case that a single source voltage of 3 volts is supplied to the controller integrated circuit CNT_IC of FIG. 17 from the outside, the controller integrated circuit CNT_IC has therein a booster circuit, such as a charge-pump circuit, for boosting the single source voltage of 3 volts to the bias voltage of about 4 volts.

Further, the antenna switch MMIC (300) of FIG. 15 may switch between the transmission of a WCDMA RF transmit signal of 1920-1980 MHz and the reception of a WCDMA RF receive signal of 2110-2170 MHz.

In the above embodiments, the baseband signal processing LSI and application processor are formed in separate semiconductor chips respectively. However, according to another embodiment, the application processor can be integrated into the semiconductor chip of the baseband signal processing LSI, making an integrated one-chip.

[Industrial Applicability]

The invention can reduce the intermodulation distortion critical for WCDMA system, or the harmonic distortion critical for GSM system in an antenna switch mounted on an RF communication terminal device.

Also, the invention can provide a semiconductor IC having a built-in DC boost circuit whose life and operation reliability are improved.

What is claimed is:

1. A semiconductor IC comprising:
   a DC boost circuit,
   wherein the DC boost circuit includes a high-frequency input terminal, a DC control input terminal and a DC output terminal,
   wherein a high-frequency input signal is supplied to the high-frequency input terminal of the DC boost circuit, and a DC control voltage is supplied to the DC control input terminal, whereby a DC output voltage arises from the DC output terminal,
   wherein the DC boost circuit includes a first capacitance element, a second capacitance element, a first diode, a second diode, a first resistance element and a second resistance element,
   wherein the high-frequency input terminal is connected with one terminal of a series of the first capacitance and resistance elements connected in series,
   wherein the other terminal of the series of the first capacitance and resistance elements is connected with a cathode of the first diode and an anode of the second diode,
   wherein an anode of the first diode and one terminal of the second capacitance element are connected with the DC control input terminal,
   wherein a cathode of the second diode and the other terminal of the second capacitance element are connected with one terminal of the second resistance element,
   wherein the other terminal of the second resistance element is connected with the DC output terminal, and
   wherein the first resistance element is set larger in resistance value than a first series resistance of the first diode and a second series resistance of the second diode in a closed loop including the first and second diodes and second capacitance element.

2. The semiconductor IC according to claim 1, further comprising:
   a high-frequency switch connected between a signal input terminal and a signal output terminal,
   wherein a high-frequency input signal is supplied to the signal input terminal of the high-frequency switch, and the DC output voltage arising from the DC output terminal of the DC boost circuit is supplied to a control input terminal of the high-frequency switch.

3. The semiconductor IC according to claim 2, wherein the high-frequency switch includes a field effect transistor, and
   wherein the DC output voltage of a High level is supplied to a gate of the field effect transistor serving as the control input terminal of the high-frequency switch, whereby the field effect transistor is brought into conduction, and the high-frequency input signal supplied to the signal input terminal of the high-frequency switch is passed to the signal output terminal.

4. The semiconductor IC according to claim 3,
   wherein the field effect transistor serving as the high-frequency switch consists of a plurality of field effect transistors with drain-source paths thereof connected in series between the signal input terminal and signal output terminal of the high-frequency switch.

5. The semiconductor IC according to claim 4,
   wherein the field effect transistor serving as the high-frequency switch is composed of a heterojunction HEMT formed in a compound semiconductor chip.

* * * * *